(12) United States Patent
Kanna

(10) Patent No.: US 8,877,421 B2
(45) Date of Patent: Nov. 4, 2014

(54) POSITIVE RESIST COMPOSITION AND PATTERN-FORMING METHOD

(75) Inventor: Shinichi Kanna, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1121 days.

(21) Appl. No.: 12/058,055

(22) Filed: Mar. 28, 2008

(65) Prior Publication Data

US 2008/0248420 A1 Oct. 9, 2008

(30) Foreign Application Priority Data

Mar. 28, 2007 (JP) ................................. 2007-085989
Mar. 19, 2008 (JP) ................................. 2008-071482

(51) Int. Cl.
*G03F 7/039* (2006.01)
*G03F 7/075* (2006.01)
*G03F 7/20* (2006.01)
*G03F 7/30* (2006.01)

(52) U.S. Cl.
USPC ........ 430/270.1; 430/311; 430/326; 430/905; 430/907; 430/910

(58) Field of Classification Search
None
See application file for complete search history.

(56) References Cited

U.S. PATENT DOCUMENTS

| 8,062,826 | B2 * | 11/2011 | Kanna ........................ | 430/270.1 |
| 2006/0141382 | A1 * | 6/2006 | Takeshita et al. .......... | 430/270.1 |
| 2007/0059639 | A1 * | 3/2007 | Kanda et al. ............... | 430/270.1 |
| 2007/0134588 | A1 * | 6/2007 | Kanda et al. ............... | 430/270.1 |
| 2007/0134589 | A1 | 6/2007 | Yamamoto et al. | |
| 2007/0134590 | A1 * | 6/2007 | Fukuhara et al. .......... | 430/270.1 |
| 2007/0148589 | A1 * | 6/2007 | Kanda et al. ............... | 430/270.1 |
| 2008/0081290 | A1 * | 4/2008 | Wada et al. ................. | 430/286.1 |
| 2008/0166655 | A1 * | 7/2008 | Ogata et al. ................ | 430/270.1 |

FOREIGN PATENT DOCUMENTS

| EP | 1 795 960 A1 * | 6/2007 |
| EP | 1 795 961 A1 * | 6/2007 |
| JP | 57-153433 A | 9/1982 |
| JP | 7-220990 A | 8/1995 |
| WO | 2004/068242 A1 | 8/2004 |
| WO | 2004/077158 A1 | 9/2004 |
| WO | WO 2005/080473 A1 * | 9/2005 |

OTHER PUBLICATIONS

B.J. Lin, "Semiconductor Foundry, Lithography, and Partners", Emerging Lithographic Technologies VI, Proceedings of SPIE vol. 4688, 2002, pp. 11-24.

J.A. Hoffnagle et al., "Liquid Immersion Deep-Ultraviolet Interferometric Lithography", J. Vac. Sci. Technol. B, vol. 17, No. 6, Nov./Dec. 1999, pp. 3306-3309.

Hiroshi Ito et al., "Dissolution/Swelling Behavior of Cycloolefin Polymers in Aqueous Base", Advances in Resist Technology and Processing XVII, Proceedings of SPIE, vol. 3999 (2000), pp. 2-12.

Mitsuhiro Hata et al., "Novel Top-coat Materials Containing a Bulky Silicon Group for ArF Immersion Lithography ", Journal of Photopolymer Science and Technology, vol. 19, No. 5 (2006), pp. 579-583.

* cited by examiner

*Primary Examiner* — Sin J. Lee

(74) *Attorney, Agent, or Firm* — Sughrue Mion, PLLC

(57) ABSTRACT

A positive resist composition includes: (A) a resin capable of increasing the solubility in an alkali developing solution by the action of an acid, including: (a1) a repeating unit selected from repeating units represented by following formulae (a1-1) to (a1-3); (a2) a repeating unit represented by a following formula (a2); and (a3) a repeating unit selected from repeating units represented by following formulae (a3-1) to (a3-4); (B) a compound capable of generating an acid upon irradiation with actinic ray or radiation; (C) a resin having at least one of a fluorine atom and a silicon atom, and being insoluble in an alkali developing solution; and (D) a solvent, wherein the formulae above are defined in the specification.

49 Claims, 1 Drawing Sheet

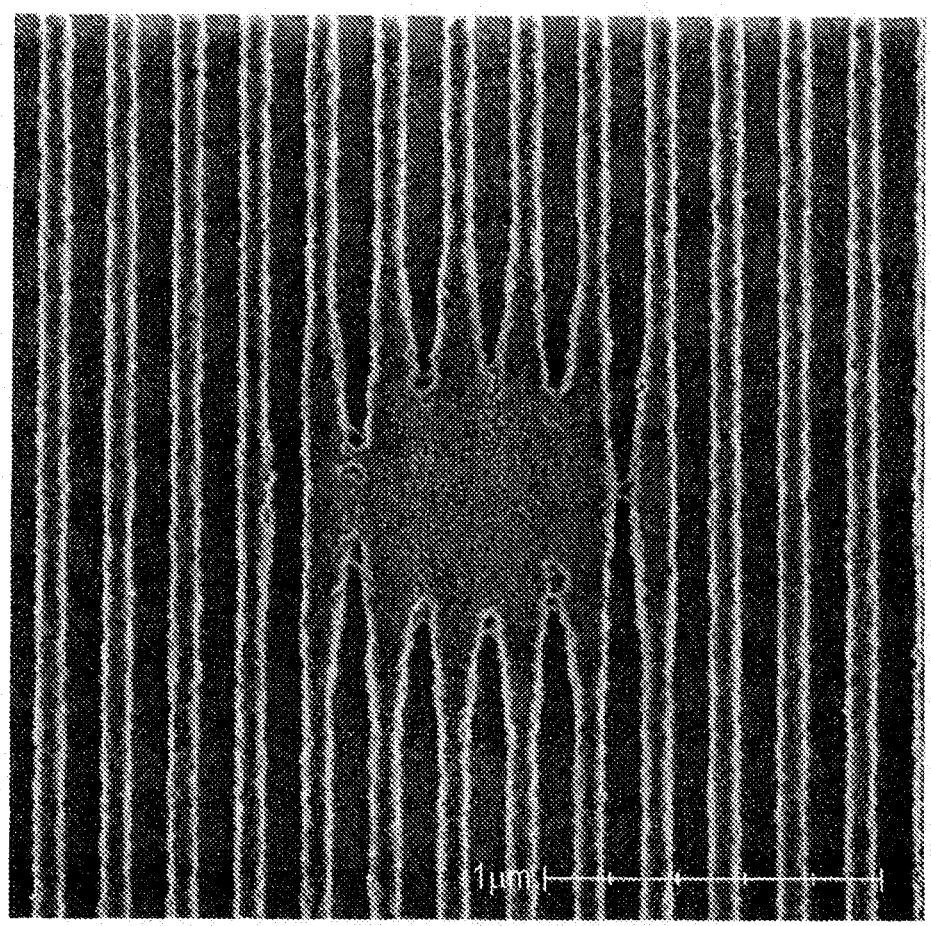

POSITIVE RESIST COMPOSITION AND PATTERN-FORMING METHOD

BACKGROUND OF THE INVENTION

1. Field of the Invention

The present invention relates to a positive resist composition for use in the manufacturing processes of semiconductors such as IC and the like, liquid crystals, the manufacture of circuit substrates for thermal heads and the like, and lithographic processes of other photo-fabrications, and also relates to a pattern-forming method using the same. In particular, the invention relates to a positive resist composition suitable for exposure with an immersion projection exposure apparatus using far ultraviolet rays of wavelengths of 300 nm or less as a light source, and a pattern-forming method using the same.

2. Description of the Related Art

With the progress of fining of semiconductor devices, shortening of the wavelengths of exposure light source and increasing of the numerical aperture of the projection lens (high NA) have advanced and now exposure apparatus of NA 0.84 using an ArF excimer laser having wavelength of 193 nm as a light source have been developed. As generally known, this can be expressed by the following expressions:

(Resolution)=$k_1 \cdot (\lambda/NA)$ (Depth of focus)=$\pm k_2 \cdot \lambda/NA^2$ wherein $\lambda$ is the wavelength of exposure light source, NA is the numerical aperture of the projection lens, $k_1$ and $k_2$ are the coefficients concerning the process.

For further higher resolution by the shortening of wavelengths, an exposure apparatus with an $F_2$ excimer laser having wavelength of 157 nm as the light source has been studied, however, the materials of lens for use in the exposure apparatus and the materials of resist are extremely restricted for shortening of wavelengths, so that the realization of the reasonable manufacturing costs of the apparatus and materials and quality stabilization are very difficult, as a result, there are possibilities of missing an exposure apparatus and a resist having sufficient performances and stabilities within a required period of time.

As a technique for increasing resolution in the optical microscope, what is called an immersion method of filling between a projection lens and a sample with a liquid of high refractive index (hereinafter also referred to as "an immersion liquid") has been conventionally known.

As "the effect of immersion", the above resolution and depth of focus in the case of immersion can be expressed by the following expressions, taking $\lambda_0$ as the wavelength of the exposure light in the air, n as the refractive index of immersion liquid to the air, and $NA_0 = \sin\theta$ with $\theta$ as convergence half angle of the ray of light:

(Resolution)=$k_1 \cdot (\lambda_0/n)/NA)_0$ (Depth of focus)=$\pm k_2 \cdot (\lambda_0/n)/NA_0^2$ That is, the effect of immersion is equivalent to the case of using exposure wavelength of the wavelength of 1/n. In other words, in the case of the projection optical system of the same NA, the depth of focus can be made n magnifications by immersion. This is effective for every pattern form, and can be combined with super resolution techniques such as a phase shift method and a deformation lighting method.

The apparatus applying this effect to the transfer of microfine image pattern of semiconductor device are introduced by JP-A-57-153433, the term "JP-A" as used herein refers to an "unexamined published Japanese patent application" and JP-A-7-220990.

The latest technical advancement of immersion exposure is reported in *SPIE Proc.*, 4688, 11 (2002), *J. Vac. Sci. Tecnol. B*, 17 (1999), *SPIE Proc.*, 3999, 2 (2000), and WO 2004/077158.

When an ArF excimer laser is used as the light source, it is thought that pure water (refractive index at 193 nm: 1.44) is most promising in the light of the safety in handling, and the transmittance and the refractive index at 193 nm. When an $F_2$ excimer laser is used as the light source, a solution containing fluorine is examined from the balance of the transmittance and the refractive index at 157 nm, but from the viewpoint of environmental safety and in the point of refractive index, a sufficiently satisfactory solution has not been found yet. From the extent of the effect of immersion and the degree of completion of resist, it is thought that immersion exposure technique will be carried on the ArF exposure apparatus earliest.

From the advent of the resist for a KrF excimer laser (248 nm) on, an image-forming method that is called chemical amplification is used as the image-forming method of the resist for compensating for the reduction of sensitivity by light absorption. To explain the image-forming method of positive chemical amplification by example, this is an image-forming method of exposing a resist to decompose an acid generator in the exposed part to thereby generate an acid, utilizing the generated acid as the reactive catalyst to change an alkali-insoluble group to an alkali-soluble group by the bake after exposure (PEB: Post Exposure Bake), and removing the exposed part by alkali development.

The resist for an ArF excimer laser (wavelength: 193 nm) using the chemical amplification mechanism is now being a main current, but there is a drawback that a formed pattern falls down and results in the defect in manufacturing a device, and improvement is required.

When a chemical amplification resist is applied to immersion exposure, it is appointed that since the resist layer inevitably touches an immersion liquid at the time of exposure, the resist layer decomposes and ingredients that adversely influence the immersion liquid ooze from the resist layer. WO 2004/068242 discloses that the resist performance changes by the immersion of a resist for ArF exposure in water before and after exposure and appoints this is a problem in immersion exposure.

Further, when immersion exposure is carried out, there are cases where circular defects called water marks occur on account of the droplets remaining on a resist film after exposure, and improvement is required.

SUMMARY OF THE INVENTION

In consideration of the problems of prior art, the invention provides a positive resist composition capable of restraining the occurrence of water marks and reducing the decrease of film thickness at the time of immersion exposure, and also provides a pattern-forming method using the same.

<1> A positive resist composition comprising:

(A) a resin capable of increasing the solubility in an alkali developing solution by the action of an acid, comprising:

(a1) a repeating unit selected from repeating units represented by following formulae (a1-1) to (a1-3);

(a2) a repeating unit represented by a following formula (a2); and (a3) a repeating unit selected from repeating units represented by following formulae (a3-1) to (a3-4);

(B) a compound capable of generating an acid upon irradiation with actinic ray or radiation;

(C) a resin having at least one of a fluorine atom and a silicon atom, and being insoluble in an alkali developing solution; and D) a solvent:

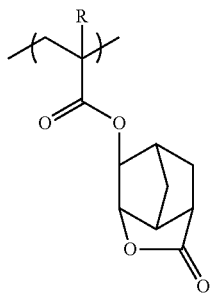
(a1-1)

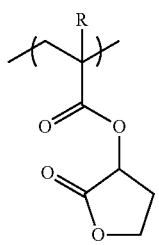
(a1-2)

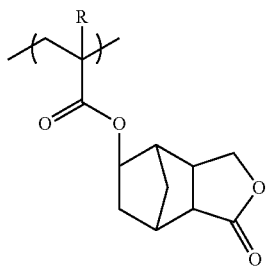
(a1-3)

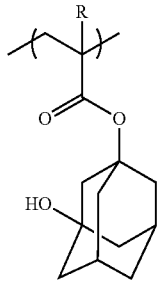
(a2)

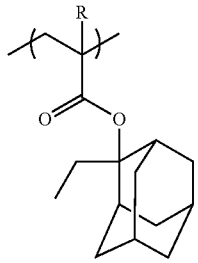
(a3-1)

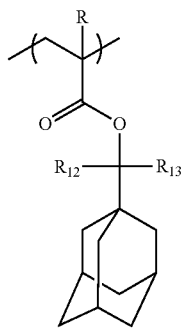
(a3-2)

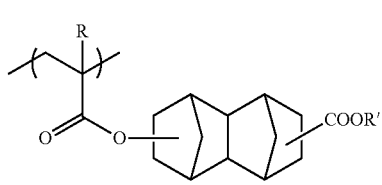
(a3-3)

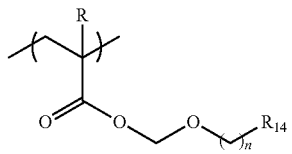
(a3-4)

wherein

R represents a hydrogen atom, a halogen atom, or an alkyl group;

R' represents a group capable of leaving by the action of an acid;

each of $R_{12}$ and $R_{13}$ independently represents a hydrogen atom, a methyl group, an ethyl group, or a propyl group;

$R_{14}$ represents an alicyclic group; and n represents an integer of from 0 to 5.

<2> The positive resist composition as described in <1>, wherein the resin (C) comprises at least one repeating unit selected from repeating units having a fluorine atom and being represented by following formulae (c1-1) to (c1-3), and is stable to an acid and insoluble in an alkali developing solution:

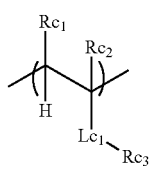
(c1-1)

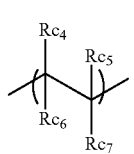
(c1-2)

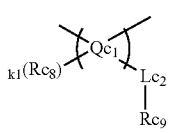
(c1-3)

wherein $Rc_1$ represents a hydrogen atom or an alkyl group;

$Rc_2$ represents a fluoroalkyl group;

$Rc_3$ represents a hydrogen atom or a monovalent organic group;

each of $Rc_4$, $Rc_5$, $Rc_6$ and $Rc_7$ represents a hydrogen atom, a fluorine atom, an alkyl group, a fluoroalkyl group, an alkoxyl group, or a fluoroalkoxy group, provided that at least one of $Rc_4$ to $Rc_7$ represents a fluorine atom, and $Rc_4$ and $Rc_5$ or $Rc_6$ and $Rc_7$ may be bonded to each other to form a ring;

$Rc_8$ represents a hydrogen atom, a fluorine atom, or a monovalent organic group;

$Rc_9$ represents a fluorine atom or a monovalent organic group comprising a fluorine atom;

each of $Lc_1$ and $Lc_2$ independently represents a single bond or a divalent linking group;

$Qc_1$ represents an alicyclic structure; and $k_1$ represents an integer of from 0 to 3.

<3> The positive resist composition as described in <1>, wherein the resin (C) comprises at least one repeating unit selected from repeating units having a silicon atom and being represented by following formulae (c2-1) and (c2-2), and is stable to an acid and insoluble in an alkali developing solution:

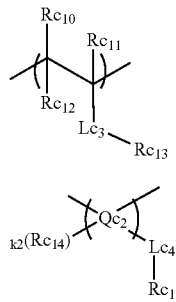

(c2-1)

(c2-2)

wherein each of $Rc_{10}$, $Rc_{11}$ and $Rc_{12}$ independently represents a hydrogen atom, a halogen atom, an alkyl group, a cycloalkyl group, an alkoxyl group, or an alkoxycarbonyl group;

each of $Rc_{13}$ and $Rc_{15}$ independently represents a monovalent organic group comprising at least one silicon atom;

$Rc_{14}$ represents a hydrogen atom, a halogen atom, a cyano group, or a monovalent organic group;

each of $Lc_3$ and $Lc_4$ independently represents a single bond or a divalent linking group;

$Qc_2$ represents an alicyclic structure; and $k_2$ represents an integer of from 0 to 3.

<4> The positive resist composition as described in <1>, wherein the resin (C) is at least either (CA) a resin that comprises:

at least either a fluorine atom or a silicon atom; and an alicyclic structure, or (CB) a resin that comprises:

a repeating unit comprising at least either a fluorine atom or a silicon on a side chain thereof, and a repeating unit comprising an unsubstituted alkyl group on a side chain thereof.

<5> The positive resist composition as described in <3>, wherein the repeating unit represented by the formula (c2-1) is a repeating unit represented by a formula (cIII):

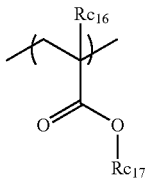

(cIII)

wherein $Rc_{16}$ represents a hydrogen atom, a halogen atom, an alkyl group, a cycloalkyl group, an alkoxyl group, or an alkoxycarbonyl group; and $Rc_{17}$ represents a monovalent organic group comprising at least one silicon atom.

<6> The positive resist composition as described in <3>, wherein the repeating unit represented by the formula (c2-1) is a repeating unit represented by a formula (IV):

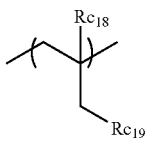

(IV)

wherein $Rc_{18}$ represents a hydrogen atom, a halogen atom, an alkyl group, a cycloalkyl group, an alkoxyl group, or an alkoxycarbonyl group; and $Rc_{19}$ represents a monovalent organic group comprising at least one silicon atom.

<7> The positive resist composition as described in <3>, wherein the repeating unit represented by the formula (c2-1) is a repeating unit represented by a formula (V):

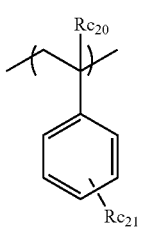

(V)

wherein $Rc_{20}$ represents a hydrogen atom, a halogen atom, an alkyl group, a cycloalkyl group, an alkoxyl group, or an alkoxycarbonyl group; and $Rc_{21}$ represents a monovalent organic group comprising at least one silicon atom.

<8> The positive resist composition as described in <3, wherein at least one of the monovalent organic groups comprising at least one silicon atom represented by $Rc_{13}$ and $Rc_{15}$ comprises a cyclic siloxane structure.

<9> The positive resist composition as described in <3, wherein at least one of the monovalent organic groups comprising at least one silicon atom represented $Rc_{13}$ and $Rc_{15}$ is a group represented by a following formula (VI):

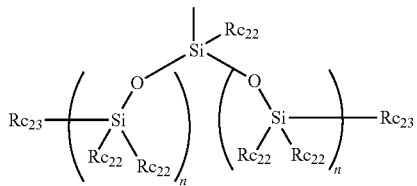

(VI)

wherein each of $Rc_{22}$'s independently represents a hydrogen atom, an alkyl group, or an alkoxyl group;

each of $Rc_{23}$'s represents a hydrogen atom, an alkyl group, or an alkoxyl group, provided that the two $Rc_{23}$'s may be linked to each other to form a cyclic structure; and each of n's independently represents an integer of from 0 to 5.

<10> The positive resist composition as described in <3>, wherein at least one of the monovalent organic groups comprising at least one silicon atom represented $Rc_{13}$ and $Rc_{15}$ comprises from one to three silicon atoms.

<11> The positive resist composition as described in <3>, wherein at least one of the monovalent organic groups comprising at least one silicon atom represented $Rc_{13}$ and $Rc_{15}$ is a group represented by a following formula (S1):

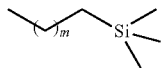

(S1)

wherein m represents an integer of from 0 to 20.

<12> The positive resist composition as described in <1>, wherein the resin (C) is a solid at 25° C.

<13> The positive resist composition as described in <1>, wherein the resin (C) has a glass transition temperature of from 50 to 200° C.

<14> The positive resist composition as described in <1>, wherein the resin (C) has a weight average molecular weight of from 1,000 to 50,000.

<15> The positive resist composition as described in <1>, wherein the resin (C) is contained in a proportion of from 0.1 to 5 mass % based on all solids content in the positive resist composition.

<16> A pattern-forming method comprising:

forming a resist film with the resist composition as described in <1>;

exposing the formed resist film; and developing the exposed resist film.

BRIEF DESCRIPTION OF THE DRAWING

FIGURE is an example of water mark defect.

DETAILED DESCRIPTION OF THE INVENTION (A) A Resin Capable of Increasing the Solubility in an Alkali Developing Solution by the Action of an Acid:

A resin capable of increasing the solubility in an alkali developing solution by the action of an acid (also referred to as resin (A)) for use in the positive resist composition of the invention is a three-component type copolymer containing a (meth)acrylate unit (a1) having a lactone ring, a (meth)-acrylate unit (a2) having an organic group having a polar group, and a (meth)acrylate unit (a3) having an acid-decomposable group (an acid-dissociable dissolution-controlling group).

By containing a repeating unit (a1) derived from acrylic acid or methacrylic acid ester having a lactone ring, adhesion with a substrate is improved, affinity with a developing solution is heightened, and film peeling can be restrained.

A repeating unit (a2) containing an organic group having a polar group is specifically a constituting unit derived from acrylic acid or methacrylic acid ester having a polar group-containing aliphatic or alicyclic hydrocarbon group. As the polar groups, a hydroxyl group, a cyano group and an amino group can be exemplified, and a hydroxyl group is preferred.

It is preferred for a repeating unit (a3) derived from an acid-decomposable group containing acrylic acid or methacrylic acid ester to have alicyclic group such as an adamantyl group, a norbornyl group, a tetracyclodecanyl group, etc., for capable of giving a resist pattern of high resolution and excellent in etching resistance.

As the proportion of the contents of repeating units (a1), (a2) and (a3), a resist composition excellent in resolution can be obtained when (a1) is from 20 to 60 mol %, preferably from 20 to 50 mol %, and (a3) is from 30 to 60 mol %, preferably from 30 to 50 mol %. When the content of the constitutional unit (a2) is 50 mol % or less, preferably in the range of from 10 to 40 mol %, an excellent resist pattern can be obtained.

As the repeating units (a1), (a2) and (a3), bicycloalkane, tricycloalkane, or tetracycloalkane, e.g., repeating units having a group formed by removing one or two or more hydrogen atoms from adamantane, norbornane, isobornane, tricyclodecane, or tetracyclododecane, in particular, an adamantyl group, a norbornyl group, or a tetracyclodecanyl group are exemplified.

Resin (A) is specifically a resin containing repeating unit (a1) selected from repeating units represented by the following formulae (a1-1) to (a1-3), repeating unit (a2) represented by the following formula (a2), and repeating unit (a3) having a structure selected from the following formulae (a3-1) to (a3-4), and capable of increasing the solubility in an alkali developing solution by the action of an acid.

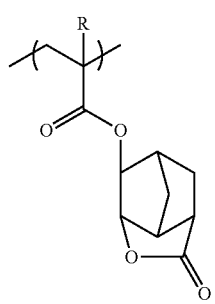

(a1-1)

(a1-2) 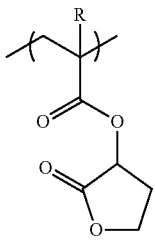

(a1-3) 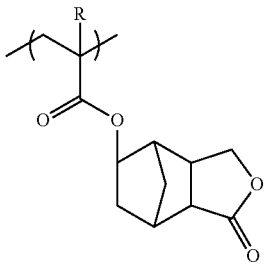

(a2) 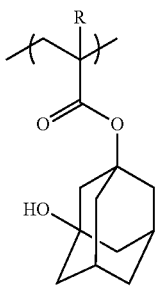

(a3-1) 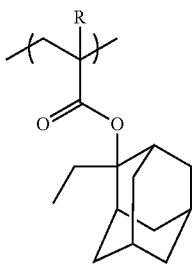

(a3-2) 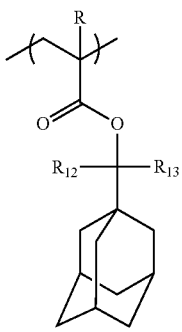

(a3-3) 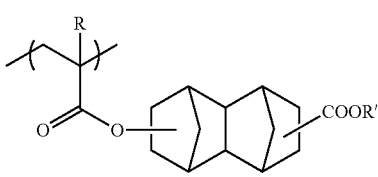

(a3-4) 

In the formulae, R represents a hydrogen atom, a halogen atom, or an alkyl group; R' represents a group capable of leaving by the action of an acid; $R_{12}$ and $R_{13}$ each represents a hydrogen atom, a methyl group, an ethyl group, or a propyl group; $R_{14}$ represents an alicyclic group; and n represents an integer of from 0 to 5.

The acid-decomposable group is a group capable of decomposing by the action of an acid to generate an alkali-soluble group. A group preferred as the acid-decomposable group is a group obtained by substituting the hydrogen atom of an alkali-soluble group with a group capable of elimination by the action of an acid.

The alkali-soluble groups include groups having a phenolic hydroxyl group, a carboxylic acid group, a fluorinated alcohol group, a sulfonic acid group, a sulfonamido group, a sulfonylimido group, an (alkylsulfonyl)(alkylcarbonyl)-methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)-methylene group, or a tris(alkylsulfonyl)methylene group.

As the preferred alkali-soluble groups, a carboxylic acid group, a fluorinated alcohol group preferably hexafluoroisopropanol), and a sulfonic acid group are exemplified.

As the group capable of decomposing and leaving by the action of an acid (the group capable of leaving by an acid), —C($R_{36}$)($R_{37}$)($R_{38}$), —C($R_{36}$)($R_{37}$)(O$R_{39}$), —C($R_{01}$)($R_{02}$)(O$R_{39}$) and the like can be exemplified.

In the formulae, $R_{36}$ to $R_{39}$ each represents an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each represents a hydrogen atom, an alkyl group, a cycloalkyl group, an aryl group, an aralkyl group, or an alkenyl group.

The preferred acid-decomposable groups are a cumyl ester group, an enol ester group, an acetal ester group, a tertiary alkyl ester group, etc., and the more preferred group is a tertiary alkyl ester group.

The alicyclic group is, to be more precise, an alicyclic hydrocarbon group, which may be monocyclic or polycyclic. Specifically, groups having a monocyclic, bicyclic, tricyclic, or tetracyclic structure having 5 or more carbon atoms can be exemplified. The number of carbon atoms is preferably from 6 to 30, and especially preferably from 7 to 25. These alicyclic hydrocarbon groups may have a substituent, Of alicyclic hydrocarbon groups the examples of the structures of alicyclic parts are shown below.

(1) 

(2) 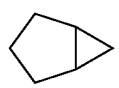

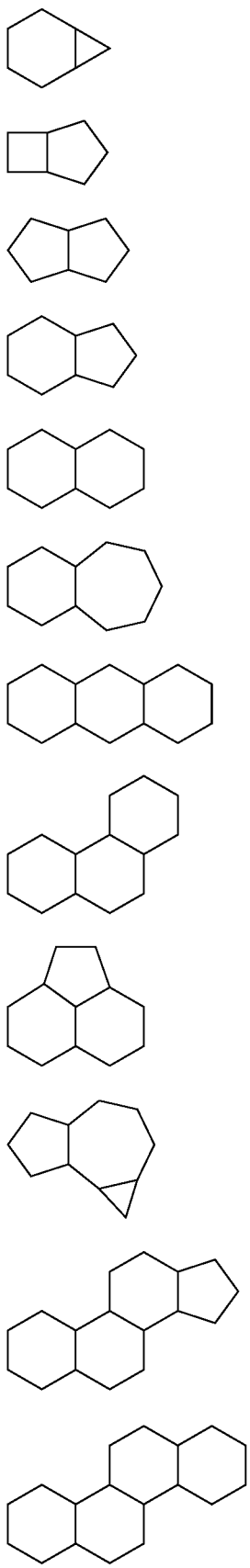
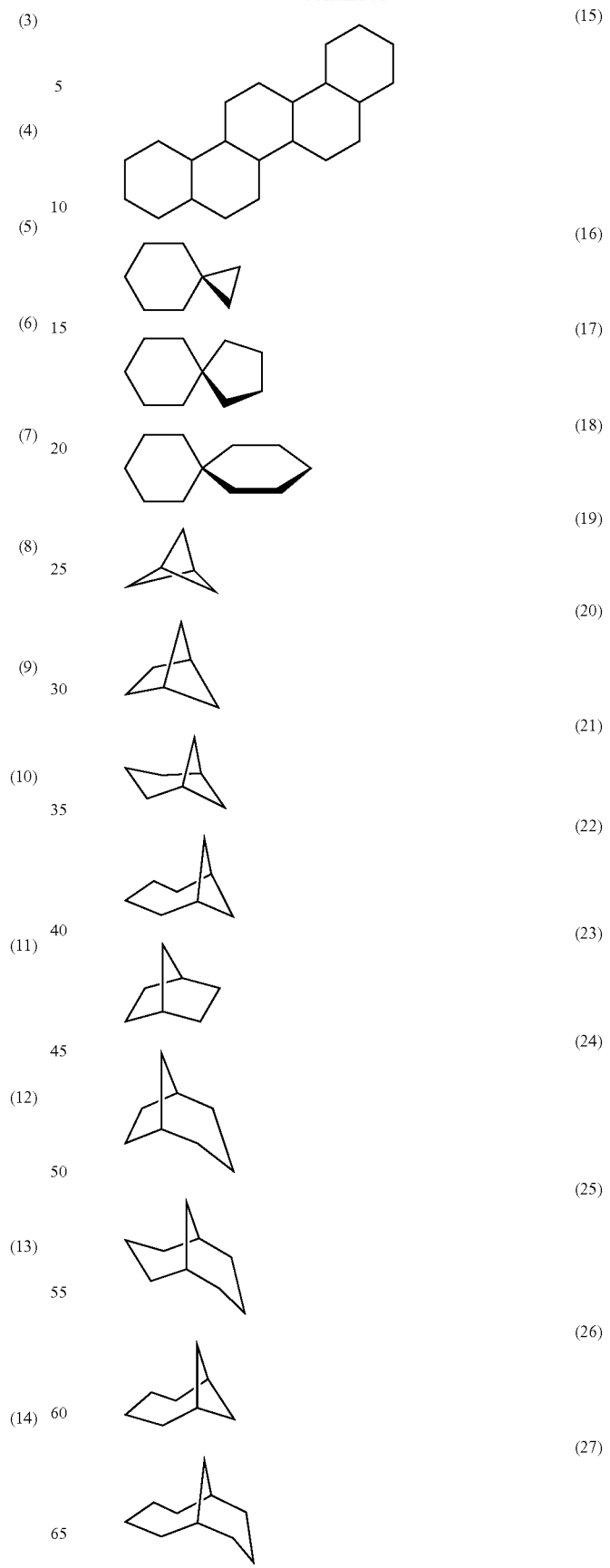

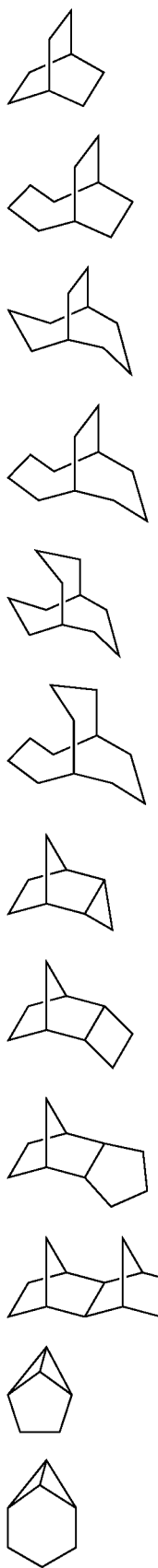
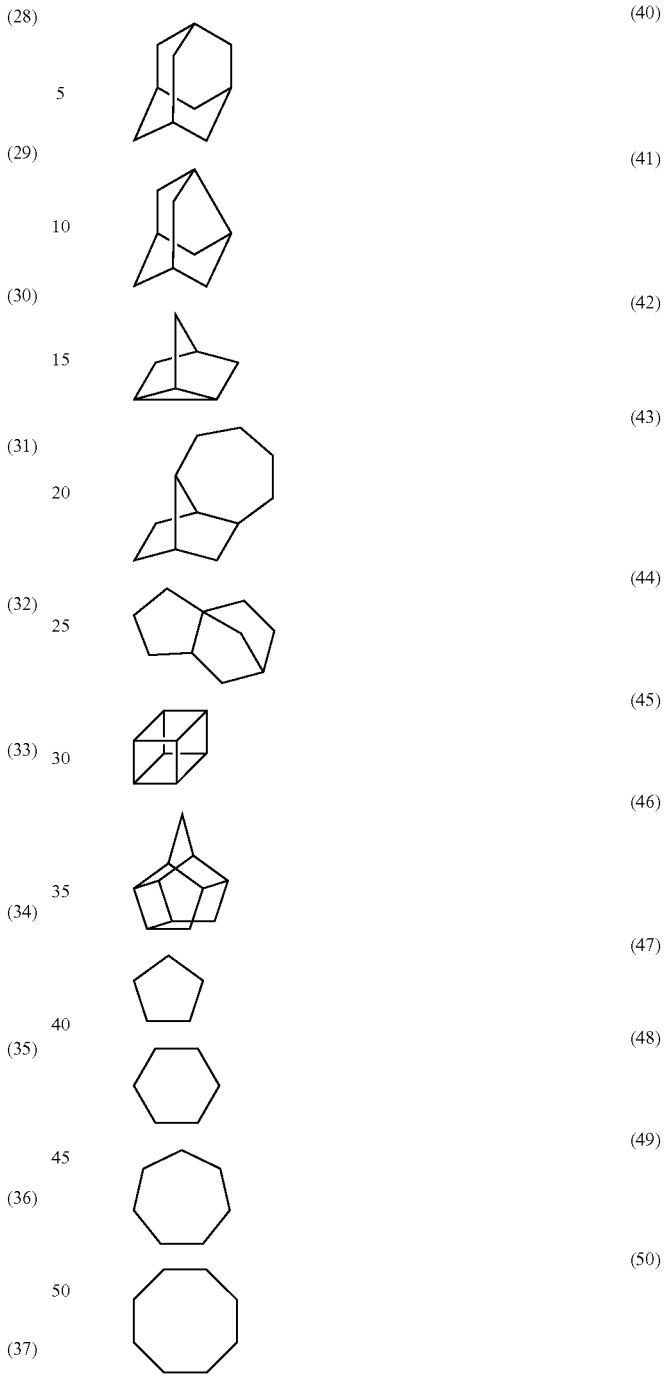

In the invention, as the preferred of the above alicyclic parts, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. More preferred groups are an adamantyl group, a decalin residue, a norbornyl group, a cedrol group, a cyclohexyl group, a cycloheptyl group, a cyclooctyl group, a cyclodecanyl group, and a cyclododecanyl group.

As the substituents of these alicyclic hydrocarbon groups, an alkyl group, a halogen atom, a hydroxyl group, an alkoxyl group, a carboxyl group, and an alkoxycarbonyl group are exemplified. As the alkyl group, lower alkyl groups such as a methyl group, an ethyl group, a propyl group, an isopropyl group and a butyl group are preferred, and a methyl group, an ethyl group, a propyl group, and an isopropyl group are more preferred. As the alkoxyl group, those having from 1 to 4 carbon atoms, e.g., a methoxy group, an ethoxy group, a propoxy group and a butoxy group can be exemplified. The alkyl group and alkoxyl group may further have a substituent. As the further substituents of the alkyl group and alkoxyl group, a hydroxyl group, a halogen atom and an alkoxyl group are exemplified.

It is preferred for resin (A) to further contain repeating unit (a4) having any structure selected from the following (a4-1) to (a4-3).

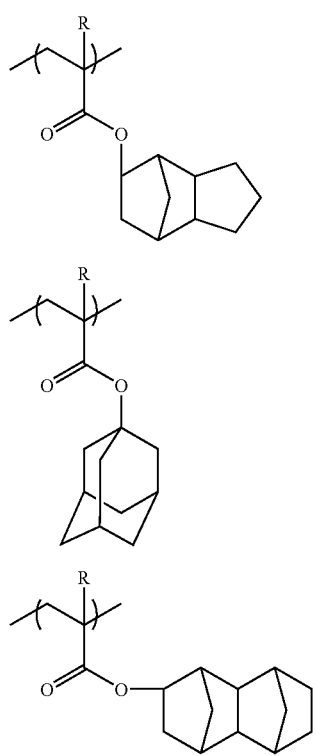

In the formulae, R represents a hydrogen atom, a fluorine atom, or an alkyl group.

Resin (A) can contain various repeating structural units besides the above repeating structural units for the purpose of the adjustments of dry etching resistance, aptitude for standard developing solutions, adhesion to a substrate, resist profile, and further, general requisite characteristics of the resist, e.g., resolution, heat resistance and sensitivity.

As these repeating structural units, the repeating structural units corresponding to the monomers shown below can be exemplified, but the invention is not restricted thereto.

By containing such repeating structural units, fine adjustment of performances required of the resin of component (A), in particular the following performances, becomes possible, that is,
(1) Solubility in a coating solvent,
(2) A film-forming property (a glass transition point),
(3) An alkali developing property,
(4) Decrease of layer thickness (hydrophobic-hydrophilic property, selection of an alkali-soluble group),
(5) Adhesion of an unexposed part to a substrate, and
(6) Dry etching resistance.

The examples of such monomers include compounds having one addition polymerizable unsaturated bond selected from acrylic acid esters, methacrylic acid esters, acrylamides, methacrylamides, allyl compounds, vinyl ethers, vinyl esters, etc.

In addition to the aforementioned compounds, addition polymerizable unsaturated compounds copolymerizable with the monomers corresponding to the above various repeating structural units may be used for copolymerization.

In the resin of component (A), the molar ratio of the content of each repeating structural unit is arbitrarily set to adjust dry etching resistance and aptitude for standard developing solutions of a resist, adhesion to a substrate, and resist profile, further, general requisite characteristics of a resist, e.g., resolution, heat resistance and sensitivity.

When the positive resist composition of the invention is for ArF exposure, it is preferred that the resin of component (A) does not have an aromatic group from the aspect of the transparency to ArF rays.

The resin of component (A) is preferably such that all the repeating units consist of (meth)acrylate repeating units. In this case, any of the following cases can be used, that is, a case where all the repeating units consist of methacrylate repeating units, a case where all the repeating units consist of acrylate repeating units, and a case where all the repeating units consist of methacrylate repeating units and acrylate repeating units, but it is preferred that acrylate repeating units account for 50 mol % or less of all the repeating units. More preferred resins are copolymers comprising from 20 to 50 mol % of (meth)acrylate repeating units having an acid-decomposable group, from 20 to 50 mol % of (meth)acrylate repeating units having a lactone structure, from 5 to 30 mol % of (meth)acrylate repeating units having an alicyclic hydrocarbon structure substituted with a hydroxyl group or a cyano group, and further containing from 0 to 20 mol % of other (meth)acrylate repeating units.

The resin of component (A) can be synthesized according to ordinary methods (for example, radical polymerization). For example, as ordinary synthesizing methods, a batch polymerization method of dissolving a monomer seed and an initiator in a solvent and heating the solution to perform polymerization, and a dropping polymerization method of adding a solution of a monomer seed and an initiator to a heated solvent over 1 to 10 hours by dropping are exemplified, and the dropping polymerization method is preferred. As reaction solvents, ethers, e.g., tetrahydrofuran, 1,4-dioxane, diisopropyl ether, etc., ketones, e.g., methyl ethyl ketone, methyl isobutyl ketone, etc., ester solvents, e.g., ethyl acetate, amide solvents, e.g., dimethylformamide and dimethyacetamide, and the later-described solvents capable of dissolving the composition of the invention, e.g., propyelne glycol monomethyl ether acetate, propylene glycol monomethyl ether, and cyclohexanone are exemplified. It is more preferred to use the same solvent in the polymerization as the solvent used in the positive resist composition of the invention, by which the generation of particles during preservation can be restrained.

It is preferred to perform the polymerization reaction in the atmosphere of inert gas such as nitrogen or argon. Polymerization is initiated with commercially available radical polymerization initiators (e.g., azo initiators, peroxide and the like). As radical polymerization initiators, azo initiators are preferred and azo initiators having an ester group, a cyano group, or a carboxyl group are preferred. As preferred initiators, azobisisobutyronitrile, azobis-dimethylvaleronitrile, dimethyl-2,2'-azobis(2-methyl-propionate), etc., are exemplified. Initiators are added additionally or dividedly, if desired, and after termination of the reaction, the reaction product is put into a solvent and an objective polymer is recovered as powder or in a solid state. The reaction concentration is from 5 to 50 mass %, and preferably from 10 to 30 mass %. The reaction temperature is generally from 10 to 150° C., preferably from 30 to 120° C., and more preferably from 60 to 100° C.

The weight average molecular weight of the resin of component (A) is preferably from 1,000 to 200,000 as the polystyrene equivalent by the GPC method, more preferably from 3,000 to 20,000, and most preferably from 5,000 to 15,000. By making the weight average molecular weight from 1,000 to 200,000, deteriorations of heat resistance and dry etching resistance can be prevented, and degradations of developing property and film-forming property due to increase in viscosity can be prevented.

The degree of dispersion (molecular weight distribution) of the resin of component (A) is generally from 1 to 5, preferably from 1 to 3, and more preferably from 1 to 2. The smaller the molecular weight distribution, the more excellent is the resin in resolution and the resist form, and the more smooth is the sidewall of the resist pattern, and the more excellent is the roughness property.

When resin (A) contains repeating unit (a4), the content of the repeating unit (a4) in resin (A) is preferably from 0.5 to 20 mol %, and more preferably from 1 to 10 mol %.

A plurality of kinds of repeating units (a1) to (a4) may be contained respectively.

In the positive resist composition of the invention, the blending amount of the resin of component (A) in the composition at large is preferably from 50 to 99.99 mass % based on all the solids content, and more preferably from 60 to 99.0 mass %.

In the invention, the resin of component (A) may be used by one kind alone, or two or more kinds of resins may be used in combination.

(B) A Compound Capable of Generating an Acid Upon Irradiation with Actinic Ray or Radiation:

The photosensitive composition of the invention contains a compound capable of generating an acid upon irradiation with actinic ray or radiation (also referred to as component (B) or compound (B)).

As such light-acid generators, photoinitiators of photocationic polymerization, photoinitiators of photoradical polymerization, photo-decoloring agents and photo-discoloring agents of dyestuffs, and well-known compounds capable of generating an acid upon irradiation with actinic ray or radiation that are used in micro-resists, and mixtures of these compounds can be optionally selected and used.

For example, diazonium salt, phosphonium salt, sulfonium salt, iodonium salt, imidosulfonate, oximesulfonate, diazodisulfone, disulfone, and o-nitrobenzylsulfonate are exemplified.

Further, compounds obtained by introducing a group or a compound capable of generating an acid upon irradiation with actinic ray or radiation into the main chain or side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc., can be used.

The compounds capable of generating an acid by the action of lights as disclosed in U.S. Pat. No. 3,779,778, EP 126,712, etc., can also be used.

Component (B) is preferably a compound capable of generating an acid having a fluoroalkyl chain (preferably having from 2 to 4 carbon atoms) or a benzenesulfonic acid having a fluorine atom upon irradiation with actinic ray.

Component (B) is also preferably a triphenylsulfonium salt compound having, at the cationic part, an alkyl residue (preferably having from 1 to 15 carbon atoms) not substituted with a fluorine atom or a cycloalkyl residue (preferably having from 3 to 15 carbon atoms) not substituted with a fluorine atom.

Of the compounds capable of decomposing upon irradiation with actinic ray or radiation and generating an acid, the compounds represented by any of the following formulae (ZI), (ZII) and (ZIII) can be exemplified as preferred compounds.

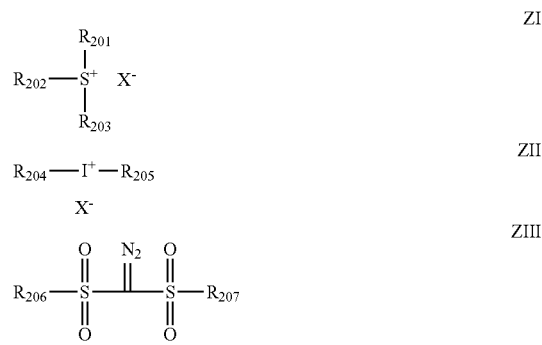

In formula (ZI), $R_{201}$, $R_{202}$ and $R_{203}$ each represents an organic group.

$X^-$ represents a non-nucleophilic anion, preferably a sulfonate anion, a carboxylate anion, a bis(alkylsulfonyl)-amide anion, a tris(alkylsulfonyl)methide anion, $BF_4^-$, $PF_6^-$, $SbF_6^-$, etc., are exemplified, and preferably an organic anion containing a carbon atom.

As preferred organic anions, organic anions represented by the following formulae are exemplified.

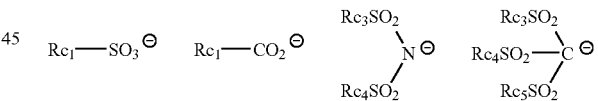

In the above formulae, $Rc_1$ represents an organic group.

As the organic group represented by $Rc_1$, an organic group having from 1 to 30 carbon atoms is exemplified, preferably an alkyl group, an aryl group, each of which groups may be substituted, and a group obtained by linking a plurality of these groups with a linking group such as a single bond, —O—, —CO$_2$—, —S—, —SO$_3$— or —SO$_2$N(Rd$_1$)— can be exemplified. Rd$_1$ represents a hydrogen atom or an alkyl group.

$Rc_3$, $Rc_4$ and $Rc_5$ each represents an organic group. As preferred organic groups represented by $Rc_3$, $Rc_4$ and $Rc_5$, the same organic groups as the preferred organic groups in $Rc_1$ can be exemplified, and a perfluoroalkyl group having from 1 to 4 carbon atoms is most preferred.

$Rc_3$ and $Rc_4$ may be bonded to each other to form a ring.

As the group formed by bonding $Rc_3$ and $Rc_4$, an alkylene group and an arylene group are exemplified, and a perfluoroalkylene group having from 2 to 4 carbon atoms is preferred.

The especially preferred organic groups represented by $Rc_1$, $Rc_3$ to $Rc_5$ are an alkyl group substituted with a fluorine atom or a fluoroalkyl group on the 1-position, and a phenyl group substituted with a fluorine atom or a fluoroalkyl group. By the presence of a fluorine atom or a fluoroalkyl group, the acidity of the acid generated upon light irradiation increases to enhance sensitivity. Further, by the presence of a ring formed by bonding $Rc_3$ and $Rc_4$, the acidity of the acid generated upon light irradiation increases to improve sensitivity.

The number of carbon atoms of the organic groups represented by $R_{201}$, $R_{202}$ and $R_{203}$ is generally from 1 to 30, and preferably from 1 to 20.

Any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring.

As the group formed by any two of $R_{201}$, $R_{202}$ and $R_{203}$ by bonding, an alkylene group (e.g., a butylene group and a pentylene group) can be exemplified.

As the specific examples of the organic groups represented by $R_{201}$, $R_{202}$ and $R_{203}$, the corresponding groups in compounds (ZI-1), (ZI-2) and (ZI-3) described later can be exemplified.

The compound represented by formula (ZI) may be a compound having a plurality of structures represented by formula (ZI). For instance, compound (ZI) may be a compound having a structure that at least one of $R_{201}$, $R_{202}$ and $R_{203}$ of the compound represented by formula (ZI) is bonded to at least one of $R_{201}$, $R_{202}$ and $R_{203}$ of another compound represented by formula (ZI).

As further preferred component (ZI), the following compounds (ZI-1), (ZI-2) and (ZI-3) can be exemplified.

Compound (ZI-1) is an arylsulfonium compound in the case where at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group.

As the arylsulfonium compound, e.g., a tiarylsulfonium compound, a diarylalkylsulfonium compound, and an aryldialkylsulfonium compound can be exemplified.

As the aryl group of the arylsulfonium compound, an aryl group, e.g., a phenyl group and a naphthyl group, and a hetero-aryl group, e.g., an indole residue and a pyrrole residue are preferred, and a phenyl group and an indole residue are more preferred. When the arylsulfonium compound has two or more aryl groups, these two or more aryl groups may be the same or different.

The alkyl group introduced into the arylsulfonium compound according to necessity is preferably a straight chain, branched, or cyclic alkyl group having from 1 to 15 carbon atoms, e.g., a methyl group, an ethyl group, a propyl group, an n-butyl group, a sec-butyl group, a t-butyl group, a cyclopropyl group, a cyclobutyl group, a cyclohexyl group, etc., can be exemplified.

The aryl group and alkyl group represented by $R_{201}$, $R_{202}$ and $R_{203}$ may have a substituent, e.g., an alkyl group (e.g., having from 1 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain, branched, or cyclic alkyl group having from 1 to 12 carbon atoms, and a straight chain, branched, or cyclic alkoxyl group having from 1 to 12 carbon atoms, and the most preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When $R_{201}$, $R_{202}$ and $R_{203}$ each represents an aryl group, it is preferred that the substituent is substituted on the p-position of the aryl group.

Compound (ZI-2) is described below.

Compound (ZI-2) is a compound in the case where $R_{201}$, $R_{202}$ and $R_{203}$ in formula (ZI) each represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

$R_{201}$, $R_{202}$ and $R_{203}$ each preferably represents an alkyl group, a 2-oxoalkyl group, an alkoxycarbonylmethyl group, an allyl group, or a vinyl group, more preferably represents a straight chain, branched, or cyclic 2-oxoalkyl group, or an alkoxycarbonylmethyl group, and most preferably a straight chain or branched 2-oxoalkyl group.

The alkyl group represented by $R_{201}$, $R_{202}$ and $R_{203}$ may be any of straight chain, branched, and cyclic, preferably a straight chain or branched alkyl group having from 1 to 10 carbon atoms (e.g., a methyl group, an ethyl group, a propyl group, a butyl group, and a pentyl group), and a cyclic alkyl group having from 3 to 10 carbon atoms (e.g., a cyclopentyl group, a cyclohexyl group, and a norbornyl group) can be exemplified.

The 2-oxoalkyl group represented by $R_{201}$, $R_{202}$ and $R_{203}$ may be any of straight chain, branched, and cyclic, and preferably groups having >C=O on the 2-position of the above alkyl groups can be exemplified.

As the alkoxyl group in the alkoxycarbonylmethyl group represented by $R_{201}$, $R_{202}$ and $R_{203}$, preferably an alkoxy group having from 1 to 5 carbon atoms, e.g., a methoxy group, an ethoxy group, a propoxy group, a butoxy group, a pentoxy group can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group, or a nitro group.

Any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by any two of $R_{201}$, $R_{202}$ and $R_{203}$ by bonding, an alkylene group (e.g., a butylene group and a pentylene group) can be exemplified.

Compound (ZI-3) is a compound represented by the following formula (ZI-3) and having a phenacylsulfonium salt structure.

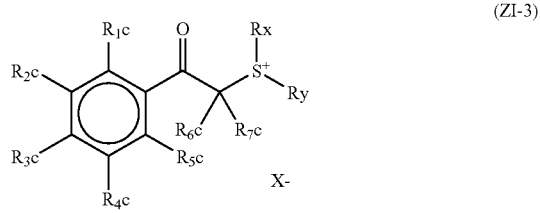

(ZI-3)

$R_{1c}$, $R_{2c}$, $R_{3c}$, $R_{4c}$ and $R_{5c}$ each represents a hydrogen atom, an alkyl group, an alkoxyl group, or a halogen atom.

$R_{6c}$, and $R_{7c}$ each represents a hydrogen atom or an alkyl group.

$R_x$ and $R_y$ each represents an alkyl group, a 2-oxoalkyl group, an alkoxycarbonylmethyl group, an allyl group, or a vinyl group.

Any two or more of $R_{1c}$ to $R_{5c}$, and $R_x$ and $R_y$ may be bonded to each other to form cyclic structures, respectively, and the cyclic structures may contain an oxygen atom, a sulfur atom, an ester bond, or an amido bond.

The alkyl group represented by $R_{1c}$ to $R_{5c}$ may be any of straight chain, branched, and cyclic, e.g., an alkyl group having from 1 to 20 carbon atoms, preferably a straight chain or branched alkyl group having from 1 to 12 carbon atoms (e.g., a methyl group, an ethyl group, a straight chain or branched propyl group, a straight chain or branched butyl group, and a straight chain or branched pentyl group), and a cyclic alkyl group having from 3 to 8 carbon atoms (e.g., a cyclopentyl group and a cyclohexyl group) can be exemplified.

The alkoxyl group represented by $R_{1c}$ to $R_{5c}$ may be any of straight chain, branched, and cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), a cyclic alkoxyl group having from 3 to 8 carbon atoms (e.g., a cyclopentyloxy group, and a cyclohexyloxy group) can be exemplified.

It is preferred that any of $R_{1c}$ to $R_{5c}$ represents a straight chain, branched, or cyclic alkyl group, or a straight chain, branched, or cyclic alkoxyl group, and more preferably the sum total of the carbon atoms of $R_{1c}$ to $R_{5c}$ is from 2 to 15, by which the solubility in a solvent is bettered and the generation of particles during preservation can be restrained.

As the alkyl group represented by $R_x$ and $R_y$, the same alkyl groups represented by $R_{1c}$ to $R_{5c}$ can be exemplified.

As the 2-oxoalkyl group, groups having >C=O on the 2-position of the alkyl groups represented by $R_{1c}$ to $R_{5c}$ can be exemplified.

As the alkoxyl group of the alkoxycarbonylmethyl group, the same alkoxyl groups as those represented by $R_{1c}$ to $R_{5c}$ can be exemplified.

As the groups formed by $R_x$ and $R_y$ by bonding, a butylene group, a pentylene group, etc., can be exemplified.

$R_x$ and $R_y$ each preferably represents an alkyl group having 4 or more carbon atoms, more preferably 6 or more carbon atoms, and still more preferably an alkyl group having 8 or more carbon atoms.

In formulae (ZII) and (ZIII), $R_{204}$, $R_{205}$, $R_{206}$ and $R_{207}$ each represents an aryl group that may have a substituent, or an alkyl group that may have a substituent.

The aryl group represented by $R_{204}$ to $R_{207}$ is preferably a phenyl group or a naphthyl group, and more preferably a phenyl group.

The alkyl group represented by $R_{204}$ to $R_{207}$ may be any of straight chain, branched, and cyclic, and preferably a straight chain or branched alkyl group having from 1 to 10 carbon atoms (e.g., a methyl group, an ethyl group, a propyl group, a butyl group, and a pentyl group), and a cyclic alkyl group having from 3 to 10 carbon atoms (e.g., a cyclopentyl group, a cyclohexyl group, a norbonyl group) can be exemplified.

As the examples of the substituents that $R_{204}$ to $R_{207}$ may have, e.g., an alkyl group (e.g., having from 1 to 15 carbon atoms), an aryl group (e.g., having from 6 to 15 carbon atoms), an alkoxyl group (e.g., having from 1 to 15 carbon atoms), a halogen atom, a hydroxyl group, a phenylthio group, etc., can be exemplified.

$X^-$ represents a non-nucleophilic anion, and the same anions as the non-nucleophilic anion represented by $X^-$ in formula (ZI) can be exemplified.

Of the compounds capable of generating an acid upon irradiation with actinic ray or radiation that may be used in combination, the compounds represented by the following formula (ZIV), (ZV) or (ZVI) can further be exemplified as preferred compounds.

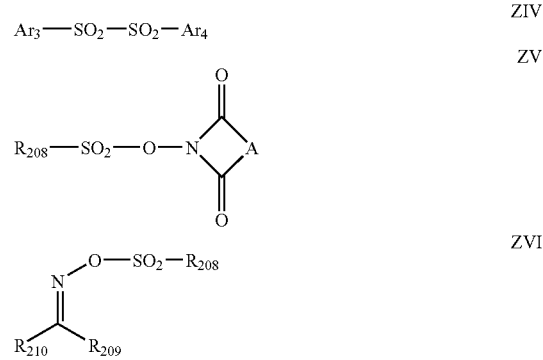

In formulae (ZIV) to (ZVI), $Ar_3$ and $Ar_4$ each represents an aryl group.

$R_{208}$ represents an alkyl group or a substituted or unsubstituted aryl group.

$R_{209}$ and $R_{210}$ each represents an alkyl group, an aryl group, or an electron attractive group. $R_{209}$ preferably represents an aryl group.

$R_{210}$ preferably represents an electron attractive group, and more preferably a cyano group or a fluoroalkyl group.

A represents an alkylene group, an alkenylene group, or an arylene group.

Of the compounds capable of decomposing upon irradiation with actinic ray or radiation and generating an acid, the compounds represented by any of formulae (ZI), (ZII) and (ZIII) are more preferred.

As acid generators, the compounds represented by the following formula (b-1) or (b-2) are also preferably used.

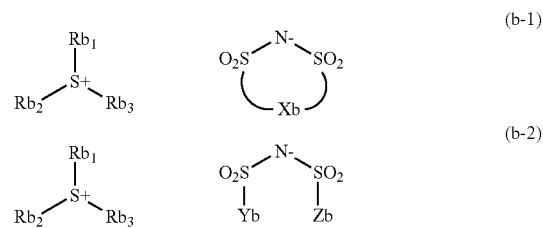

In formulae (b-1) and (b-2), $Rb_1$, $Rb_2$ and $Rb_3$ each represents an alkyl group, a cycloalkyl group, or an aryl group, provided that at least one of $Rb_1$ to $Rb_3$ represents an aryl group.

Xb represents an alkylene fluoride group having from 2 to 6 carbon atoms.

Yb and Zb each represents an alkyl group.

The alkyl group represented by $Rb_1$ to $Rb_3$ is an alkyl group having from 1 to 6 carbon atoms, preferably an alkyl group having from 1 to 4 carbon atoms, and the cycloalkyl group is preferably a cycloalkyl group having from 3 to 10 carbon atoms, and more preferably from 4 to 6 carbon atoms.

As the alkylene fluoride group having from 2 to 6 carbon atoms represented by Xb, a perfluoroalkylene group is especially preferred.

As the alkyl group represented by Yb and Zb, an alkyl fluoride group is preferred, and the one having from 1 to 6 carbon atoms is preferred, and more preferably the one having from 1 to 4 carbon atoms.

Of the compounds capable of generating an acid upon irradiation with actinic ray or radiation, the examples of especially preferred compounds are shown below.

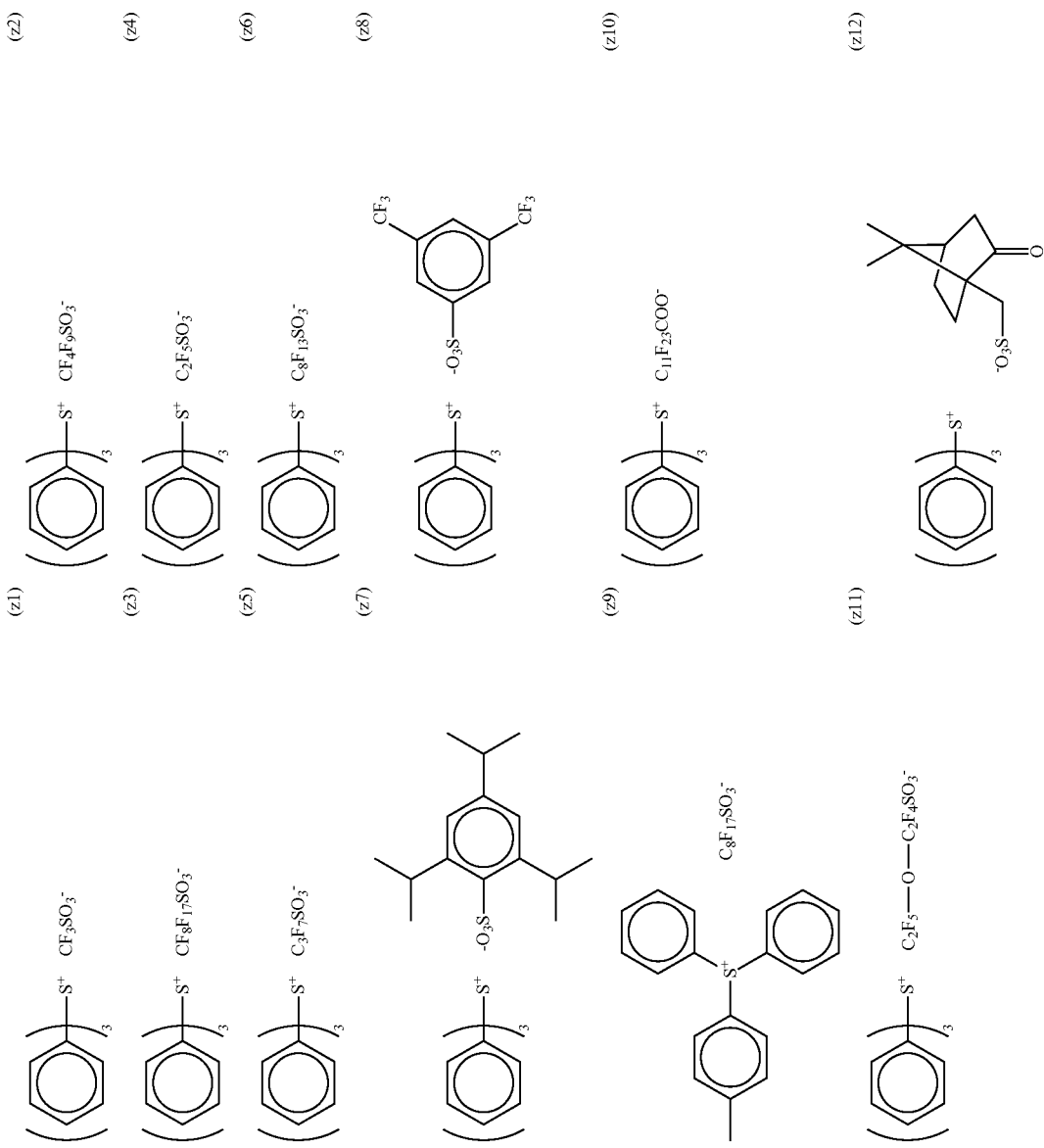

-continued
(z13) 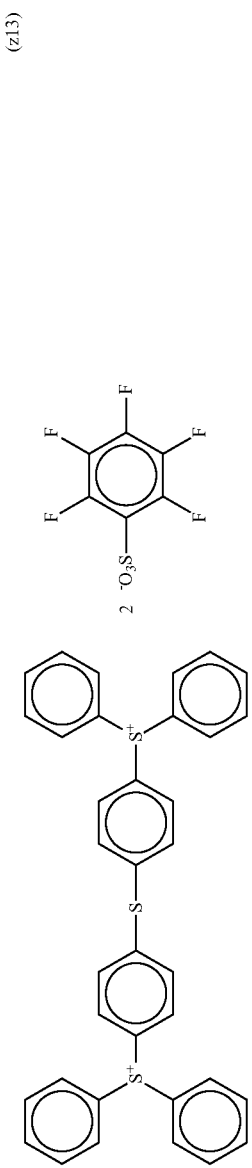
(z14) 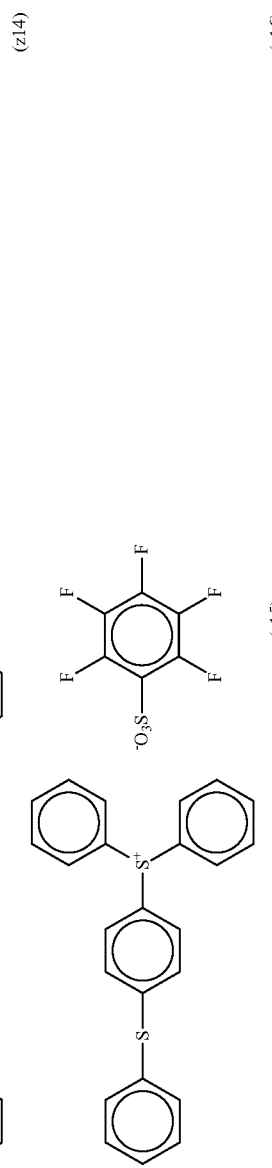
(z15)
(z16) 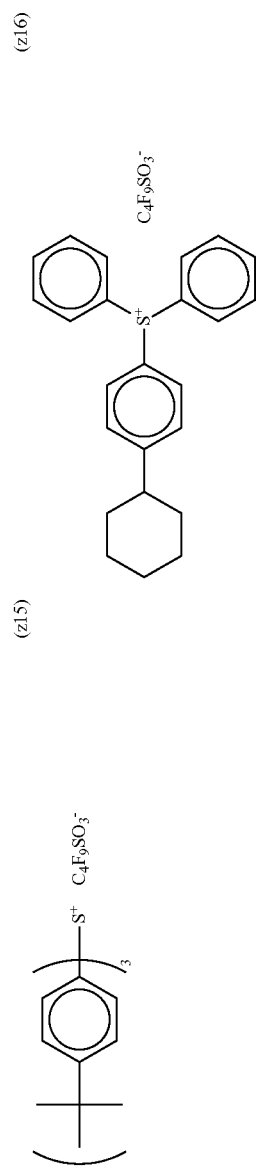
(z17)
(z18) 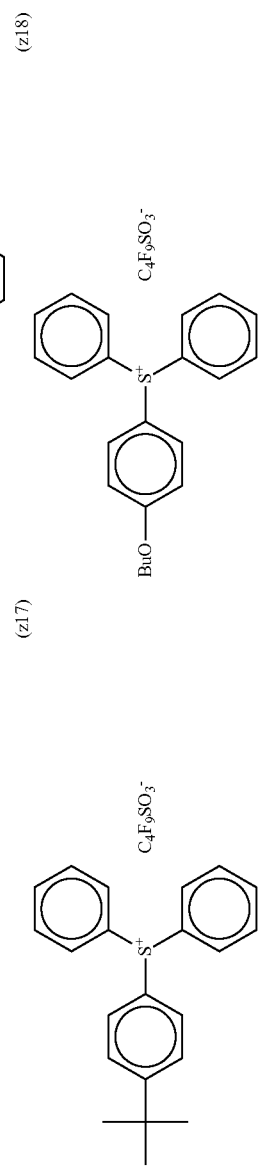

-continued
(z19) 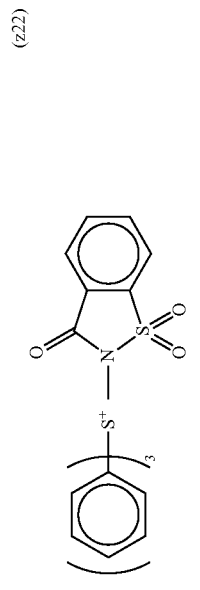
(z20) 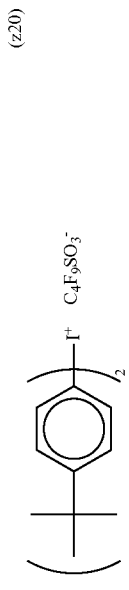
(z21) 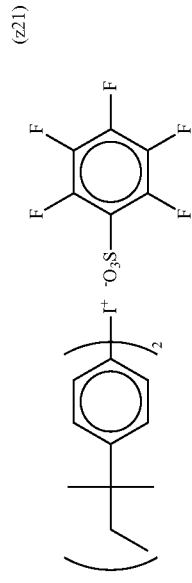
(z22) 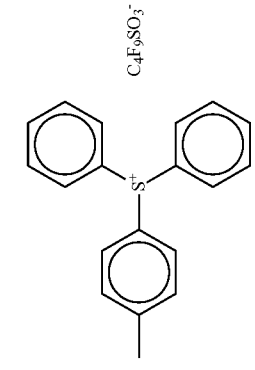
(z23) 
(z24) 
(z25) 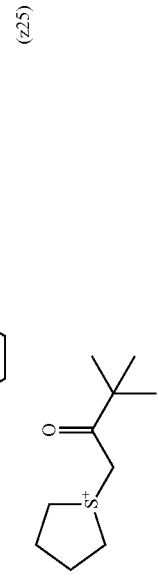
(z26) 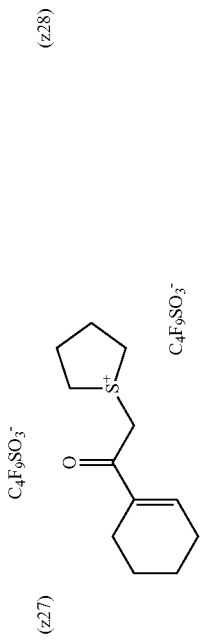
(z27) 
(z28) 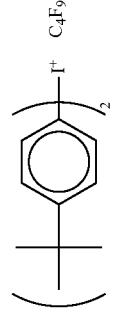

-continued
(z39) 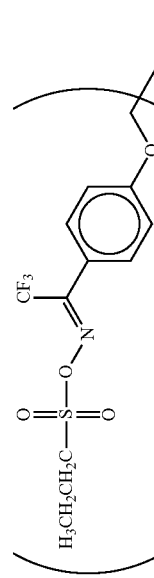 (z40) 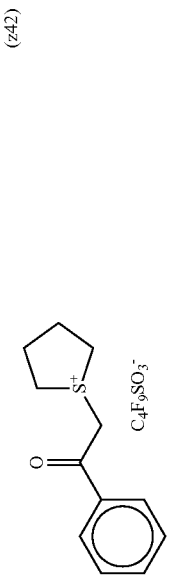
(z41) 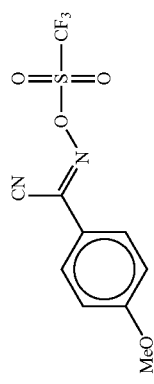 (z42) 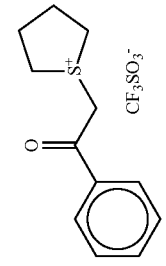
(z43) 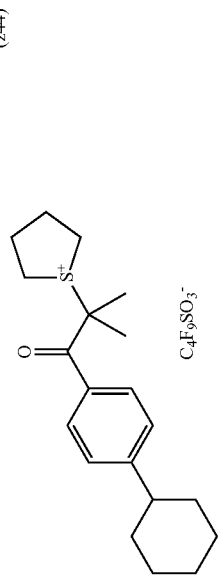 (z44) 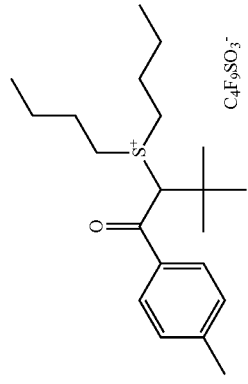
(z45) 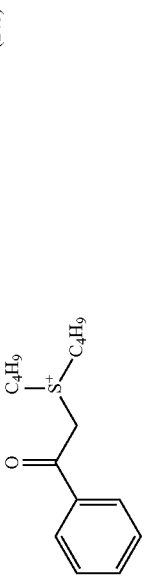 (z46) 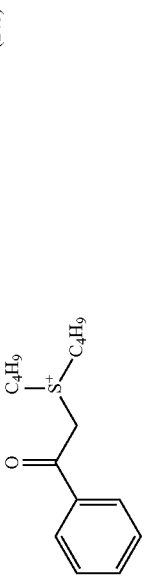
(z47) 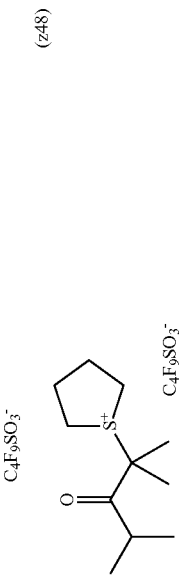 (z48) 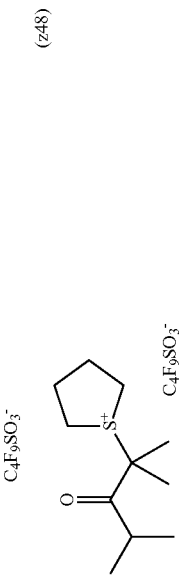

-continued
(z49) 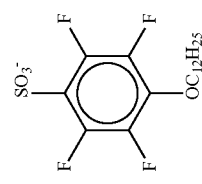
(z50) 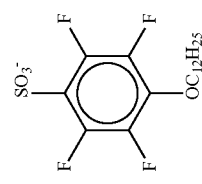
(z51) 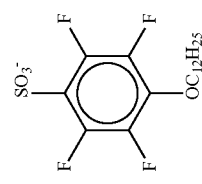
(z52) 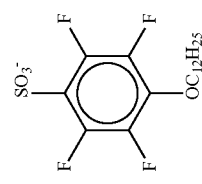
(z53) 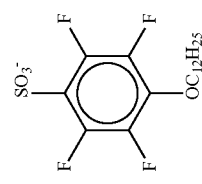
(z54) 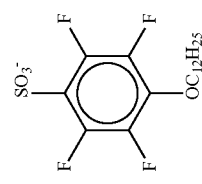
(z55) 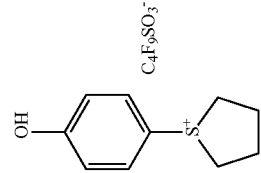
(z56) 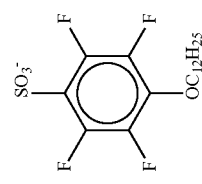

-continued
(z57) 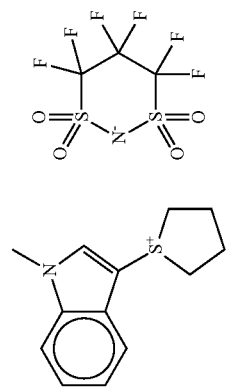
(z58) 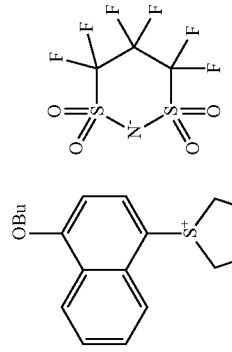
(z59) 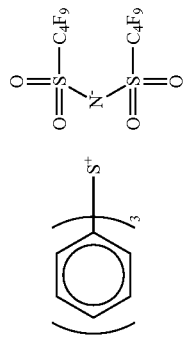
(z60) 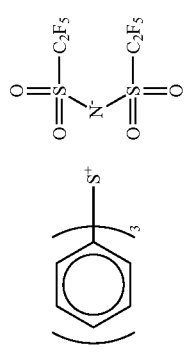
(z61) 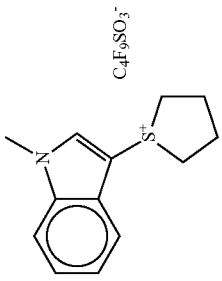
(z62) 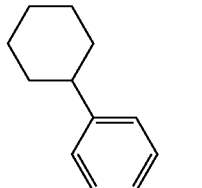
C$_4$F$_9$SO$_3^-$ 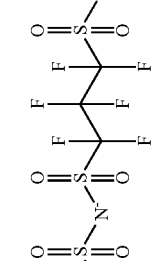
(z63) 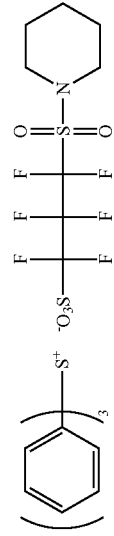

-continued
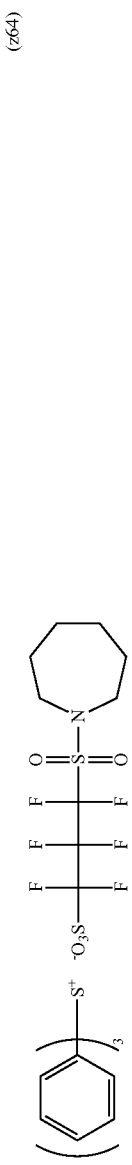
(z64)
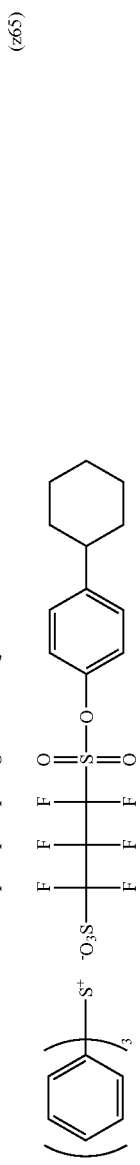
(z65)
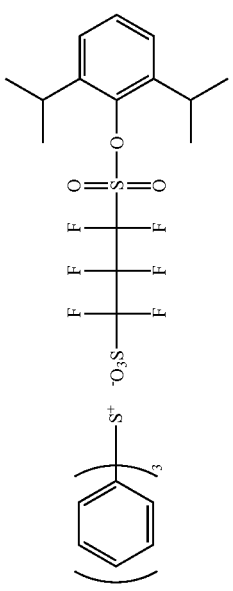
(z66)
(z67)
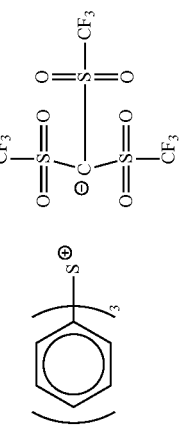
(z68)
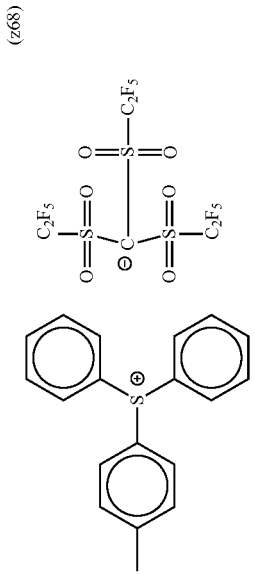
(z69)
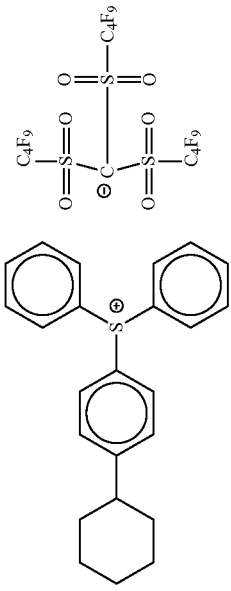

-continued
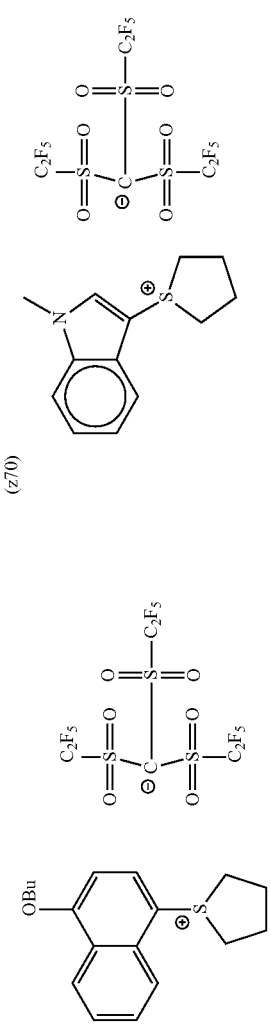
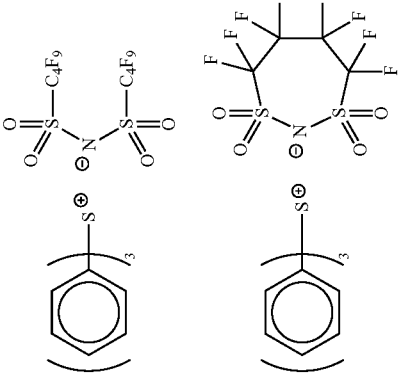

-continued
A2-II-7
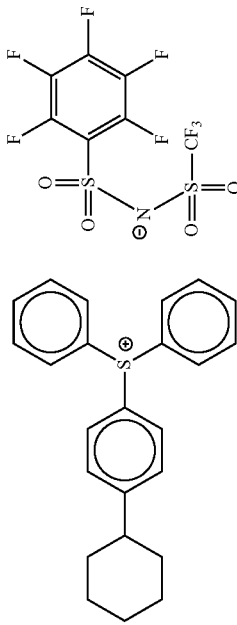
A2-II-8
A2-II-9
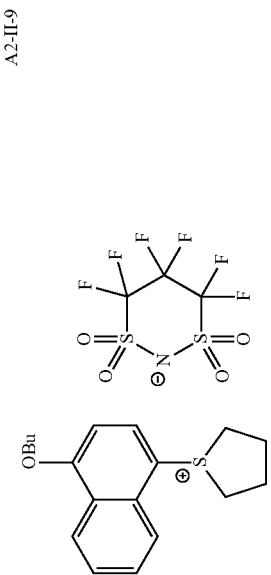
A2-II-10
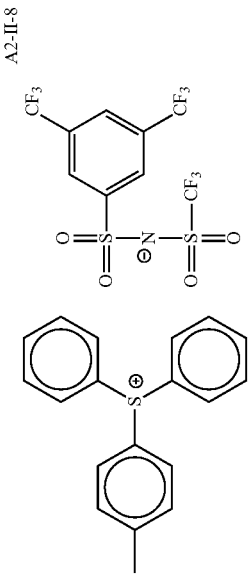
A2-II-11
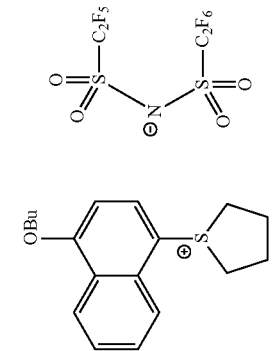
A2-II-12
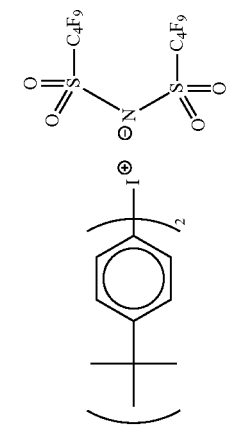
A2-II-13
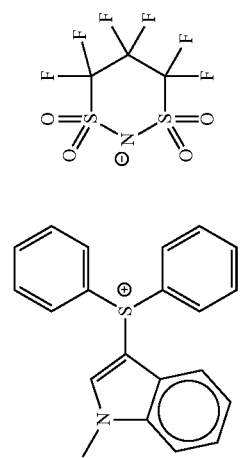
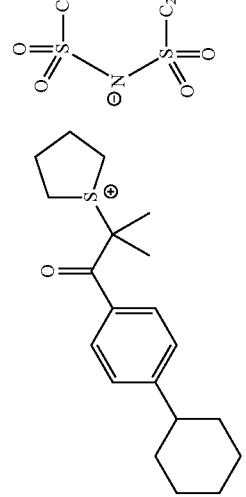

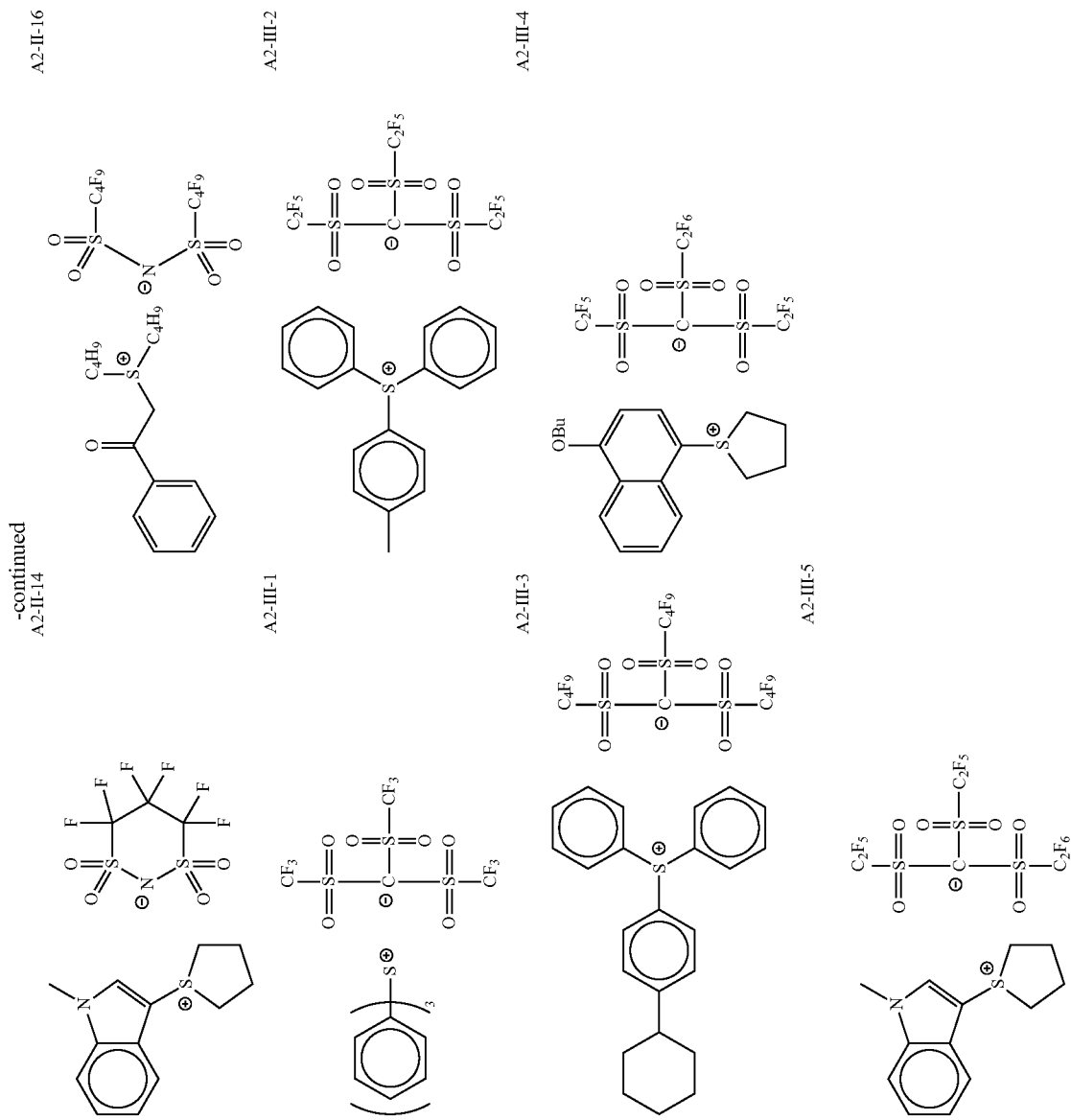

The acid generators can be used by one kind alone, or two or more kinds can be used in combination. When two or more compounds are used in combination, it is preferred to combine compounds capable of generating two kinds of organic acids in which the total atom number exclusive of a hydrogen atom differs by 2 or more. The content of the acid generator in a composition is preferably from 0.1 to 20 mass % based on all the solids content of the resist composition, more preferably from 0.5 to 10 mass %, and still more preferably from 1 to 7 mass %.

(C) A Resin Having at Least Either a Fluorine Atom or a Silicon Atom and Insoluble in an Alkali Developing Solution:

The resist composition of the invention contains a resin having at least either a fluorine atom or a silicon atom and insoluble in an alkali developing solution.

Here, "insoluble in an alkali developing solution" means that the dissolved amount of a resist film in a 2.38 wt % tetramethylammonium hydroxide aqueous solution at 23° C. is 20 nm or less as integration for 30 seconds from the start of development. Further, it is preferred for the resin not to contain an alkali-soluble group, a group increasing in solubility in an alkali developing solution.

By containing resin (C) in the resist composition of the invention, resin (C) is locally present on the surface layer of the photosensitive film, and when the immersion medium is water, the resist composition as formed to a photosensitive film can improve the sweepback contact angle of the surface layer of the photosensitive film to water, and can improve the following ability of immersion liquid. Resins as resin (C) are not restricted so long as the sweepback contact angle of the surface layer is improved by the addition, but resins having at least either a fluorine atom or a silicon atom are preferably used. The sweepback contact angle of a photosensitive film is preferably from 60 to 90°, and more preferably 70° or more.

The addition amount of resin (C) can be arbitrarily selected so as to reach the above range of the sweepback contact angle of the photosensitive film. The addition amount is preferably from 0.1 to 10 mass % based on all the solids content of the photosensitive composition, and more preferably from 0.1 to 5 mass %.

As described above, resin (C) is present locally on the interface, but differing from surfactants, it does not necessarily have to have a hydrophilic group in the molecule and contribute to homogeneous blending of polar and nonpolar substances.

It is preferred that resin (C) is at least either resin (CA) having at least a fluorine atom or a silicon atom, and an alicyclic structure, or resin (CB) containing a repeating unit having at least a fluorine atom or a silicon atom on the side chain, and a repeating unit having an unsubstituted alkyl group on the side chain.

It is preferred that resin (C) is a solid at 25° C.

It is preferred that the glass transition temperature of resin (C) is from 50 to 200° C. Here, the term "main chain" means a chain part composed of the connected monomer units. The term "side chain" means a structural part other than the main chain structure.

Resin (C) is preferably a hydrophobic resin (HP). A hydrophobic resin (HP) can also be preferably used as a topcoat.

A fluorine atom or a silicon atom in a hydrophobic resin (HP) may be introduced to the main chain of the resin or may be substituted on the side chain, "A hydrophobic resin" is a resin capable of contribution to the improvement of the contact angle to water of the surface of a photosensitive film by the addition to the photosensitive film.

Hydrophobic resins are not restricted so long as the resins are capable of improving the sweepback contact angle of the surface of a film by addition, but they are preferably resins having at least either a fluorine atom or a silicon atom. When applied to immersion exposure, it is preferred that the sweepforward contact angle of the photosensitive film is adjusted to 70° to 120°, and more preferably from 75° to 100°. The sweepback contact angle is preferably adjusted to 60° to 100°, and more preferably from 70° to 90°. The addition amount of a hydrophobic resin (HP) can be arbitrarily adjusted so that the sweepback contact angle of a photosensitive film reaches the above range, but it is preferably from 0.1 to 10 mass % based on all the solids content of the photosensitive composition, and more preferably from 0.1 to 5 mass %.

It is preferred that sweepback contact angle can be improved with a smaller addition amount, so that the glass transition point (Tg) of hydrophobic resins is preferably in the range of from 50 to 200° C.

Hydrophobic resins are preferably solid at normal temperature (25° C.).

The sweepforward contact angle and sweepback contact angle defined here are sweepforward and sweepback contact angles measured according to an extraction contraction method. Specifically, a droplet of 36 µl is formed with a syringe on a positive resist composition prepared on a silicon wafer, and the droplet is ejected or sucked at a speed of 6 µl/sec, and the values stabilized during ejection and suction are defined as the sweepforward and sweepback contact angles.

Many hydrophobic resins are present locally on the interface, but differing from surfactants, they do not necessarily have to have a hydrophilic group in the molecule and contribute to homogeneous blending of polar and nonpolar substances.

"Soluble in an alkali developing solution" means that the dissolved amount of a hydrophobic resin film in a 2.38 wt % tetramethylammonium hydroxide aqueous solution at 23° C. is 50 nm or more as integration for 30 seconds from the start of development. In order to be soluble in an alkali developing solution, it is necessary for a photosensitive resin film to have an alkali-soluble group in a developing process.

Hydrophobic resins may have an alkali-soluble group in advance, or an alkali-soluble group may be formed by the action of an acid during the processes of from exposure to development, or it may be formed by reaction with an alkali developing solution.

Resin (HP) is preferably a resin having an alkyl group having a fluorine atom, a cycloalkyl group having a fluorine atom, or an aryl group having a fluorine atom, as the partial structure having a fluorine atom.

The alkyl group having a fluorine atom (preferably having from 1 to 10 carbon atoms, and more preferably from 1 to 4 carbon atoms) is a straight chain or branched alkyl group in which at least one hydrogen atom is substituted with a fluorine atom, and the group may further have other substituents.

The cycloalkyl group having a fluorine atom is a monocyclic or polycyclic cycloalkyl group in which at least one hydrogen atom is substituted with a fluorine atom, and the group may further have other substituents.

The aryl group having a fluorine atom is an aryl group such as a phenyl group or a naphthyl group in which at least one hydrogen atom is substituted with a fluorine atom, and the group may further have other substituents.

General formulae of the alkyl group having a fluorine atom, the cycloalkyl group having a fluorine atom, and the aryl group having a fluorine atom respectively are shown below, but the invention is not restricted thereto.

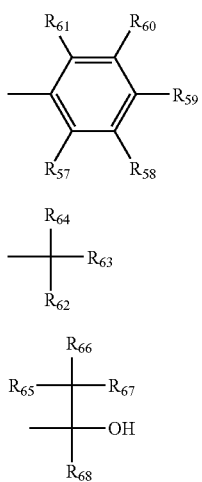

(F2)

(F3)

(F4)

In formulae (F2) to (F4), $R_{57}$ to $R_{68}$ each represents a hydrogen atom, a fluorine atom, or an alkyl group. However, at least one of $R_{57}$ to $R_{61}$, $R_{62}$ to $R_{64}$, and $R_{65}$ to $R_{68}$, respectively represent a fluorine atom, or an alkyl group (preferably having from 1 to 4 carbon atoms) in which at least one hydrogen atom is substituted with a fluorine atom. It is preferred that all of $R_{57}$ to $R_{61}$ and $R_{65}$ to $R_{67}$ represent a fluorine atom. $R_{62}$, $R_{63}$ and $R_{6g}$ each preferably represents an alkyl group (preferably having from 1 to 4 carbon atoms) in which at least one hydrogen atom is substituted with a fluorine atom, and more preferably a perfluoroalkyl group having from 1 to 4 carbon atoms. $R_{62}$ and $R_{63}$ may be linked to each other to form a ring.

As the specific examples of the groups represented by formula (F2), a p-fluorophenyl group, a pentafluorophenyl group, a 3,5-di(trifluoromethyl)phenyl group, etc., are exemplified.

The specific examples of the groups represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. A hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, and a hexafluoroisopropyl group and a heptafluoroisopropyl group are more preferred.

As the specific examples of the groups represented by formula (F4), —C(CF$_3$)$_2$OH, —C(C$_2$F$_5$)$_2$OH, —C(CF$_3$)(CH$_3$)OH, —CH(CF$_3$)OH, etc., are exemplified, and —C(CF$_3$)$_2$OH is preferred.

It is preferred that resin (C) is a resin having at least one repeating unit selected from repeating units having a fluorine atom represented by any of the following formulae (c1-1) to (c1-3), stable to an acid, and insoluble in an alkali developing solution.

"Stable to an acid" means not to contain a repeating unit capable of decomposing by the action of an acid to increase the solubility in an alkali developing solution, and a compound does not decompose even in the presence of an acid generated by a light-acid generator. As acid-decomposable groups, the same acid-decomposable groups as described in resin (A) can be exemplified.

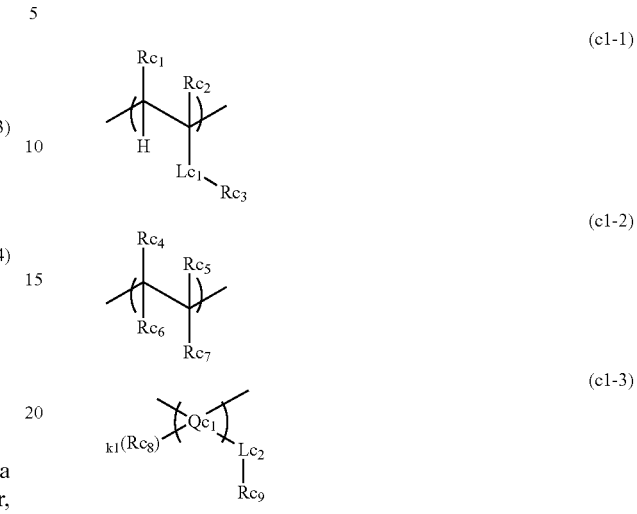

In formulae (c1-1), (c1-2) and (c1-3), $Rc_1$ represents a hydrogen atom or an alkyl group.

$Rc_2$ represents a fluoroalkyl group.

$R_{c3}$ represents a hydrogen atom or a monovalent organic group.

$Rc_4$, $Rc_5$, $Rc_6$ and $Rc_7$ each represents a hydrogen atom, a fluorine atom, an alkyl group, a fluoroalkyl group, an alkoxyl group, or a fluoroalkoxy group, provided that at least one of $Rc_4$ to $Rc_7$ represents a fluorine atom, and $Rc_4$ and $Rc_5$ or $Rc_6$ and $Rc_7$ may be bonded to each other to form a ring.

$Rc_8$ represents a hydrogen atom, a fluorine atom, or a monovalent organic group.

$Rc_9$ represents a fluorine atom or a monovalent organic group having a fluorine atom.

$Lc_1$ and $Lc_2$ each represents a single bond or a divalent linking group.

$Qc_1$ represents an alicyclic structure.

$k_1$ represents an integer of from 0 to 3.

The specific examples of repeating units having a fluorine atom are shown below. In the formulae, $X_1$ represents a hydrogen atom, —CH$_3$, —F or —CF$_3$; and $X_2$ represents —F or —CF$_3$.

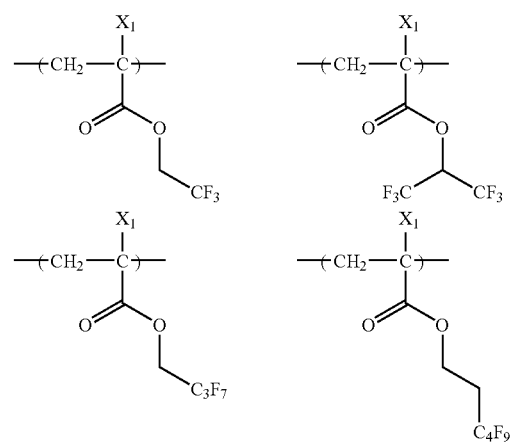

51
-continued
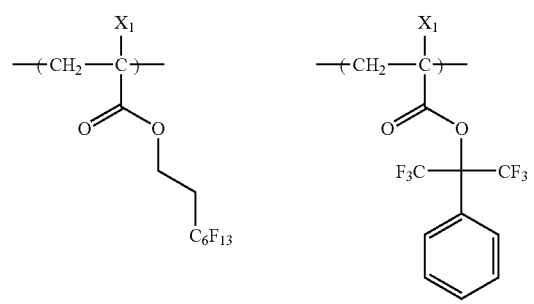
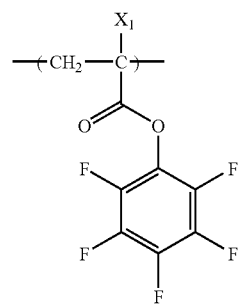
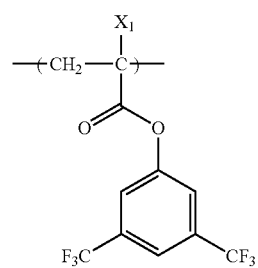
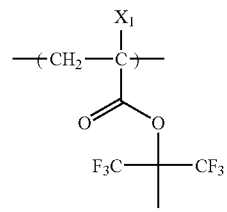
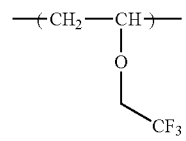
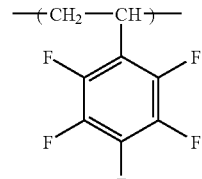
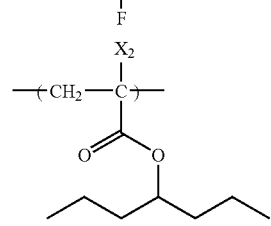
52
-continued
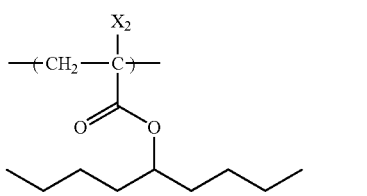
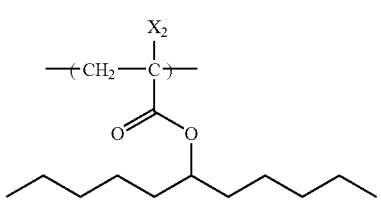
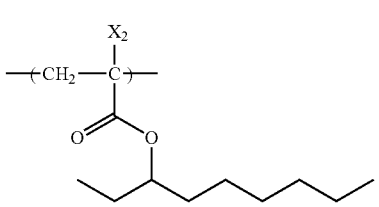
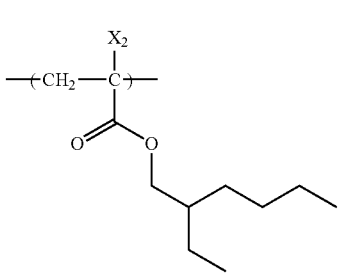
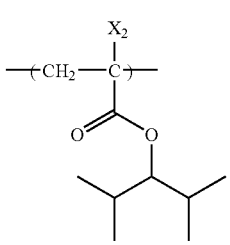
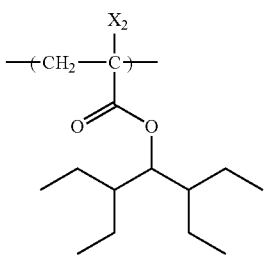
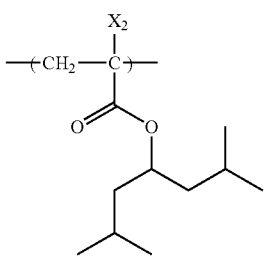

-continued

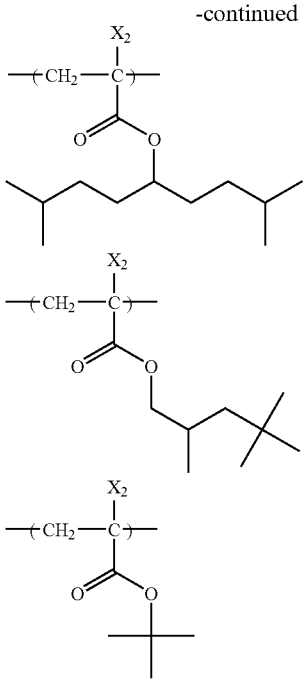

As the partial structure having a silicon atom, resin (HP) is preferably a resin having an alkylsilyl structure (preferably a trialkylsilyl group) or a cyclic siloxane structure.

As the specific examples of the alkylsilyl structure and the cyclic siloxane structure, the groups represented by any of the following formulae (CS-1) to (CS-3) are exemplified.

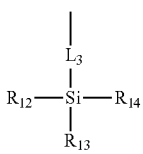
(CS-1)

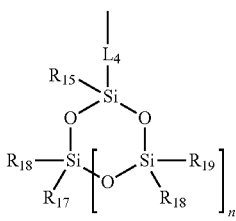
(CS-2)

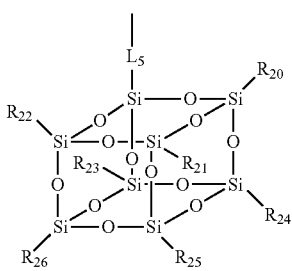
(CS-3)

In formulae (CS-1) to (CS-3), $R_{12}$ to $R_{26}$ each represents a straight chain or branched alkyl group (preferably having from 1 to 20 carbon atoms) or a cycloalkyl group (preferably having from 3 to 20 carbon atoms).

$L_3$ to $L_5$ each represents a single bond or a divalent linking group. As the examples of the divalent linking groups, a single group or a combination of two or more groups selected from the group consisting of an alkylene group, a phenyl group, an ether group, a thioether group, a carbonyl group, an ester group, an amido group, a urethane group, and a urea group are exemplified.

n represents an integer of from 1 to 5,

It is also preferred that resin (C) is a resin having at least one repeating unit selected from repeating units having a silicon atom represented by the following formula (c2-1) or (c2-2), stable to an acid, and insoluble in an alkali developing solution.

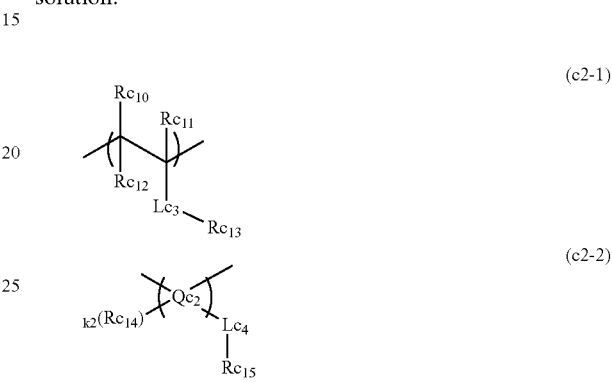

In formulae (c2-1) and (c2-2), $Rc_{10}$, $Rc_{11}$ and $Rc_{12}$, each represents a hydrogen atom, a halogen atom, an alkyl group, a cycloalkyl group, an alkoxyl group, or an alkoxycarbonyl group.

$Rc_{13}$ and $Rc_{15}$ each represents a monovalent organic group having at least one silicon atom.

$Rc_{14}$ represents a hydrogen atom, a halogen atom, a cyano group, or a monovalent organic group.

$Lc_3$ and $Lc_4$ each represents a single bond or a divalent linking group.

$Qc_2$ represents an alicyclic structure.

$k_2$ represents an integer of from 0 to 3.

It is also preferred that the repeating unit having a silicon atom represented by formula (c2-1) is a repeating unit represented by the following formula (cIII):

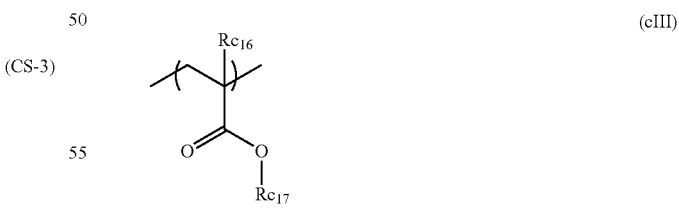

In formula (cIII), $Rc_{16}$ represents a hydrogen atom, a halogen atom, an alkyl group, a cycloalkyl group, an alkoxyl group, or an alkoxycarbonyl group.

$Rc_{17}$ represents a monovalent organic group having at least one silicon atom.

It is also preferred that the repeating unit having a silicon atom represented by formula (c2-1) is a repeating unit represented by the following formula (IV):

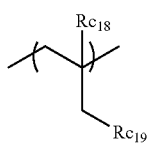
(IV)

In formula (IV), $Rc_{18}$ represents a hydrogen atom, a halogen atom, an alkyl group, a cycloalkyl group, an alkoxyl group, or an alkoxycarbonyl group.

$Rc_{19}$ represents a monovalent organic group having at least one silicon atom.

It is also preferred that the repeating unit having a silicon atom represented by formula (c2-1) is a repeating unit represented by the following formula (V):

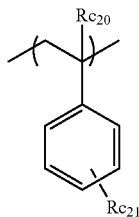
(V)

In formula (V), $Rc_{20}$ represents a hydrogen atom, a halogen atom, an alkyl group, a cycloalkyl group, an alkoxyl group, or an alkoxycarbonyl group.

$Rc_{21}$ represents a monovalent organic group having at least one silicon atom.

It is also preferred that the monovalent organic group having at least one silicon atom represented by $Rc_{13}$, $Rc_{15}$, $Rc_{17}$, $Rc_{19}$ and $Rc_{21}$ has a cyclic siloxane structure.

It is also preferred that the monovalent organic group having at least one silicon atom represented by $Rc_{13}$, $Rc_{15}$, $Rc_{17}$, $Rc_{19}$ and $Rc_{21}$ is a group represented by the following formula (VI).

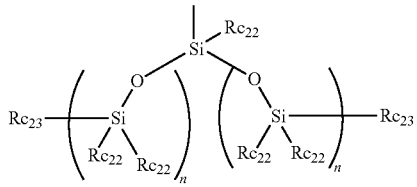
(VI)

In formula (VI), $Rc_{22}$ each represents a hydrogen atom, an alkyl group, or an alkoxyl group.

$Rc_{23}$ each represents a hydrogen atom, an alkyl group, or an alkoxyl group, provided that two $Rc_{23}$'s may be linked to each other to form a cyclic structure.

n represents an integer of from 0 to 5.

It is preferred that the monovalent organic group having at least one silicon atom represented by $Rc_{13}$, $Rc_{15}$, $Rc_{17}$, $Rc_{19}$ and $Rc_{21}$ contains from one to three silicon atoms.

It is preferred that the monovalent organic group having at least one silicon atom represented by $Rc_{13}$, $Rc_{15}$, $Rc_{17}$, $Rc_{19}$ and $Rc_{21}$ is a group represented by the following formula (S1):

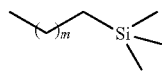
(S1)

In formula (S1), m represents an integer of from 0 to 20.

The specific examples of repeating units having a silicon atom are shown below. In the formulae, $X_1$ represents a hydrogen atom, $-CH_3$, $-F$ or $-CF_3$.

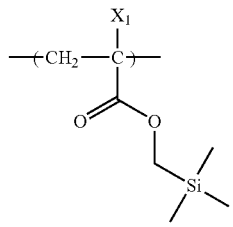
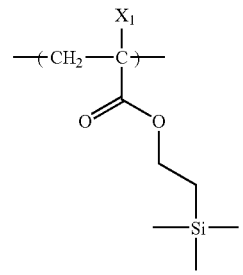
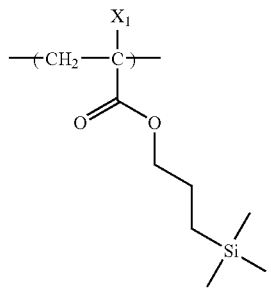
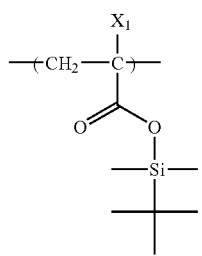
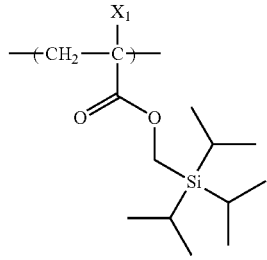
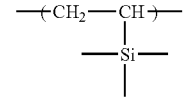
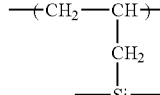
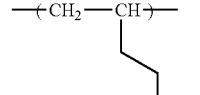
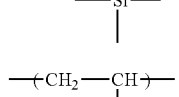
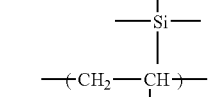
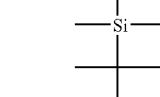
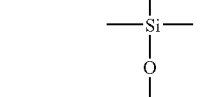

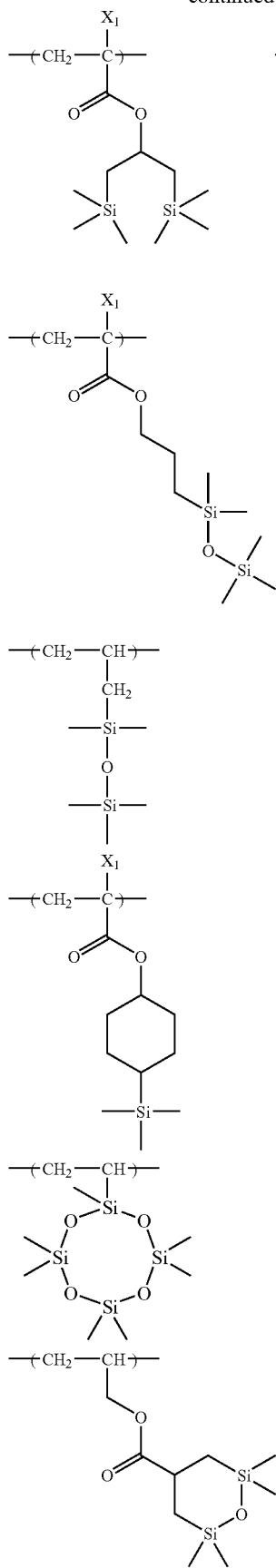

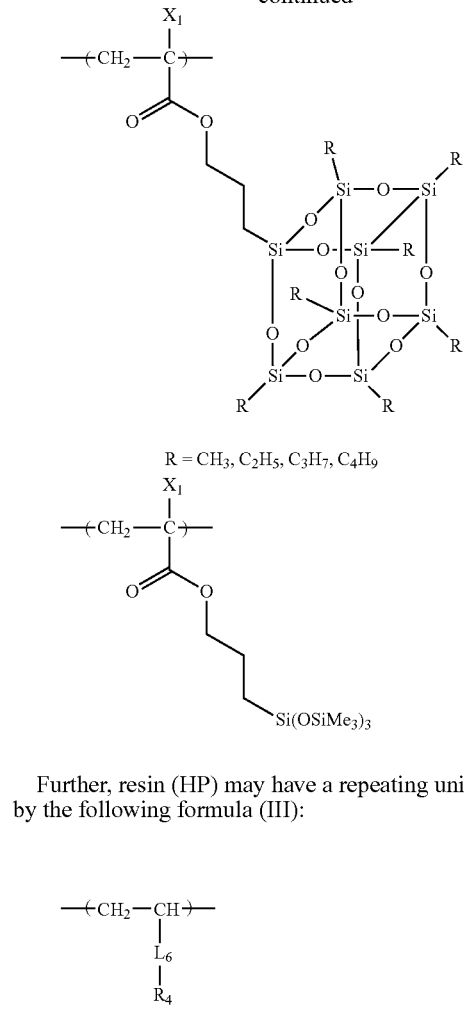

R = CH$_3$, C$_2$H$_5$, C$_3$H$_7$, C$_4$H$_9$

Further, resin (HP) may have a repeating unit represented by the following formula (III):

$$\text{---(CH}_2\text{---CH)---} \atop {\underset{R_4}{\overset{|}{L_6}}} \tag{III}$$

In formula (III), R$_4$ represents an alkyl group, a cycloalkyl group, an alkenyl group, or a cycloalkenyl group.

L$_6$ represents a single bond or a divalent linking group.

The alkyl group represented by R$_4$ in formula (III) is preferably a straight chain or branched alkyl group having from 3 to 20 carbon atoms.

The cycloalkyl group is preferably a cycloalkyl group having from 3 to 20 carbon atoms.

The alkenyl group is preferably an alkenyl group having from 3 to 20 carbon atoms.

The cycloalkenyl group is preferably a cycloalkenyl group having from 3 to 20 carbon atoms.

The divalent linking group represented by L$_6$ is preferably an alkylene group (preferably having from 1 to 5 carbon atoms), or an oxy group.

When resin (HP) has a fluorine atom, the content of the fluorine atom is preferably from 5 to 80 mass % to the molecular weight of resin (HP), more preferably from 10 to 80 mass %, and a repeating unit containing a fluorine atom is preferably from 10 to 100 mass % in resin (HP), and more preferably from 30 to 100 mass %.

The weight average molecular weight of the standard polystyrene equivalent of resin (HP) is preferably from 1,000 to 100,000, more preferably from 1,000 to 50,000, and still more preferably from 2,000 to 15,000.

Similarly to acid-decomposable resin (A), it is preferred that resin (HP) is as a matter of course little in impurities such as metals, and the amount of the residual monomers and oligomer components is preferably from 0 to 10 mass %, more preferably from 0 to 5 mass %, and still more preferably from 0 to 1 mass %, by which a resist free from foreign matters in the liquid and aging fluctuation of sensitivity can be obtained. Further, in view of resolution, a resist form, the sidewalls of a resist pattern and roughness, the molecular weight distribution (Mw/Mn, also referred to as the degree of dispersion) of resin (HP) is preferably from 1 to 5, more preferably from 1 to 3, and still more preferably from 1 to 2.

Various kinds of commercially available products can be used as resin (HP), or can be synthesized according to ordinary methods (e.g., radical polymerization). For instance, as ordinary methods, a batch polymerization method of dissolving a monomer and an initiator in a solvent and heating the solution to perform polymerization, and a dropping polymerization method of adding a solution of a monomer and an initiator to a heated solvent over 1 to 10 hours by dropping are exemplified, and the dropping polymerization method is preferred. As the reaction solvents, ethers, e.g., tetrahydrofuran, 1,4-dioxane, and diisopropyl ether, ketones, e.g., methyl ethyl ketone and methyl isobutyl ketone, ester solvents, e.g., ethyl acetate, amide solvents, e.g., dimethylformamide and dimethyacetamide, and the later-described solvents capable of dissolving the composition of the invention, e.g., propyelne glycol monomethyl ether acetate, propylene glycol monomethyl ether, and cyclohexanone are exemplified. It is more preferred to use the same solvent in polymerization as the solvent used in the resist composition of the invention, by which the generation of particles during preservation can be restrained.

It is preferred to perform polymerization reaction in the atmosphere of inert gas such as nitrogen or argon. Polymerization is initiated with commercially available radical polymerization initiators (e.g., azo initiators, peroxide and the like). As radical polymerization initiators, azo initiators are preferred, and azo initiators having an ester group, a cyano group, or a carboxyl group are preferred. As preferred initiators, azobisisobutyronitrile, azobis-dimethylvaleronitrile, dimethyl-2,2'-azobis(2-methyl-propionate), etc., are exemplified. The concentration of the reaction product is from 5 to 50 mass %, and preferably from 30 to 50 mass %. The reaction temperature is generally from 10 to 150° C., preferably from 30 to 120° C., and more preferably from 60 to 100° C.

After termination of the reaction, the reaction product is cooled to room temperature, and purified. Ordinary methods can be applied to purification, e.g., a method of liquid-liquid extraction of removing residual monomer and oligomer components by water washing and combining appropriate solvents, a method of purification in a state of solution, such as ultrafiltration of removing only residual monomers having a molecular weight lower than a specific molecular weight by extraction, a reprecipitation method of removing residual monomers by dropping a resin solution to a bad solvent to thereby solidify the resin in the bad solvent, and a method of purification in a solid state by washing filtered resin slurry with a bad solvent can be used. For example, the reaction solution is brought into contact with a hardly soluble or insoluble solvent (bad solvent) of the resin in an amount of 10 times or less the volume of the reaction solution, preferably from 10 to 5 times, whereby the resin is precipitated as a solid.

The solvents for use in precipitation or reprecipitation from a polymer solution precipitation or reprecipitation solvents) should be sufficient so long as they are bad solvents of the polymer, and according to the kind of the polymer the solvent can be used by arbitrarily selecting from hydrocarbons, halogenated hydrocarbons, nitro compounds, ethers, ketones, esters, carbonates, alcohols, carboxylic acids, water, and mixed solvents containing these solvents. Of these solvents, solvents containing at least alcohols (especially, methanol, etc.) or water are preferred as the precipitation or reprecipitation solvents.

The use amount of a precipitation or reprecipitation solvent can be arbitrarily selected taking efficiency and yield into consideration, but generally the amount is from 100 to 10,000 mass parts per 100 mass parts of the polymer solution, preferably from 200 to 2,000 mass parts, and more preferably from 300 to 1,000 mass parts.

The temperature in precipitation or reprecipitation can be arbitrarily selected taking efficiency and workability into consideration, but the temperature is generally from 0 to 50° C. or so, and preferably around room temperature (e.g., from 20 to 35° C. or so). Precipitation or reprecipitation can be carried out according to known methods such as a batch system and a continuous system with generally used mixers, e.g., a stirring tank.

A precipitated or reprecipitated polymer is generally subjected to ordinary solid-liquid separation such as filtration and centrifugation, and then drying, and offered to use. Filtration is performed with a filter resisting to solvents preferably under pressure. Drying is generally carried out under atmospheric pressure or reduced pressure (preferably under reduced pressure), at a temperature of from 30 to 100° C. or so, and preferably from 30 to 50° C. or so.

Incidentally, a resin may be dissolved in a solvent after once being precipitated and separated, and then may be brought into contact with a hardly soluble or insoluble solvent of the resin. That is, a method comprising the following processes can be used: after termination of the radical polymerization reaction, the polymer is brought into contact with a hardly soluble or insoluble solvent of the polymer to thereby precipitate a resin (process a), the resin is separated from the solution (process b), the resin is again dissolved in a solvent to prepare resin solution A (process c), a resin as a solid is precipitated by bringing resin solution A into contact with a hardly soluble or insoluble solvent of the resin in an amount of less than 10 times the volume of resin solution A (preferably 3 times or less) (process d), and the precipitated resin is separated (process e).

The specific examples of resin (C) are shown below. Further, in the following table, the molar ratio of repeating units (corresponding to each repeating unit from the left hand in order) in each resin, weight average molecular weight, and the degree of dispersion are shown.

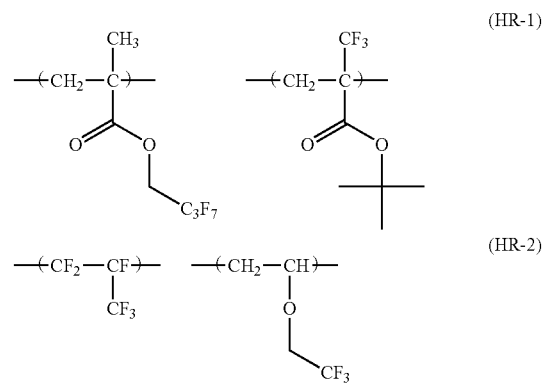

(HR-3) 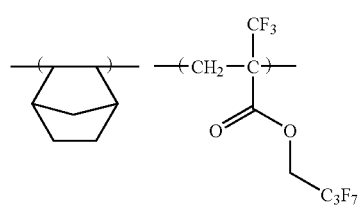
(HR-4) 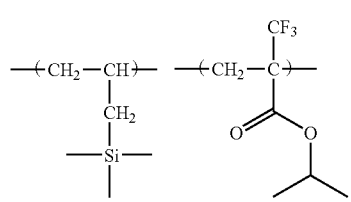
(HR-5) 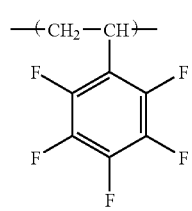
(HR-6) 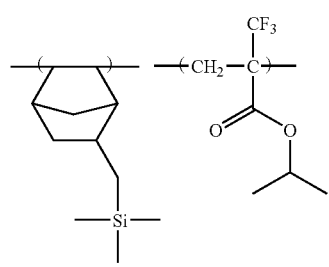
(HR-7) 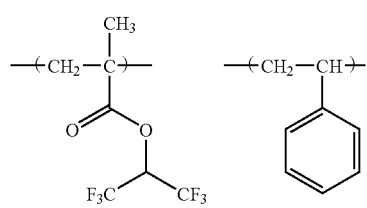
(HR-8) 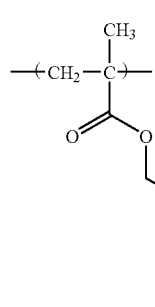 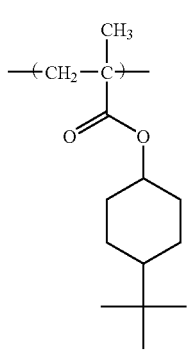
(HR-9) 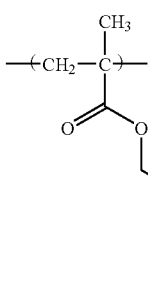 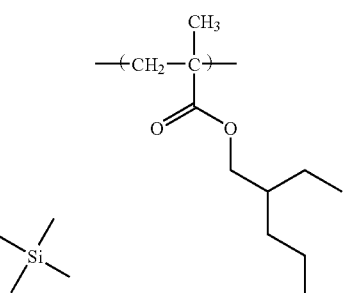
(HR-10) 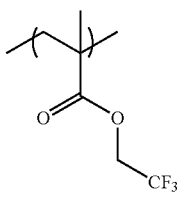 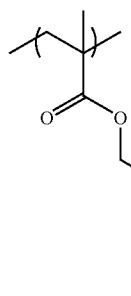
(HR-11) 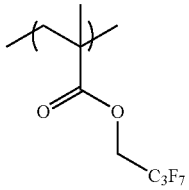 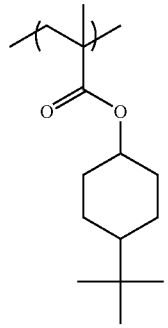
(HR-12) 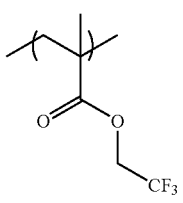 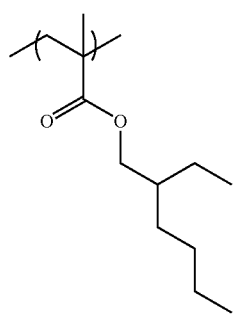
(HR-13) 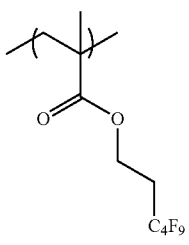 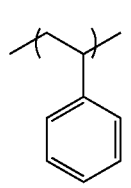

(HR-14) 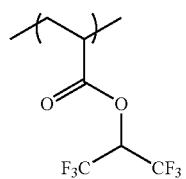
(HR-15) 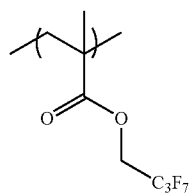
(HR-16) 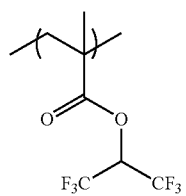
(HR-17) 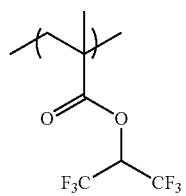
(HR-18) 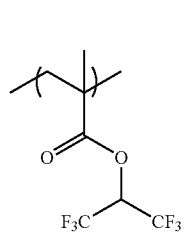 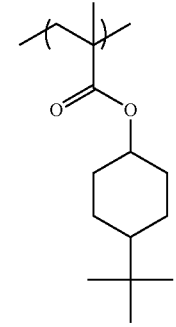
(HR-19) 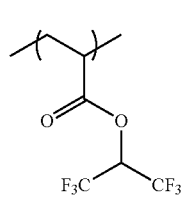
(HR-20) 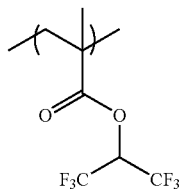 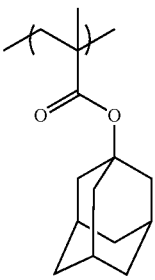
(HR-21) 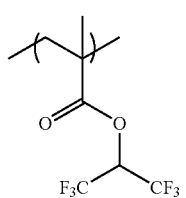 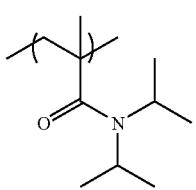
(HR-22) 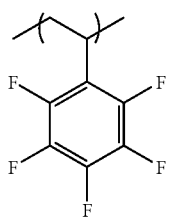 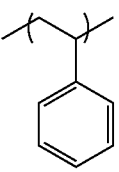
(HR-23) 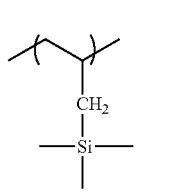 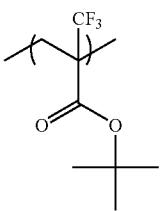
(HR-24) 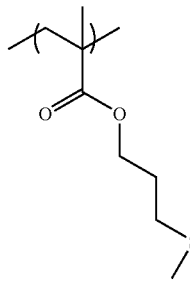 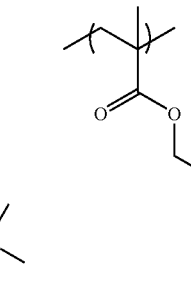
(HR-25) 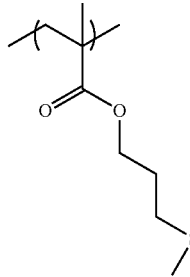

(HR-26)
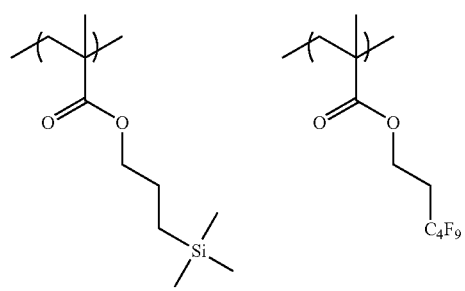
(HR-27)
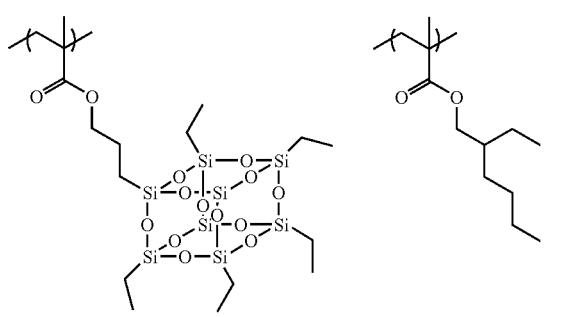
(HR-28)
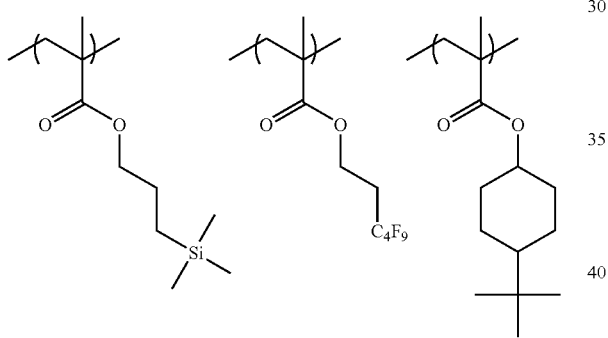
(HR-29)
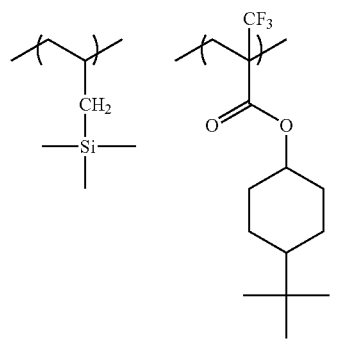
(HR-30)
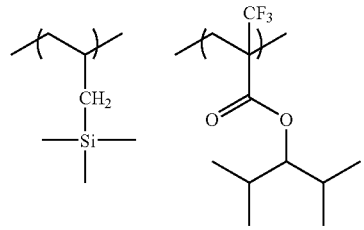
(HR-31)
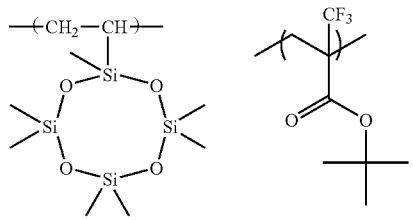
(HR-32)
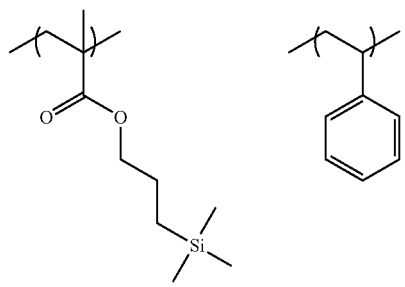
(HR-33)
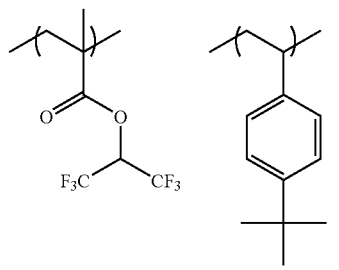
(HR-34)
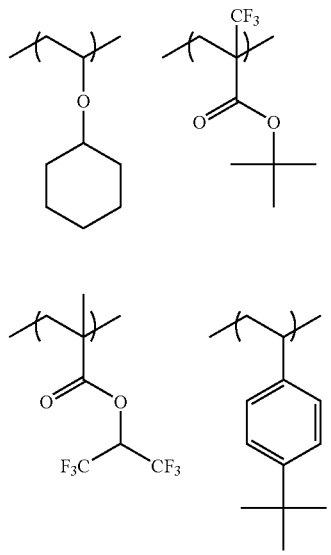
(HR-35)
(HR-36)
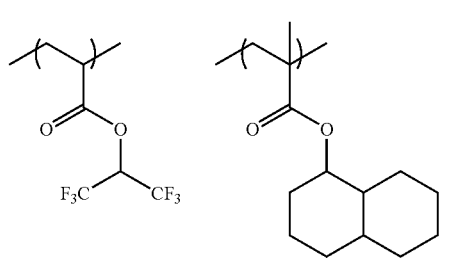

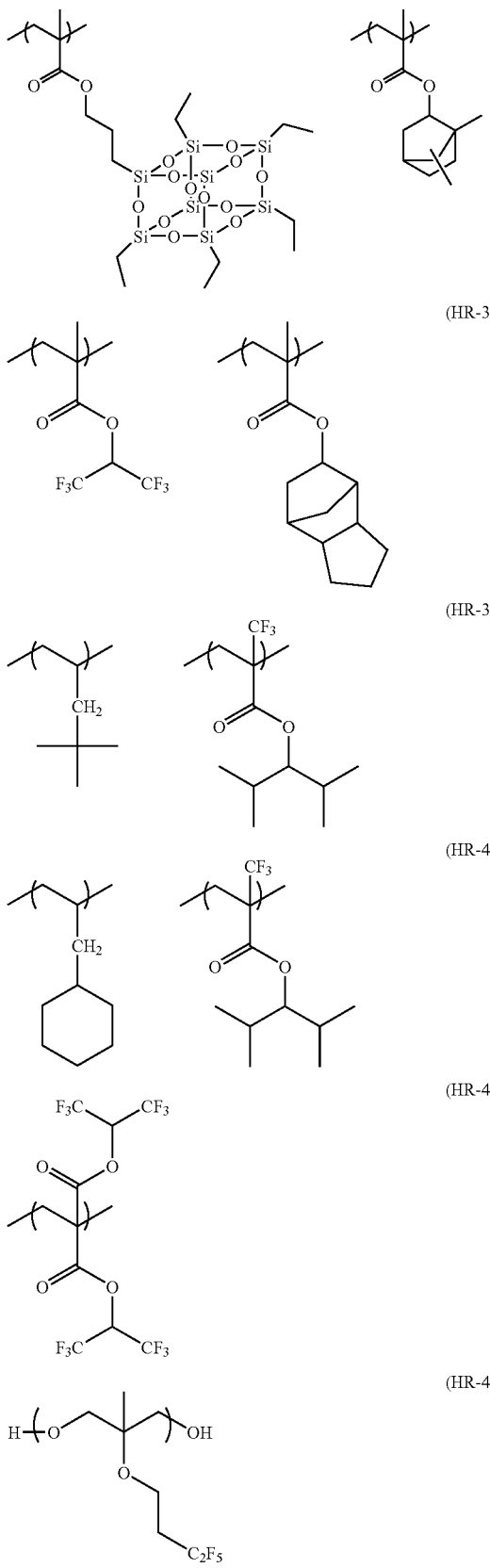

TABLE 1

| Resin | Composition | Mw | Mw/Mn |
|---|---|---|---|
| HR-1 | 50/50 | 8,800 | 2.1 |
| HR-2 | 50/50 | 5,200 | 1.8 |
| HR-3 | 50/50 | 4,800 | 1.9 |
| HR-4 | 50/50 | 6,300 | 1.9 |
| HR-5 | 100 | 5,500 | 2.0 |
| HR-6 | 50/50 | 7,500 | 1.9 |
| HR-7 | 70/30 | 10,200 | 2.2 |
| HR-8 | 40/60 | 15,000 | 2.2 |
| HR-9 | 80/20 | 11,000 | 2.2 |
| HR-10 | 50/50 | 8,000 | 2.2 |
| HR-11 | 50/50 | 7,600 | 2.0 |
| HR-12 | 50/50 | 12,000 | 2.0 |
| HR-13 | 20/80 | 6,500 | 1.8 |
| HR-14 | 100 | 6,500 | 1.2 |
| HR-15 | 100 | 6,000 | 1.6 |
| HR-16 | 100 | 2,000 | 1.6 |
| HR-17 | 50/50 | 6,000 | 1.7 |
| HR-18 | 50/50 | 8,800 | 1.9 |
| HR-19 | 50/50 | 7,800 | 2.0 |
| HR-20 | 80/20 | 8,000 | 1.8 |
| HR-21 | 30/70 | 7,000 | 1.7 |
| HR-22 | 50/50 | 6,500 | 1.6 |
| HR-23 | 50/50 | 6,500 | 1.6 |
| HR-24 | 50/50 | 9,000 | 1.8 |
| HR-25 | 100 | 10,000 | 1.6 |
| HR-26 | 70/30 | 8,000 | 2.0 |
| HR-27 | 10/90 | 8,000 | 1.8 |
| HR-28 | 30/30/40 | 9,000 | 2.0 |
| HR-29 | 50/50 | 6,000 | 1.4 |
| HR-30 | 50/50 | 5,500 | 1.5 |
| HR-31 | 50/50 | 4,800 | 1.8 |
| HR-32 | 50/50 | 10,600 | 1.9 |
| HR-33 | 50/50 | 8,000 | 1.5 |
| HR-34 | 20/80 | 7,500 | 1.8 |
| HR-35 | 50/50 | 6,200 | 1.6 |
| HR-36 | 60/40 | 16,000 | 1.8 |
| HR-37 | 80/20 | 10,200 | 1.8 |
| HR-38 | 50/50 | 12,000 | 2.6 |
| HR-39 | 50/50 | 6,000 | 1.4 |
| HR-40 | 50/50 | 4,500 | 1.4 |
| HR-41 | 100 | 2,300 | 2.6 |
| HR-42 | 100 | 15,000 | 2.1 |

A film that is hardly soluble in an immersion liquid (hereinafter also referred to as "topcoat") may be provided between a positive resist film comprising the positive resist composition of the invention and an immersion liquid so as to prevent the resist film from being in contact with the immersion liquid directly. The necessary functions required of a topcoat are aptitude for coating on the upper layer of a resist, the transparency to radiation, in particular, transparency to light of 193 nm, and the insolubility in an immersion liquid. It is preferred that a topcoat is not mixed with a resist and capable of being coated uniformly on a resist upper layer.

From the viewpoint of the transparency to 193 nm, polymers not containing aromatic groups in abundance are preferred as a topcoat. Specifically, hydrocarbon polymers, acrylic acid ester polymers, polymethacrylic acid, polyacrylic acid, polyvinyl ether, silicon-containing polymers and fluorine-containing polymers are exemplified. Hydrophobic resins (HP) are also preferably used as a topcoat. Considering that impurities eluting from a topcoat to an immersion liquid soil an optical lens, the residual monomer components of the polymer contained in a topcoat is preferably less.

When a topcoat is peeled, a developing solution may be used, or a remover may be used separately. As the remover, solvents low in osmosis into a resist film are preferred. In view of capable of performing peeling process at the same time with the development process of a resist film, peeling by an alkali developing solution is preferred. From the viewpoint of peeling by an alkali developing solution, a topcoat is preferably acidic, but from the point of non-intermixture with a resist film, a topcoat may be neutral or alkaline.

Resolution increases when there is no difference in the refractive indexes between a topcoat and an immersion liquid. When water is used as the immersion liquid in an ArF excimer laser (wavelength: 193 nm) exposure light source, it is preferred that the refractive index of the topcoat for ArF immersion exposure is preferably near the refractive index of the immersion liquid. For bringing the refractive index of the topcoat near to that of the immersion liquid, it is preferred for the topcoat to contain a fluorine atom. Further, from the viewpoint of the transparency and refractive index, the topcoat is preferably a thin film.

It is preferred that a topcoat should not be mixed with a resist film, and further not mixed with an immersion liquid. From this point of view, when water is used as the immersion liquid, the solvent for use in the topcoat is preferably a medium that is hardly soluble in the solvent used in the resist composition and non-water-soluble. Further, when the immersion liquid is an organic solvent, the topcoat may be water-soluble or non-water-soluble.

(D) Solvent:

For using the resist composition of the invention, the above components are dissolved in a prescribed solvent. As the solvents, e.g., alkylene glycol monoalkyl ether carboxylate, alkylene glycol monoalkyl ether, alkyl lactate, alkyl alkoxypropionate, cyclic lactone having from 4 to 10 carbon atoms, a monoketone compound having from 4 to 10 carbon atoms which may contain a ring, alkylene carbonate, alkyl alkoxy acetate, and alkyl pyruvate can be exemplified.

As the alkylene glycol monoalkyl ether carboxylate, e.g., propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate are preferably exemplified.

As the alkylene glycol monoalkyl ether, e.g., propylene glycol monomethyl ether, propylene glycol monoethyl ether, propylene glycol monopropyl ether, propylene glycol monobutyl ether, ethylene glycol monomethyl ether, and ethylene glycol monoethyl ether are preferably exemplified.

As the alkyl lactate, e.g., methyl lactate, ethyl lactate, propyl lactate, and butyl lactate are preferably exemplified.

As the alkyl alkoxypropionate, e.g., ethyl 3-ethoxy-propionate, methyl 3-methoxypropionate, methyl 3-ethoxy-propionate, and ethyl 3-methoxypropionate are preferably exemplified.

As the cyclic lactone having from 4 to 10 carbon atoms, e.g., β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone are preferably exemplified.

As the monoketone compound having from 4 to 10 carbon atoms which may contain a ring, e.g., 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonane, 3-nonane, 5-nonane, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclo-hexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methyl-cycloheptanone, and 3-methylcycloheptanone are preferably exemplified.

As the alkylene carbonate, e.g., propylene carbonate, vinylene carbonate, ethylene carbonate, and butylene carbonate are preferably exemplified.

As the alkyl alkoxy acetate, e.g., 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate are preferably exemplified.

As the alkyl pyruvate, e.g., methyl pyruvate, ethyl pyruvate, and propyl pyruvate are preferably exemplified.

Solvents having a boiling point of 130° C. or more under room temperature and atmospheric pressure are preferably used, and specifically cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate are exemplified.

In the invention, these solvents may be used alone or two or more solvents may be used in combination.

In the invention, a mixed solvent comprising a solvent containing a hydroxyl group in the structure and a solvent not containing a hydroxyl group in the structure may be used as an organic solvent.

As the solvent containing a hydroxyl group, ethylene glycol, ethylene glycol monomethyl ether, ethylene glycol monoethyl ether, propylene glycol, propylene glycol monomethyl ether, propylene glycol monoethyl ether, and ethyl lactate can be exemplified. Of these solvents, propylene glycol monomethyl ether and ethyl lactate are particularly preferred.

As the solvent not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide can be exemplified. Of these solvents, propylene glycol monomethyl ether acetate, ethylethoxy propionate, 2-heptanone, γ-butyrolactone, cyclohexanone, and butyl acetate are especially preferred, and propylene glycol monomethyl ether acetate, ethylethoxy propionate and 2-heptanone are most preferred.

In the invention, mixed solvents comprising two or more kinds including propylene glycol monomethyl ether acetate are preferred.

Further, mixed solvents comprising two or more kinds including ethyl lactate and propylene glycol monomethyl ether acetate are more preferred.

The mixing ratio (by mass) of the solvent containing a hydroxyl group and the solvent not containing a hydroxyl group is from 1/99 to 99/1, preferably from 10/90 to 90/10, and more preferably from 20/80 to 60/40. A mixed solvent comprising 50 mass % or more of a solvent not containing a hydroxyl group is especially preferred in the point of coating uniformity.

Basic Compound

For reducing the fluctuation of performances due to aging from exposure to heating, it is preferred for the positive resist composition of the invention to contain a basic compound.

As the basic compound, compounds having a structure represented be any of the following formulae (A) to (E) can be preferably exemplified.

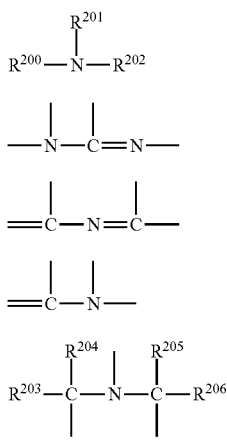

In formulae (A) to (E), $R^{200}$, $R^{201}$ and $R^{202}$, which may be the same or different, each represents a hydrogen atom, an alkyl group (preferably having from 1 to 20 carbon atoms), a cycloalkyl group (preferably having from 3 to 20 carbon atoms), or an aryl group (preferably having from 6 to 20 carbon atoms), and $R^{201}$ and $R^{202}$ may be bonded to each other to form a ring.

With respect to the alkyl group, as the alkyl group having a substituent, an aminoalkyl group having from 1 to 20 carbon atoms, a hydroxyalkyl group having from 1 to 20 carbon atoms, or a cyanoalkyl group having from 1 to 20 carbon atoms are preferred.

$R^{203}$, $R^{204}$, $R^{205}$ and $R^{206}$, which may be the same or different, each represents an alkyl group having from 1 to 20 carbon atoms.

These alkyl groups in formulae (A) to (E) are more preferably unsubstituted alkyl groups.

As preferred examples of basic compounds, guanidine, aminopyrrolidine, pyrazole, pyrazoline, piperazine, aminomorpholine, aminoalkylmorpholine, and piperidine can be exemplified. As more preferred compounds, compounds having an imidazole structure, a diazabicyclo structure, an onium hydroxide structure, an onium carboxylate structure, a trialkylamine structure, an aniline structure, or a pyridine structure, alkylamine derivatives having at least one of a hydroxyl group and an ether bond, and aniline derivatives having at least one of a hydroxyl group and an ether bond can be exemplified.

As the compounds having an imidazole structure, imidazole, 2,4,5-triphenylimidazole, benzimidazole, and 2-phenylbenzimidazole can be exemplified. As the compounds having a diazabicyclo structure, 1,4-diazabicyclo[2,2,2]-octane, 1,5-diazabicyclo[4,3,0]nona-5-ene, and 1,8-diazabicyclo[5,4,0]undeca-7-ene can be exemplified. As the compounds having an onium hydroxide structure, tetrabutyl ammonium hydroxide, triarylsulfonium hydroxide, phenacyl-sulfonium hydroxide, sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide, and 2-oxopropyl-thiophenium hydroxide can be exemplified. The compounds having an onium carboxylate structure are compounds having an onium hydroxide structure in which the anionic part is carboxylated, e.g., acetate, adamantane-1-carboxylate and perfluoroalkyl carboxylate are exemplified. As the compounds having a trialkylamine structure, tri(n-butyl)amine and tri(n-octyl)amine are exemplified. As the aniline compounds, 2,6-diisopropylaniline, N,N-dimethylaniline, N,N-dibutyl-aniline, and N,N-dihexylaniline are exemplified. As the alkylamine derivatives having at least one of a hydroxyl group and an ether bond, ethanolamine, diethanolamine, triethanol-amine, N-phenyldiethanolamine, and tris(methoxyethoxyethyl)-amine are exemplified. As the aniline derivatives having at least one of a hydroxyl group and an ether bond, N,N-bis-(hydroxyethyl)aniline is exemplified.

As preferred basic compounds, amine compounds having a phenoxy group, ammonium salt compounds having a phenoxy group, amine compounds having a sulfonate group, and ammonium salt compounds having a sulfonate group can further be exemplified.

As the amine compounds, primary, secondary and tertiary amine compounds can be used, and amine compounds wherein at least one alkyl group is bonded to a nitrogen atom are preferred. The amine compounds are more preferably tertiary amine compounds. In the amine compounds, so long as at least one alkyl group (preferably having from 1 to 20 carbon atoms) is bonded to a nitrogen atom, a cycloalkyl group (preferably having from 3 to 20 carbon atoms) or an aryl group (preferably having from 6 to 12 carbon atoms) may be bonded to a nitrogen atom besides the alkyl group. As the amine compounds, it is preferred that an oxyalkylene group be formed by the presence of an oxygen atom in the alkyl chain. The number of oxyalkylene group is 1 or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred.

As the ammonium salt compounds, primary, secondary, tertiary, and quaternary ammonium salt compounds can be used, and ammonium salt compounds wherein at least one alkyl group is bonded to a nitrogen atom are preferred. In the ammonium salt compounds, so long as at least one alkyl group preferably having from 1 to 20 carbon atoms) is bonded to a nitrogen atom, a cycloalkyl group (preferably having from 3 to 20 carbon atoms) or an aryl group (preferably having from 6 to 12 carbon atoms) may be bonded to a nitrogen atom besides the alkyl group. As the ammonium salt compounds, it is preferred that an oxyalkylene group be formed by the presence of an oxygen atom in the alkyl chain. The number of the oxyalkylene group is 1 or more in the molecule, preferably from 3 to 9, and more preferably from 4 to 6. Of the oxyalkylene groups, an oxyethylene group ($-CH_2CH_2O-$) or an oxypropylene group ($-CH(CH_3)CH_2O-$ or $-CH_2CH_2CH_2O-$) is preferred, and an oxyethylene group is more preferred. As the anions of the ammonium salt compounds, a halogen atom, sulfonate, borate and phosphate are exemplified, and a halogen atom and sulfonate are preferred of these anions. As the halogen atom, chloride, bromide, and iodide are especially preferred, and as the sulfonate, an organic sulfonate having from 1 to 20 carbon atoms is especially preferred. As the organic sulfonate, alkylsulfonate having from 1 to 20 carbon atoms and arylsulfonate are exemplified. The alkyl group of the alkylsulfonate may have a substituent, and as the examples of the substituents, fluorine, chlorine, bromine, an alkoxyl group, an acyl group, an aryl group, etc., are exemplified. As the alkylsulfonate, methanesulfonate, ethanesulfonate, butanesulfonate, hexanesulfonate, octane-sulfonate, benzylsulfonate, trifluoromethanesulfonate, pentafluoroethanesulfonate, nonafluorobutanesulfonate, etc., are specifically exemplified. As the aryl group of the arylsulfonate, a benzene ring, a naphthalene ring and an anthracene ring are exemplified. The benzene ring, naphthalene ring and anthracene ring may each have a substituent. As the examples of the substituents, a straight chain or branched alkyl group having from 1 to 6 carbon atoms and a cycloalkyl group having from 3 to 6 carbon atoms are preferred. As the straight chain or branched alkyl group and the cycloalkyl group, methyl, ethyl, n-propyl, isopropyl, n-butyl, i-butyl, t-butyl, n-hexyl, cyclohexyl, etc., are specifically exemplified. As other substituents, an alkoxyl group having from 1 to 6 carbon atoms, a halogen atom, a cyano group, a nitro group, an acyl group, an acyloxy group, etc., are exemplified.

The amine compounds having a phenoxy group and the ammonium salt compounds having a phenoxy group are amine compounds and ammonium salt compounds respectively having a phenoxy group on the terminals on the opposite side of the nitrogen atom of the alkyl group. The phenoxy groups may each have a substituent. As the substituents of the phenoxy groups, for example, an alkyl group, an alkoxyl group, a halogen atom, a cyano group, a nitro group, a carboxyl group, a carboxylate group, a sulfonate group, an aryl group, an aralkyl group, an acyloxy group, and an aryloxy group are exemplified. The substituting positions of the substituents may be any of 2- to 6-positions. The number of the substituents may be any of from 1 to 5.

It is preferred to have at least one oxyalkylene group between the phenoxy group and the nitrogen atom. The number of the oxyalkylene groups is 1 or more in the molecule, preferably from 3 to 9, and more preferably from 4 to 6. Of the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferred, and an oxyethylene group is more preferred.

The sulfonate groups in the amine compounds having a sulfonate group and the ammonium salt compounds having a sulfonate group may be any of alkylsulfonate, cycloalkylsulfonate and arylsulfonate. In the case of alkylsulfonate, the alkyl group preferably has from 1 to 20 carbon atoms, in the case of cycloalkylsulfonate, the cycloalkyl group preferably has from 3 to 20 carbon atoms, and in the case of arylsulfonate, the aryl group preferably has from 6 to 12 carbon atoms. These alkylsulfonate, cycloalkylsulfonate and arylsulfonate may each have a substituent. As the examples of the substituents, a halogen atom, a cyano group, a intro group, a carboxyl group, a carbonate group, and a sulfonate group are preferred.

It is preferred to have at least one oxyalkylene group between the sulfonate group and the nitrogen atom. The number of the oxyalkylene group is 1 or more in the molecule, preferably from 3 to 9, and more preferably from 4 to 6. Of the oxyalkylene groups, an oxyethylene group (—CH$_2$CH$_2$O—) or an oxypropylene group (—CH(CH$_3$)CH$_2$O— or CH$_2$CH$_2$CH$_2$O—) is preferred, and an oxyethylene group is more preferred.

These basic compounds are used alone, or two or more compounds are used together.

The use amount of the basic compound is generally from 0.001 to 10 mass % based on the solids content of the positive resist composition, and preferably from 0.01 to 5 mass %.

The proportion of the use amount of the acid generator and the basic compound in the composition is preferably acid generator/basic compound (in molar ratio) of from 2.5 to 300. That is, in view of sensitivity and resolution, a molar ratio of 2.5 or more is preferred, and in the light of restraining the reduction of resolution by fattening of a resist pattern due to aging from exposure to heating process, a molar ratio of 300 or less is preferred. The proportion of acid generator/basic compound (in molar ratio) is more preferably from 5.0 to 200, and still more preferably from 7.0 to 150.

(F) Surfactant:

It is preferred for the positive resist composition in the invention to further contain surfactant, and it is more preferred to contain either one or two or more of fluorine and/or silicon surfactants (a fluorine surfactant, a silicon surfactant, a surfactant containing both a fluorine atom and a silicon atom).

By containing these surfactant, it becomes possible for the positive resist composition in the invention to provide a resist pattern excellent in sensitivity and resolution, and low in defects in adhesion and development in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The commercially available surfactants shown below can also be used as they are.

As the commercially available fluorine or silicon surfactants that can be used in the invention, e.g., Eftop EF301 and EF303 (manufactured by Shin-Akita Kasei Co., Ltd.), Fluorad FC 430, 431 and 4430 (manufactured by Sumitomo 3M Limited), Megafac F171, F173, F176, F189, F113, F110, F177, F120, and R08 (manufactured by Dainippon Ink and Chemicals Inc.), Sarfron S-382, SC 101, 102, 103, 104, 105 and 106 (manufactured by ASAHI GLASS CO., LTD.), Troy Sol S-366 (manufactured by Troy Chemical Co., Ltd.), GF-300 and Gf-150 (manufactured by TOAGOSEI CO., LTD.), Sarfron S-393 (manufactured by SEIMI CHEMICAL CO., LTD.), Eftop EF121, EF122A, EF122B, EF122C, EF125M, EF135M, EF351, 352, EF801, EF802, and EF601 (manufactured by JEMCO INC.), PF636, PF656, PF6320 and PF6520 (manufactured by OMNOVA), and FTX-204D, 208G, 218G, 230G, 204D, 208D, 212D, 218, and 222D (manufactured by NEOS) are exemplified. In addition, polysiloxane polymer KP-341 (manufactured by Shin-Etsu Chemical Co., Ltd.) can also be used as a silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As the polymers having fluoro-aliphatic groups, copolymers of monomers having fluoro-aliphatic groups and at least one of (poly(oxyalkylene)) acrylate and (poly-(oxyalkylene)) methacrylate are preferred, and they may be distributed at random or may be block copolymerized. As the poly(oxyalkylene) groups, a poly(oxyethylene) group, a poly(oxypropylene) group, and a poly(oxybutylene) group are exemplified. The polymers may be units having alkylenes different in chain length in the same chain length, such as a block combination of poly(oxyethylene and oxypropylene and oxyethylene), and a block combination of poly(oxyethylene and oxypropylene). In addition, the copolymers of monomers having fluoro-aliphatic groups and poly(oxyalkylene) acrylate (or methacrylate) may be not only bipolymers but also terpolymers or higher polymers obtained by copolymerization of monomers having different two or more kinds of fluoro-aliphatic groups or different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and poly(oxyalkylene) acrylate (or methacrylate), and copolymers of acrylate (or methacrylate) having a $C_3F_7$ group, poly(oxyethylene) acrylate (or methacrylate), and poly(oxy-propylene) acrylate (or methacrylate) can be exemplified.

In the invention, surfactants other than fluorine and/or silicon surfactants can also be used. Specifically, nonionic surfactants, such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkylallyl ether, e.g., polyoxyethylene octylphenol ether, polyoxyethylene nonylphenol ether, etc., polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., and polyoxy-ethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc., can be exemplified.

These surfactants may be used by one kind alone, or may be used in combination of some kinds.

The use amount of surfactants is preferably in the proportion of from 0.0001 to 2 mass % based on all the amount of the positive resist composition (excluding solvents), and more preferably from 0.001 to 1 mass %.

(G) Alkali-Soluble Resin:

The positive resist composition of the invention can further contain resin (G) not containing an acid-decomposable group, insoluble in water and soluble in an alkali developing solution, by which sensitivity is improved.

Novolak resins having a molecular weight of from 1,000 to 20,000 or so, and polyhydroxystyrene derivatives having a molecular weight of from 3,000 to 50,000 or so can be used as such alkali-soluble resins. Since these resins are great in absorption of rays of 250 nm or less, it is preferred to use these resins by partially hydrogenating or in an amount of 30 mass % or less of the total resin amount.

Resins containing, as an alkali-soluble group, a carboxyl group can also be used. For the purpose of improving dry etching resistance, it is preferred for the resins containing a carboxyl group to have a monocyclic or polycyclic alicyclic hydrocarbon group. Specifically, copolymers of methacrylic acid ester having an alicyclic hydrocarbon structure not showing an acid-decomposing property and (meth)acrylic acid, and resins of (meth)acrylic acid ester of alicyclic hydrocarbon group having carboxyl groups at terminals are exemplified.

(H) Carboxylic Acid Onium Salt:

The positive resist composition of the invention may contain carboxylic acid onium salt (H). As the carboxylic acid onium salt, carboxylic acid sulfonium salt, carboxylic acid iodonium salt, carboxylic acid ammonium salt, etc., can be exemplified. As carboxylic acid onium salt (H), iodonium salt and sulfonium salt are especially preferred. It is preferred that the carboxylate residue of carboxylic acid onium salt (H) of the invention does not contain an aromatic group and a carbon-carbon double bond. An especially preferred anion moiety is a straight chain or branched, monocyclic or polycyclic alkylcarboxylate anion having from 1 to 30 carbon atoms, and the carboxylate anion in which a part or all of the alkyl groups are substituted with fluorine atoms is more preferred. An oxygen atom may be contained in the alkyl chain, by which the transparency to the lights of 220 nm or less is ensured, sensitivity and resolution are enhanced, and pitch dependency and exposure margin are improved.

As fluorine-substituted carboxylate anions, anions such as fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, 2,2-bistrifluoromethylpropionic acid, etc., are exemplified.

These carboxylic acid onium salts (H) can be synthesized by reacting sulfonium hydroxide, iodonium hydroxide, or ammonium hydroxide and carboxylic acid with silver oxide in an appropriate solvent.

The content of carboxylic acid onium salt (H) in a composition is generally from 0.1 to 20 mass % to all the solids content of the composition, preferably from 0.5 to 10 mass %, and more preferably from 1 to 7 mass %.

Other Additives:

The positive resist composition of the invention may further contain, if necessary, dyes, plasticizers, light-sensitizers, light absorbers, and compounds for accelerating solubility in a developing solution (e.g., phenolic compounds having a molecular weight of 1,000 or less, alicyclic or aliphatic compounds having a carboxyl group).

Such phenolic compounds having a molecular weight of 1,000 or less can be easily synthesized with referring to the methods disclosed, e.g., in JP-A-4-122938, JP-A-2-8531, U.S. Pat. No. 4,916,210, and EP 219,294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, cyclohexanedicarboxylic acid, etc., are exemplified, but the invention is not limited to these compounds.

Physical Properties of the Resist Composition:

From the improvement of resolution, the positive resist composition of the invention is preferably used in a film thickness of from 30 to 250 nm, and more preferably from 30 to 200 nm of film thickness. Such a film thickness can be obtained by setting the concentration of solids content in the positive resist composition in a proper range having appropriate viscosity to thereby improve a coating property and a film-forming property.

The concentration of all the solids content in the positive resist composition is generally from 1 to 10 mass %, more preferably from 1 to 8 mass %, and still more preferably from 1.0 to 7.0 mass %.

Pattern-Forming Method:

The positive resist composition in the invention is used by dissolving the above components in a prescribed organic solvent, preferably in a mixed solvent as described above, filtering the resulting solution through a filter, and coating the solution on a prescribed support as follows. Filters for filtration are preferably made of polytetrafluoroethylene, polyethylene or nylon having a pore diameter of preferably 0.1 µm or less, more preferably 0.05 µm or less, and still more preferably 0.03 µm or less.

For example, a positive resist composition is coated on a substrate such as the one used in the manufacture of precision integrated circuit devices (e.g., silicon/silicon dioxide coating) by an appropriate coating method with a spinner or a coater and dried to form a photosensitive film.

The photosensitive film is then irradiated with actinic ray or radiation through a prescribed mask, and the exposed film is preferably subjected to baking (heating), and then development and rinsing, whereby a good pattern can be obtained.

As actinic rays or radiation, infrared rays, visible rays, ultraviolet rays, far ultraviolet rays, X-rays and electron beams can be exemplified, preferably far ultraviolet rays of wavelengths of 250 nm or less, and more preferably 220 nm or less. Specifically, a KrF excimer laser (248 nm), an ArF excimer laser (193 nm), an $F_2$ excimer laser (157 nm), X-rays and electron beams are exemplified, and preferably rays having wavelengths of from 1 to 200 nm, in particular, an ArF excimer laser, an $F_2$ excimer laser, EUV (13 nm), and electron beams are preferably used.

In a development process, an alkali developing solution is used as follows. As the alkali developing solution of a resist composition, alkali aqueous solutions of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, din-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

An appropriate amount of alcohols and surfactants may be added to these alkali developing solutions.

The alkali concentration of the alkali developing solutions is generally from 0.1 to 20 mass %.

The pH of the alkali developing solutions is generally from 10.0 to 15.0.

Further, an appropriate amount of alcohols and surfactants may be added to the alkali aqueous solution.

Pure water can also be used as a rinsing liquid and an appropriate amount of surfactant may be added to the rinsing liquid.

After development process or rinsing process, a process to remove the developing solution or rinsing liquid on the pattern can be performed with a supercritical fluid.

At the time of irradiation with actinic ray or radiation, exposure (immersion exposure) may be performed by filling a liquid (an immersion medium) having higher refractive index than that of air between a resist film and a lens, by which resolution can be raised. As the immersion medium, any liquids can be used so long as they are liquids higher in refractive index than air, but pure water is preferred. An overcoat layer may further be provided on a photosensitive film so that an immersion medium is not directly in contact with the photosensitive film in performing immersion exposure, by which the elution of the composition from the photosensitive film to the immersion medium is restrained and development defect can be reduced.

An immersion liquid for use in immersion exposure is described below,

An immersion liquid having a temperature coefficient of refractive index as small as possible is preferred so as to be transparent to the exposure wavelength and to hold the distortion of optical image reflected on the resist to the minimum. In particular, when the exposure light source is an ArF excimer laser (wavelength: 193 nm), it is preferred to use water as the immersion liquid for easiness of availability and easy handling property, in addition to the above points.

Further, in view of the improvement of refractive index, a medium having a refractive index of 1.5 or more can also be used, e.g., an aqueous solution and an organic solvent can be used as the medium.

When water is used as an immersion liquid, to reduce the surface tension of water and to increase the surface activity, a trace amount of additive (a liquid) that does not dissolve the resist layer on a wafer and has a negligible influence on the optical coating of the lower surface of a lens may be added. As the additive, aliphatic alcohols having a refractive index almost equal to the refractive index of water are preferred, specifically methyl alcohol, ethyl alcohol and isopropyl alcohol are exemplified. By the addition of an alcohol having a refractive index almost equal to that of water, even if the alcohol component in water is evaporated and the concentration of the content is changed, the fluctuation of the refractive index of the liquid as a whole can be made extremely small. On the other hand, when substances opaque to the light of 193 nm or impurities largely different from water in a refractive index are mixed, these substances bring about the distortion of the optical image reflected on the resist. Accordingly, the water used is preferably distilled water. Further, pure water filtered through an ion exchange filter may be used.

The electric resistance of water is preferably 18.3 MΩ·cm or higher, and TOC (organic substance concentration) is preferably 20 ppb or lower. Further, it is preferred that water has been subjected to deaeration treatment.

It is possible to heighten lithographic performance by increasing the refractive index of an immersion liquid. From such a point of view, additives capable of heightening a refractive index may be added to water, or heavy water ($D_2O$) may be used in place of water.

Example 1

The invention will be described in detail with reference to examples, but the invention should not be construed as being restricted thereto.

Synthesis Example

Synthesis of Resin (C)

Heptafluorobutyl methacrylate and t-butyl 2-trifluoromethylacrylate in the proportion of 50/50 (molar ratio) are put in a reaction vessel and dissolved in cyclohexanone to prepare 450 g of a solution having the concentration of solids content of 22%. To the solution is added 5 mol % of a polymerization initiator V-601 (manufactured by Wako Pure Chemical Industries Ltd.), and, in the nitrogen atmosphere, the solution is dropped to 50 ml of cyclohexanone heated at 80° C. over 2 hours. After completion of dropping, the reaction solution is stirred for 2 hours to obtain reaction solution (HR-1). After termination of the reaction, reaction solution (HR-1) is cooled to room temperature, crystallized with ten times the amount of methanol, the precipitated white powder is filtered and the objective resin (HR-1) is recovered.

The polymer composition ratio found from $^1$H NMR is 50/50 (molar ratio). The weight average molecular weight as the standard polystyrene equivalent found by the GPC measurement is 8,800, and the degree of dispersion is 2.1.

Each of other resins (C) is manufactured in the same manner.

Synthesis of Resin (A)

2-Ethyl-2-adamantyl methacrylate (0.4 mol), 0.4 mol of α-(γ-butyrolactone) methacrylate, and 0.2 mol of 3-hydroxy-1-adamantyl methacrylate are dissolved in 600 ml of cyclopentanone, and 0.1 mol of AIBN is added thereto and dissolved. The obtained solution is heated at 65 to 70° C. for 3 hours. The obtained reaction solution is poured into 3 liters of well-stirred isopropanol, and the precipitated solid is separated by filtration. The obtained solid is dissolved in 600 ml of THF, poured into 3 liters of well-stirred methanol, the precipitated solid is separated by filtration and dried to obtain the following shown resin 1.

Resins 2 to 10 are synthesized in the same manner. The structures, composition ratios, weight average molecular weights (Mw), and the degrees of dispersion (Mw/Mn) of the resins are shown below.

1

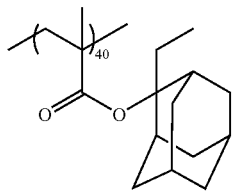 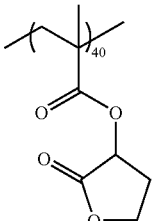 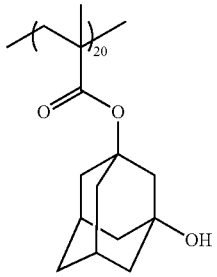

Mw = 10700
Mw/Mn = 1.81

2

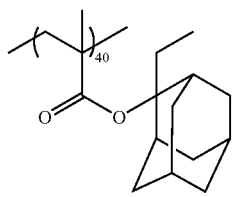 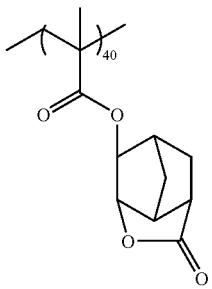 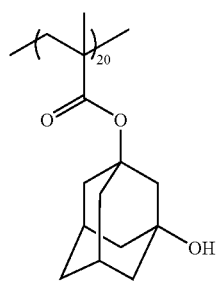

Mw = 9800
Mw/Mn = 1.73

3

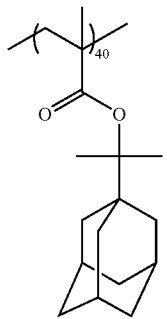 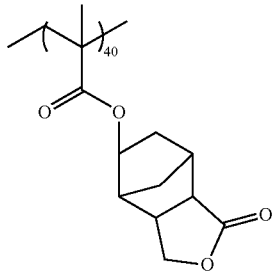 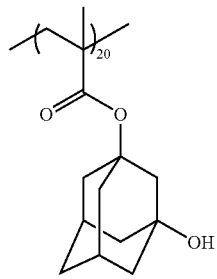

Mw = 8600
Mw/Mn = 1.82

4

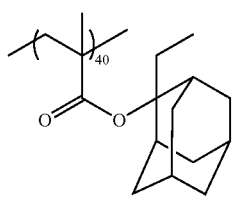 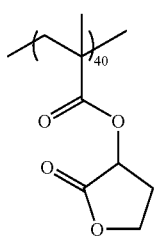 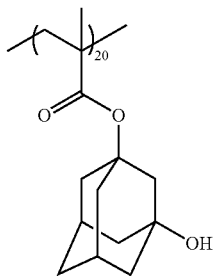

Mw = 7800
Mw/Mn = 1.79

5
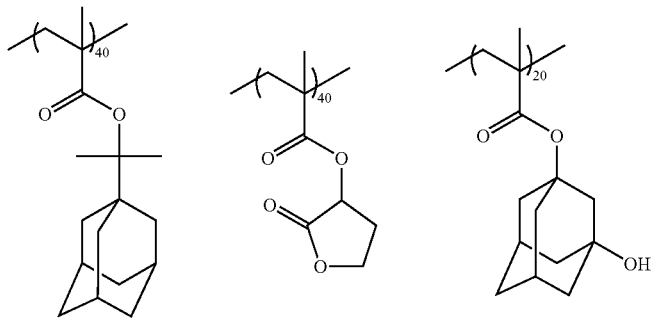
Mw = 8900
Mw/Mn = 1.71
6
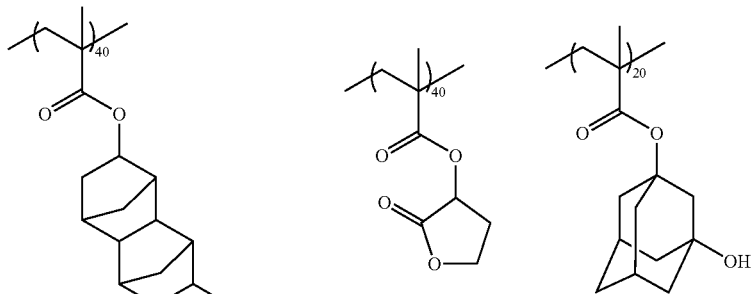
Mw = 9200
Mw/Mn = 1.89
7
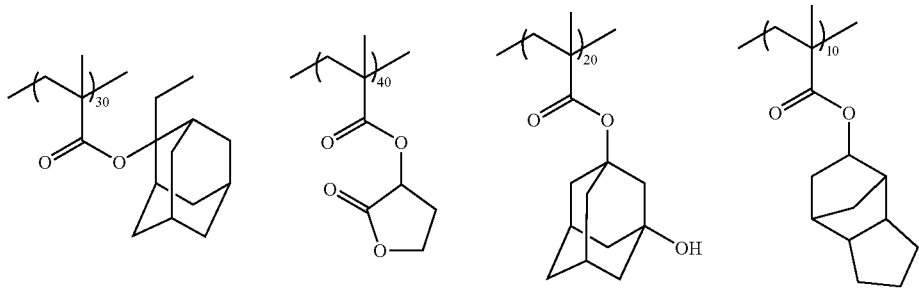
Mw = 9100
Mw/Mn = 1.91
8
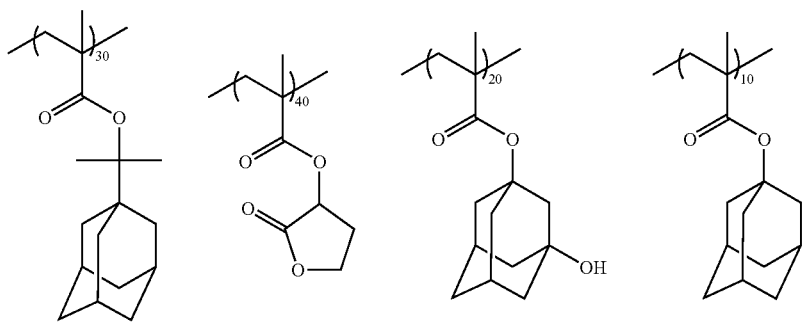
Mw = 8900
Mw/Mn = 1.72

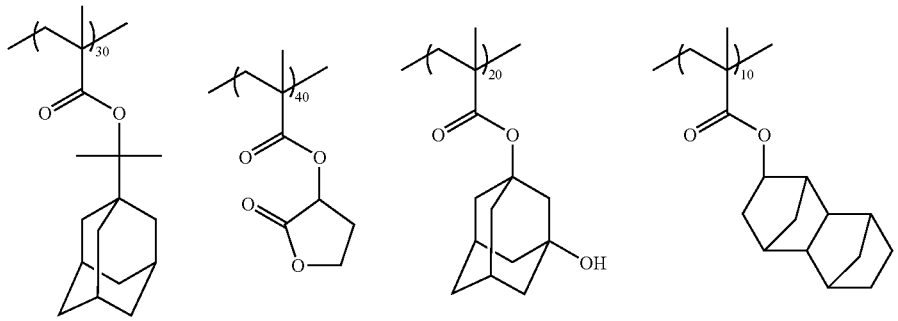

Mw = 7100
Mw/Mn = 1.88

9

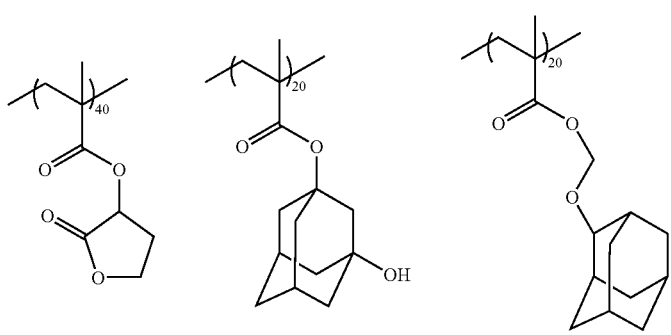

Mw = 8600
Mw/Mn = 1.81

10

Preparation of Resist:

The components of each sample are dissolved in the solvent each shown in Table 2 below to prepare a solution having the concentration of solids content of 7 mass %, and the solution is filtered through a polyethylene filter having a pore diameter of 0.1 μm to prepare a positive resist solution. The prepared positive resist solution is evaluated by the following methods. The results obtained are shown in Table 2. In connection with each component in Table 2, when two or more components are used, the ratio is shown in mass ratio.

Evaluation of Exposure: Water Mark

An organic antireflection film ARC29A (manufactured by Nissan Chemical Industries, Ltd.) is coated on a silicon wafer, and baked at 205° C. for 60 seconds to form an antireflection film having a thickness of 78 nm. The prepared positive resist composition is coated thereon, and baked at 110° C. for 60 seconds to form a resist film having a thickness of 150 nm. The obtained wafer is subjected to pattern exposure with an ArF excimer laser immersion scanner (NA: 0.85, scanning speed: 500 mm/s). As the immersion liquid, super pure water is used. Subsequently, the wafer is baked at 110° C. for 60 seconds, and then subjected to development with a tetramethylammonium hydroxide aqueous solution (2.38 mass %) for 30 seconds, rinsing with pure water, and spin drying to obtain a resist pattern. After that, the distribution of defects is detected with KLA 2360 (manufactured by KLA Tencor Corporation), and the shape of defect is observed with SEMVision (manufactured by AMAT).

A circular defect having a diameter of from 1 to 5 μm or so as shown in FIGURE is taken as water mark defect, and the number of the defects on the wafer in a length of 300 mm is counted.

Evaluation of Exposure: Film Decrease Margin

An organic antireflection film ARC29A (manufactured by Nissan Chemical Industries, Ltd.) is coated on a silicon wafer, and baked at 205° C. for 60 seconds to form an antireflection film having a thickness of 78 nm. The prepared positive resist composition is coated thereon, and baked at 110° C. for 60 seconds to form a resist film having a thickness of 150 nm. The obtained wafer is subjected to pattern exposure with an ArF excimer laser immersion scanner (NA: 0.85). As the immersion liquid, super pure water is used. Subsequently, the wafer is baked at 110° C. for 60 seconds, and then subjected to development with a tetramethylammonium hydroxide aqueous solution (2.38 mass %) for 30 seconds, rinsing with pure water, and spin drying to obtain a resist pattern. At this time, exposure quantity resolving 75 nm L/S (line and space) pattern in 1/1 (Eo) and exposure quantity by which the film begins to be dissolved and the rectangular shape of the pattern head is impaired by over exposure (ELoss) are found, and film decrease margin (over exposure margin) is computed according to the following expression.

Film decrease margin (%) = $(ELoss - Eo)/Eo \times 100$

TABLE 2

| Example No. | (A) Resin (2 g) | (B) Acid Generator (mg) | (C) Resin (mg) | (D) Solvent (mass ratio) | Basic Compound (mg) | Surfactant (mg) | Water Mark Defect (number) | Film Decrease Margin |
|---|---|---|---|---|---|---|---|---|
| Example 1 | 1 | z2 (80) | HR-1 (10) | SL-1/SL-2 (60/40) | N-7 (7) | W-1 (3) | 4 | 6 |
| Example 2 | 2 | z51 (100) | HR-2 (6) | SL-2/SL-3 (60/40) | N-1 (6) | W-1 (3) | 6 | 4 |
| Example 3 | 3 | z2/z62 (20/100) | HR-4 (12) | SL-2/SL-3 (50/50) | N-2 (4) | W-1 (4) | 5 | 5 |
| Example 4 | 4 | z55/z65 (20/100) | HR-7 (13) | SL-2/SL-4 (60/40) | N-3 (8) | W-2 (4) | 4 | 5 |
| Example 5 | 5 | z55/z51 (20/80) | HR-9 (8) | SL-2/SL-4 (50/50) | N-7 (6) | W-3 (4) | 5 | 6 |
| Example 6 | 6 | z44/z65 (25/80) | HR-11 (10) | SL-2/SL-4/SL-5 (50/45/5) | N-6 (7) | W-4 (4) | 1 | 5 |
| Example 7 | 7 | z55/z47 (30/80) | HR-19 (18) | SL-2/SL-3 (50/50) | N-4 (8) | — | 6 | 4 |
| Example 8 | 8 | z55 (100) | HR-20 (14) | SL-2/SL-4/SL-6 (50/45/5) | N-7 (9) | W-5 (4) | 4 | 4 |
| Example 9 | 9 | z44/z65 (50/50) | HR-23 (11) | SL-2/SL-3 (70/30) | N-3 (10) | W-6 (4) | 4 | 5 |
| Example 10 | 10 | z59 (100) | HR-25 (5) | SL-2/SL-4 (60/40) | N-7 (8) | W-1 (4) | 2 | 6 |
| Example 11 | 1 | z55/z65 (40/60) | HR-26 (9) | SL-2/SL-4 (70/30) | N-7 (7) | W-6 (4) | 4 | 5 |
| Example 12 | 2 | z55/z64 (20/80) | HR-30 (8) | SL-2/SL-3 (80/20) | N-6 (9) | W-6 (5) | 0 | 4 |
| Example 13 | 3 | z47 (110) | HR-33 (9) | SL-2/SL-3 (50/50) | N-7 (5) | W-6 (6) | 2 | 5 |
| Example 14 | 4 | z62 (120) | HR-35 (11) | SL-2/SL-4 (80/20) | N-7 (5) | W-6 (7) | 4 | 6 |
| Example 15 | 5 | z55/z51 (40/60) | HR-39 (14) | SL-2/SL-3/SL-4 (60/20/20) | N-7 (6) | W-6 (8) | 6 | 5 |
| Example 16 | 6 | z65/z29 (100/10) | HR-40 (14) | SL-2/SL-4 (80/20) | N-7 (6) | W-6 (9) | 1 | 6 |
| Example 17 | 7 | z66 (100) | HR-13 (7) | SL-2/SL-3/SL-4 (60/20/20) | N-4 (8) | W-1 (2) | 2 | 4 |
| Example 18 | 8 | z16 (90) | HR-23 (9) | SL-2/SL-4 (80/20) | N-7 (9) | W-1 (4) | 4 | 5 |
| Example 19 | 9 | z55 (80) | HR-22 (18) | SL-2/SL-3 (50/50) | N-3 (10) | W-1 (4) | 6 | 6 |
| Example 20 | 10 | z55/z57 (60/40) | HR-31 (9) | SL-2/SL-3 (50/50) | N-7 (8) | W-1 (4) | 6 | 5 |
| Example 21 | 1 | z2 (80) | HR-2 (8) | SL-1/SL-2 (60/40) | N-7 (7) | W-1 (3) | 5 | 5 |
| Example 22 | 2 | z55 (80) | HR-9 (10) | SL-2/SL-3 (50/50) | N-3 (10) | W-1 (4) | 6 | 5 |

The signs in Table 2 are as follows.
Acid generators are corresponding to those shown above.
N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
N-7: Triethanolamine
W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)
W-5: PF656 (fluorine surfactant, manufactured by OMNOVA)
W-6: PF6320 (fluorine surfactant, manufactured by OMNOVA)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate According to the invention, a positive resist composition capable of restraining the occurrence of water marks at the time of immersion exposure and a pattern-forming method using the same can be provided. Further, the positive resist composition of the invention can reduce the decrease of film thickness at the time of immersion exposure.

What is claimed is:

1. A positive resist composition comprising:
(A) a resin capable of increasing the solubility in an alkali developing solution by the action of an acid, comprising:
(a1) a repeating unit represented by the following formula (a1-3);
(a2) a repeating unit represented by a following formula (a2); and
(a3) a repeating unit selected from repeating units represented by following formulae (a3-1) to (a3-4);
(B) a compound capable of generating an acid upon irradiation with actinic ray or radiation;
(C) a resin having at least one of a fluorine atom and a silicon atom, said resin being stable to an acid, not containing a group increasing in solubility in an alkali developing solution, and being insoluble in an alkali developing solution; and
(D) a solvent:

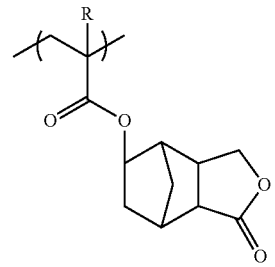

(a1-3)

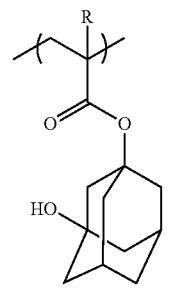

(a2)

-continued

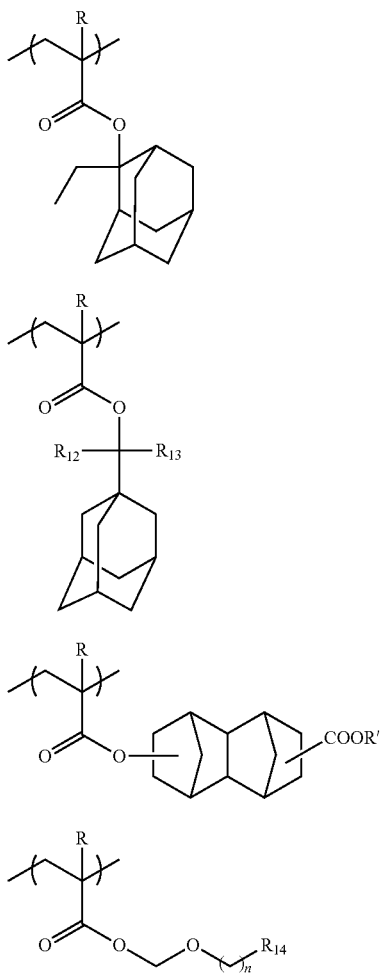

(a3-1)

(a3-2)

(a3-3)

(a3-4)

wherein

R represents a hydrogen atom, a halogen atom, or an alkyl group;

R' represents a group capable of leaving by the action of an acid;

each of $R_{12}$ and $R_{13}$ independently represents a hydrogen atom, a methyl group, an ethyl group, or a propyl group;

$R_{14}$ represents an alicyclic group; and n represents an integer of from 0 to 5.

2. The positive resist composition according to claim 1, wherein the resin (C) comprises at least one repeating unit selected from repeating units having a fluorine atom and being represented by following formulae (c1-1) to (c1-3):

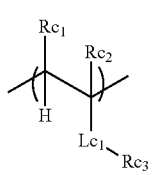

(c1-1)

-continued

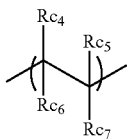

(c1-2)

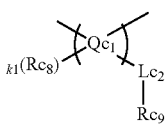

(c1-3)

wherein $Rc_1$ represents a hydrogen atom or an alkyl group;

$Rc_2$ represents a fluoroalkyl group;

$Rc_3$ represents a hydrogen atom or a monovalent organic group;

each of $Rc_4$, $Rc_5$, $Rc_6$ and $Rc_7$ represents a hydrogen atom, a fluorine atom, an alkyl group, a fluoroalkyl group, an alkoxyl group, or a fluoroalkoxy group, provided that at least one of $Rc_4$ to $Rc_7$ represents a fluorine atom, and $Rc_4$ and $Rc_5$ or $Rc_6$ and $Rc_7$ may be bonded to each other to form a ring;

$Rc_8$ represents a hydrogen atom, a fluorine atom, or a monovalent organic group;

$Rc_9$ represents a fluorine atom or a monovalent organic group comprising a fluorine atom;

each of $Lc_1$ and $Lc_2$ independently represents a single bond or a divalent linking group;

$Qc_1$ represents an alicyclic structure; and $k_1$ represents an integer of from 0 to 3.

3. The positive resist composition according to claim 2, wherein the repeating unit in the resin (C) is represented by formula (c1-2) or (c1-3).

4. The positive resist composition according to claim 1, wherein the resin (C) comprises at least one repeating unit selected from repeating units having a silicon atom and being represented by following formulae (c2-1) and (c2-2):

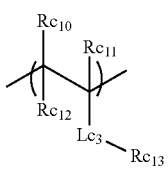

(c2-1)

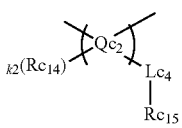

(c2-2)

wherein each of $Rc_{10}$, $Rc_{11}$ and $Rc_{12}$ independently represents a hydrogen atom, a halogen atom, an alkyl group, a cycloalkyl group, an alkoxyl group, or an alkoxycarbonyl group;

each of $Rc_{13}$ and $Rc_{15}$ independently represents a monovalent organic group comprising at least one silicon atom;

$Rc_{14}$ represents a hydrogen atom, a halogen atom, a cyano group, or a monovalent organic group;

each of $Lc_3$ and $Lc_4$ independently represents a single bond or a divalent linking group;
$Qc_2$ represents an alicyclic structure; and
$k_2$ represents an integer of from 0 to 3.

5. The positive resist composition according to claim 4, wherein
the repeating unit represented by the formula (c2-1) is a repeating unit represented by a formula (cIII):

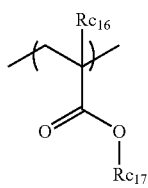

(cIII)

wherein
$Rc_{16}$ represents a hydrogen atom, a halogen atom, an alkyl group, a cycloalkyl group, an alkoxyl group, or an alkoxycarbonyl group; and
$Rc_{17}$ represents a monovalent organic group comprising at least one silicon atom.

6. The positive resist composition according to claim 4, wherein
the repeating unit represented by the formula (c2-1) is a repeating unit represented by a formula (IV):

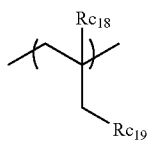

(IV)

wherein
$Rc_{18}$ represents a hydrogen atom, a halogen atom, an alkyl group, a cycloalkyl group, an alkoxyl group, or an alkoxycarbonyl group; and
$Rc_{19}$ represents a monovalent organic group comprising at least one silicon atom.

7. The positive resist composition according to claim 4, wherein
the repeating unit represented by the formula (c2-1) is a repeating unit represented by a formula (V):

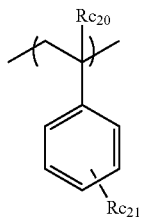

(V)

wherein
$Rc_{20}$ represents a hydrogen atom, a halogen atom, an alkyl group, a cycloalkyl group, an alkoxyl group, or an alkoxycarbonyl group; and
$Rc_{21}$ represents a monovalent organic group comprising at least one silicon atom.

8. The positive resist composition according to claim 4, wherein
at least one of the monovalent organic groups comprising at least one silicon atom represented by $Rc_{13}$ and $R_{15}$ comprises a cyclic siloxane structure.

9. The positive resist composition according to claim 4, wherein
at least one of the monovalent organic groups comprising at least one silicon atom represented by $Rc_{13}$ and $Rc_{15}$ is a group represented by a following formula (VI):

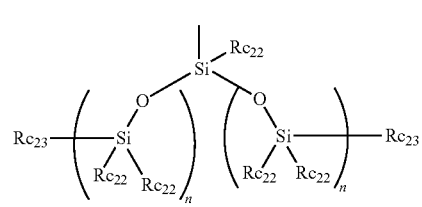

(VI)

wherein
each of $Rc_{22}$'s independently represents a hydrogen atom, an alkyl group, or an alkoxyl group;
each of $Rc_{23}$'s represents a hydrogen atom, an alkyl group, or an alkoxyl group, rovided that the two $Rc_{23}$'s may be linked to each other to form a cyclic structure; and
each of n's independently represents an integer of from 0 to 5.

10. The positive resist composition according to claim 4, wherein
at least one of the monovalent organic groups comprising at least one silicon atom represented by $Rc_{13}$ and $Rc_{15}$ comprises from one to three silicon atoms.

11. The positive resist composition according to claim 4, wherein
at least one of the monovalent organic groups comprising at least one silicon atom represented by $Rc_{13}$ and $Rc_{15}$ is a group represented by a following formula (S1):

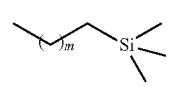

(S1)

wherein m represents an integer of from 0 to 20.

12. The positive resist composition according to claim 1, wherein
the resin (C) is at least either
(CA) a resin that comprises:
at least either a fluorine atom or a silicon atom; and
an alicyclic structure, or
(CB) a resin that comprises:
a repeating unit comprising at least either a fluorine atom or a silicon atom on a side chain thereof; and
a repeating unit comprising an unsubstituted alkyl group on a side chain thereof.

13. The positive resist composition according to claim 1, wherein
the resin (C) is a solid at 25° C.

14. The positive resist composition according to claim 1, wherein the resin (C) has a glass transition temperature of from 50 to 200° C.

15. The positive resist composition according to claim 1, wherein the resin (C) has a weight average molecular weight of from 1,000 to 50,000.

16. The positive resist composition according to claim 1, wherein
the resin (C) is contained in a proportion of from 0.1 to 5 mass % based on all solids content in the positive resist composition.

17. A pattern-forming method comprising:
forming a resist film with the resist composition according to claim 1; exposing the formed resist film; and
developing the exposed resist film.

18. The positive resist composition according to claim 1, wherein the resin (A) further comprises
(a4) a repeating unit selected from repeating units represented by formulae (a4-1) to (a4-3):

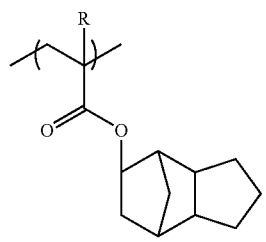
(a4-1)

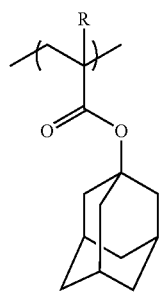
(a4-2)

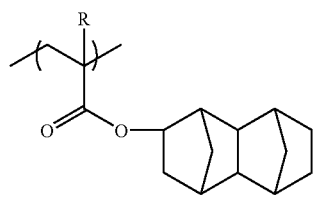
(a4-3)

wherein R represents a hydrogen atom, a fluorine atom, or an alkyl group.

19. A positive resist composition comprising:
(A) a resin capable of increasing the solubility in an alkali developing solution by the action of an acid, comprising:
(a1) a repeating unit selected from repeating units represented by following formulae (a1-1) to (a1-3);
(a2) a repeating unit represented by a following formula (a2); and
(a3) a repeating unit selected from repeating units represented by following formulae (a3-3) to (a3-4);
(B) a compound capable of generating an acid upon irradiation with actinic ray or radiation;
(C) a resin having at least one of a fluorine atom and a silicon atom, said resin being stable to an acid, not containing a group increasing in solubility in an alkali developing solution, and being insoluble in an alkali developing solution; and
(D) a solvent:

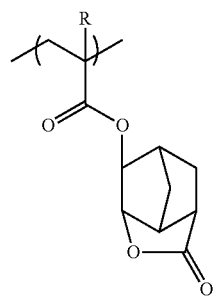
(a1-1)

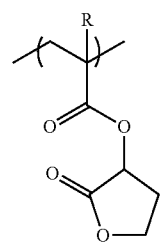
(a1-2)

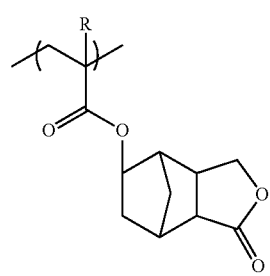
(a1-3)

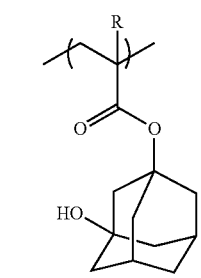
(a2)

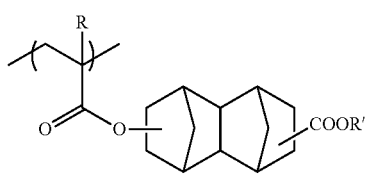
(a3-3)

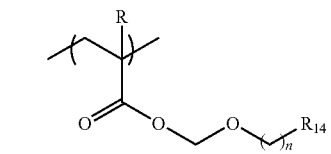
(a3-4)

wherein
R represents a hydrogen atom, a halogen atom, or an alkyl group;
R' represents a group capable of leaving by the action of an acid;

$R_{14}$ represents an alicyclic group; and n represents an integer of from 0 to 5.

20. The positive resist composition according to claim 19 wherein the resin (C) comprises at least one repeating unit selected from repeating units having a fluorine atom and being represented by following formulae (c1-1) to (c1-3):

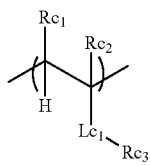
(c1-1)

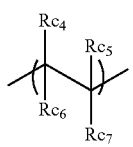
(c1-2)

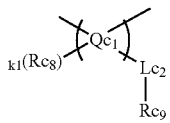
(c1-3)

wherein $Rc_1$ represents a hydrogen atom or an alkyl group;

$Rc_2$ represents a fluoroalkyl group;

$Rc_3$ represents a hydrogen atom or a monovalent organic group;

each of $Rc_4$, $Rc_5$, $Rc_6$ and $Rc_7$ represents a hydrogen atom, a fluorine atom, an alkyl group, a fluoroalkyl group, an alkoxyl group, or a fluoroalkoxy group, provided that at least one of $Rc_4$ to $Rc_7$ represents a fluorine atom, and $Rc_4$ and $Rc_5$ or $Rc_6$ and $Rc_7$ may be bonded to each other to form a ring;

$Rc_8$ represents a hydrogen atom, a fluorine atom, or a monovalent organic group;

$Rc_9$ represents a fluorine atom or a monovalent organic group comprising a fluorine atom;

each of $Lc_1$ and $Lc_2$ independently represents a single bond or a divalent linking group;

$Qc_1$ represents an alicyclic structure; and $k_1$ represents an integer of from 0 to 3.

21. The positive resist composition according to claim 19, wherein the resin (C) comprises at least one repeating unit selected from repeating units having a silicon atom and being represented by following formulae (c2-1) and (c2-2):

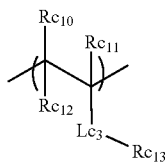
(c2-1)

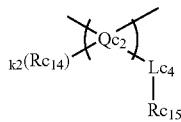
(c2-2)

wherein each of $Rc_{10}$, $Rc_{11}$ and $Rc_{12}$ independently represents a hydrogen atom, a halogen atom, an alkyl group, a cycloalkyl group, an alkoxyl group, or an alkoxycarbonyl group;

each of $Rc_{13}$ and $Rc_{15}$ independently represents a monovalent organic group comprising at least one silicon atom;

$Rc_{14}$ represents a hydrogen atom, a halogen atom, a cyano group, or a monovalent organic group;

each of $Lc_3$ and $Lc_4$ independently represents a single bond or a divalent linking group;

$Qc_2$ represents an alicyclic structure; and $k_2$ represents an integer of from 0 to 3.

22. The positive resist composition according to claim 21, wherein the repeating unit represented by the formula (c2-1) is a repeating unit represented by a formula (cIII):

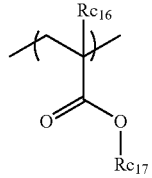
(cIII)

wherein $Rc_{16}$ represents a hydrogen atom, a halogen atom, an alkyl group, a cycloalkyl group, an alkoxyl group, or an alkoxycarbonyl group; and $Rc_{17}$ represents a monovalent organic group comprising at least one silicon atom.

23. The positive resist composition according to claim 21, wherein the repeating unit represented by the formula (c2-1) is a repeating unit represented by a formula (IV):

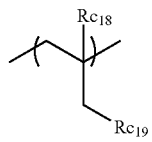
(IV)

wherein $Rc_{18}$ represents a hydrogen atom, a halogen atom, an alkyl group, a cycloalkyl group, an alkoxyl group, or an alkoxycarbonyl group; and $Rc_{19}$ represents a monovalent organic group comprising at least one silicon atom.

24. The positive resist composition according to claim 21, wherein the repeating unit represented by the formula (c2-1) is a repeating unit represented by a formula (V):

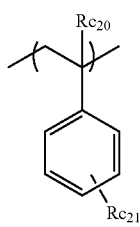

(V)

wherein

Rc$_{20}$ represents a hydrogen atom, a halogen atom, an alkyl group, a cycloalkyl group, an alkoxyl group, or an alkoxycarbonyl group; and Rc$_{21}$ represents a monovalent organic group comprising at least one silicon atom.

25. The positive resist composition according to claim 21, wherein at least one of the monovalent organic groups comprising at least one silicon atom represented by Rc$_{13}$ and Rc$_{15}$ comprises from one to three silicon atoms.

26. The positive resist composition according to claim 21, wherein at least one of the monovalent organic groups comprising at least one silicon atom represented by Rc$_{13}$ and Rc$_{15}$ is a group represented by a following formula (S1):

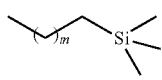

(S1)

wherein m represents an integer of from 0 to 20.

27. The positive resist composition according to claim 19, wherein the resin (C) is at least either (CA) a resin that comprises:
at least either a fluorine atom or a silicon atom; and
an alicyclic structure, or (CB) a resin that comprises:
a repeating unit comprising at least either a fluorine atom or a silicon atom on a side chain thereof; and
a repeating unit comprising an unsubstituted alkyl group on a side chain thereof.

28. A positive resist composition comprising:

(A) a resin capable of increasing the solubility in an alkali developing solution by the action of an acid, comprising:
(a1) a repeating unit selected from repeating units represented by following formulae (a1-1) to (a1-3);
(a2) a repeating unit represented by a following formula (a2);
(a3) a repeating unit selected from repeating units represented by following formulae (a3-1) to (a3-4); and
(a4) a repeating unit selected from repeating units represented by formulae (a4-2) to (a4-3);

(B) a compound capable of generating an acid upon irradiation with actinic ray or radiation;

(C) a resin having at least one of a fluorine atom and a silicon atom, said resin being stable to an acid, not containing a group increasing in solubility in an alkali developing solution, and being insoluble in an alkali developing solution; and (D) a solvent:

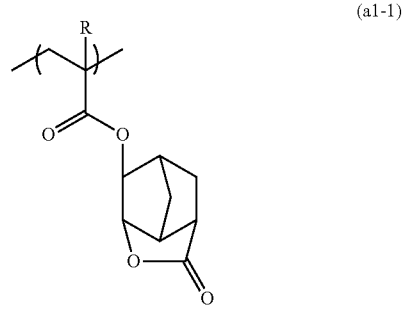

(a1-1)

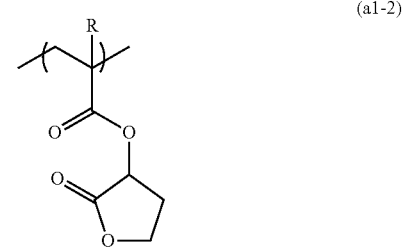

(a1-2)

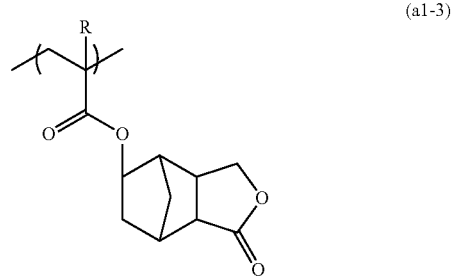

(a1-3)

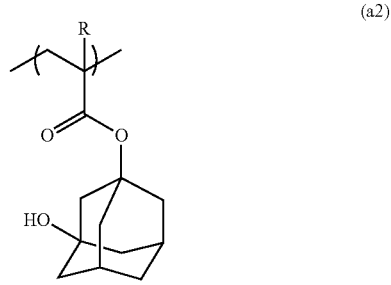

(a2)

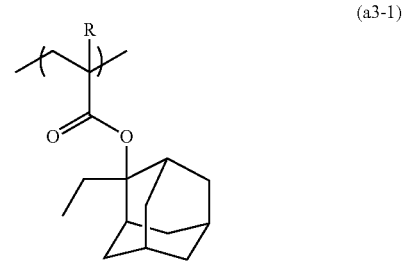

(a3-1)

-continued

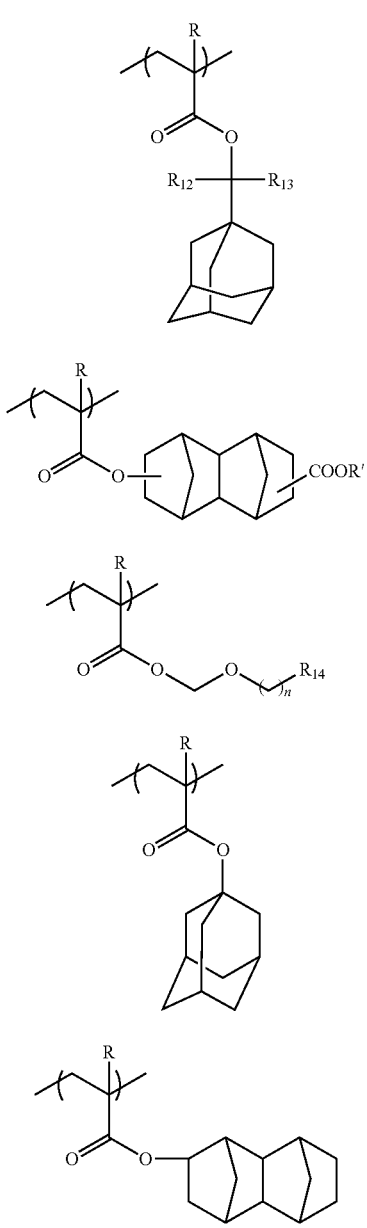

(a3-2)

(a3-3)

(a3-4)

(a4-2)

(a4-3)

wherein

R represents a hydrogen atom, a halogen atom, or an alkyl group, provided that R in formulae (a4-2) and (a4-3) is a fluorine atom;

R' represents a group capable of leaving by the action of an acid;

each of $R_{12}$ and $R_{13}$ independently represents a hydrogen atom, a methyl group, an ethyl group, or a propyl group;

$R_{14}$ represents an alicyclic group; and n represents an integer of from 0 to 5.

29. The positive resist composition according to claim 28, wherein the resin (C) comprises at least one repeating unit selected from repeating units having a fluorine atom and being represented by following formulae (c1-1) to (c1-3):

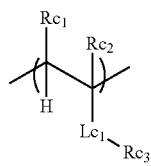

(c1-1)

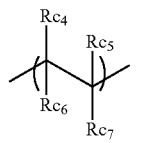

(c1-2)

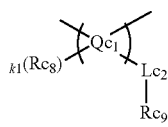

(c1-3)

wherein $Rc_1$ represents a hydrogen atom or an alkyl group;

$Rc_2$ represents a fluoroalkyl group;

$Rc_3$ represents a hydrogen atom or a monovalent organic group;

each of $Rc_4$, $Rc_5$, $Rc_6$ and $Rc_7$ represents a hydrogen atom, a fluorine atom, an alkyl group, a fluoroalkyl group, an alkoxyl group, or a fluoroalkoxy group, provided that at least one of $Rc_4$ to $Rc_7$ represents a fluorine atom, and $Rc_4$ and $Rc_5$ or $Rc_6$ and $Rc_7$ may be bonded to each other to form a ring;

$Rc_8$ represents a hydrogen atom, a fluorine atom, or a monovalent organic group;

$Rc_9$ represents a fluorine atom or a monovalent organic group comprising a fluorine atom;

each of $Lc_1$ and $Lc_2$ independently represents a single bond or a divalent linking group;

$Qc_1$ represents an alicyclic structure; and $k_1$ represents an integer of from 0 to 3.

30. The positive resist composition according to claim 28, wherein the resin (C) comprises at least one repeating unit selected from repeating units having a silicon atom and being represented by following formulae (c2-1) and (c2-2):

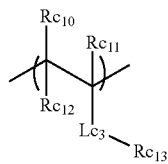

(c2-1)

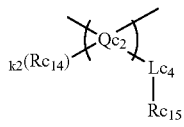

(c2-2)

wherein each of $Rc_{10}$, $Rc_{11}$ and $Rc_{12}$ independently represents a hydrogen atom, a halogen atom, an alkyl group, a cycloalkyl group, an alkoxyl group, or an alkoxycarbonyl group;

each of $Rc_{13}$ and $Rc_{15}$ independently represents a monovalent organic group comprising at least one silicon atom;

$Rc_{14}$ represents a hydrogen atom, a halogen atom, a cyano group, or a monovalent organic group;

each of $Lc_3$ and $Lc_4$ independently represents a single bond or a divalent linking group;

$Qc_3$ represents an alicyclic structure; and $k_2$ represents an integer of from 0 to 3.

31. The positive resist composition according to claim 30, wherein the repeating unit represented by the formula (c2-1) is a repeating unit represented by a formula (cIII):

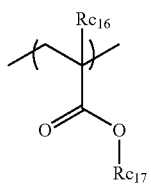

(cIII)

wherein $Rc_{16}$ represents a hydrogen atom, a halogen atom, an alkyl group, a cycloalkyl group, an alkoxyl group, or an alkoxycarbonyl group; and $Rc_{17}$ represents a monovalent organic group comprising at least one silicon atom.

32. The positive resist composition according to claim 30, wherein the repeating unit represented by the formula (c2-1) is a repeating unit represented by a formula (IV):

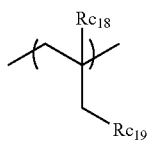

(IV)

wherein $Rc_{18}$ represents a hydrogen atom, a halogen atom, an alkyl group, a cycloalkyl group, an alkoxyl group, or an alkoxycarbonyl group; and $Rc_{19}$ represents a monovalent organic group comprising at least one silicon atom.

33. The positive resist composition according to claim 30, wherein the repeating unit represented by the formula (c2-1) is a repeating unit represented by a formula (V):

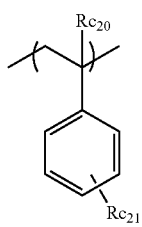

(V)

wherein $Rc_{20}$ represents a hydrogen atom, a halogen atom, an alkyl group, a cycloalkyl group, an alkoxyl group, or an alkoxycarbonyl group; and $Rc_{21}$ represents a monovalent organic group comprising at least one silicon atom.

34. The positive resist composition according to claim 30, wherein at least one of the monovalent organic groups comprising at least one silicon atom represented by $Rc_{13}$ and $Rc_{15}$ comprises from one to three silicon atoms.

35. The positive resist composition according to claim 30, wherein at least one of the monovalent organic groups comprising at least one silicon atom represented by $Rc_{13}$ and $Rc_{15}$ is a group represented by a following formula (S1):

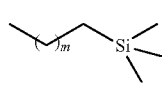

(S1)

wherein m represents an integer of from 0 to 20.

36. The positive resist composition according to claim 28, wherein the resin (C) is at least either (CA) a resin that comprises:

at least either a fluorine atom or a silicon atom; and an alicyclic structure, or (CB) a resin that comprises:

a repeating unit comprising at least either a fluorine atom or a silicon atom on a side chain thereof; and a repeating unit comprising an unsubstituted alkyl group on a side chain thereof.

37. A positive resist composition comprising:

(A) a resin capable of increasing the solubility in an alkali developing solution by the action of an acid, comprising:

(a1) a repeating unit selected from repeating units represented by following formulae (a1-1) and (a1-3);

(a2) a repeating unit represented by a following formula (a2); and (a3) a repeating unit selected from repeating units represented by following formulae (a3-1) to (a3-4);

(B) a compound capable of generating an acid upon irradiation with actinic ray or radiation;

(C) a resin having at least one of a fluorine atom and a silicon atom, and being insoluble in an alkali developing solution; and (D) a solvent:

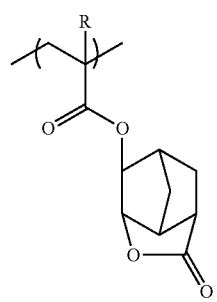

(a1-1)

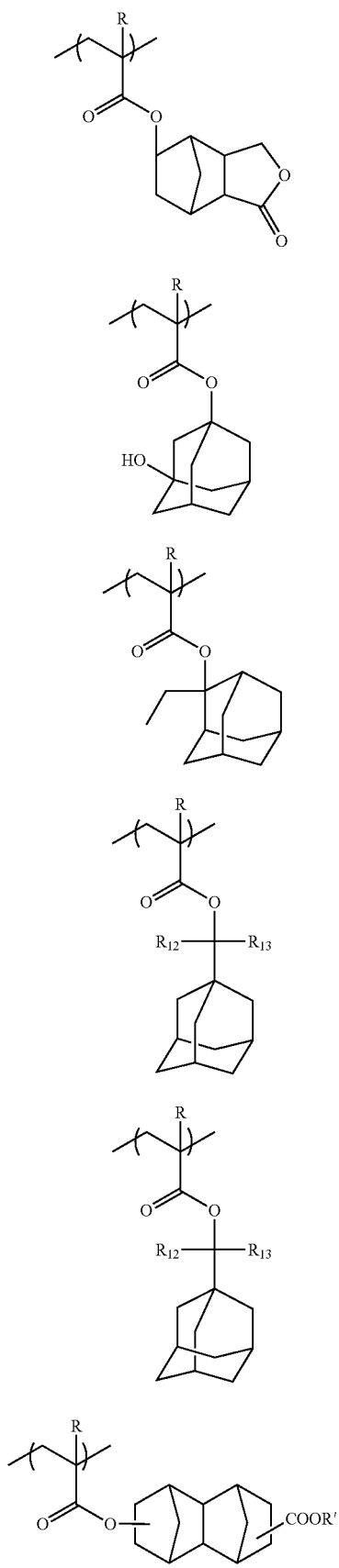

(a1-3)
(a2)
(a3-1)
(a3-2)
(a3-2)
(a3-3)

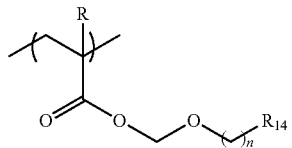

(a3-4)

wherein

R represents a hydrogen atom, a halogen atom, or an alkyl group;

R' represents a group capable of leaving by the action of an acid;

each of $R_{12}$ and $R_{13}$ independently represents a hydrogen atom, a methyl group, an ethyl group, or a propyl group;

$R_{14}$ represents an alicyclic group; and n represents an integer of from 0 to 5; and further wherein the resin (C) comprises at least one repeating unit selected from repeating units having a fluorine atom and being represented by the following formulae (c1-3), and is stable to an acid and insoluble in an alkali developing solution:

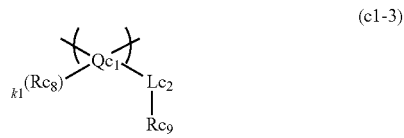

(c1-3)

wherein $Rc_8$ represents a hydrogen atom, a fluorine atom, or a monovalent organic group;

$Rc_9$ represents a fluorine atom or a monovalent organic group comprising a fluorine atom;

$Lc_2$ represents a single bond or a divalent linking group;

$Qc_1$ represents an alicyclic structure; and $k_1$ represents an integer of from 0 to 3.

38. The positive resist composition according to claim 37, wherein the resin (A) further comprises (a4) a repeating unit selected from repeating units represented by formulae (a4-1) to (a4-3):

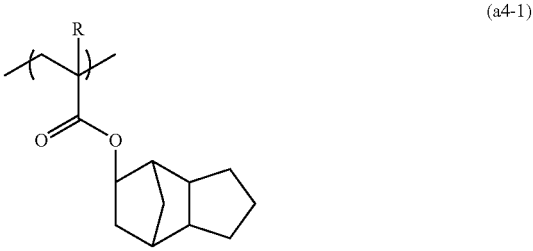

(a4-1)

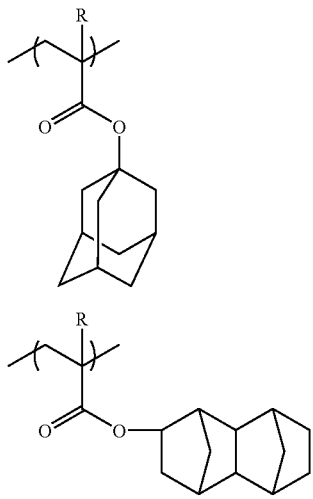

wherein R represents a hydrogen atom, a fluorine atom, or an alkyl group.

39. A positive resist composition comprising:

(A) a resin capable of increasing the solubility in an alkali developing solution by the action of an acid, comprising:
 (a1) a repeating unit selected from repeating units represented by following formulae (a1-1) to (a1-3);
 (a2) a repeating unit represented by a following formula (a2); and
 (a3) a repeating unit selected from repeating units represented by following formulae (a3-1) to (a3-4);

(B) a compound capable of generating an acid upon irradiation with actinic ray or radiation;

(C) a resin having at least one of a fluorine atom and a silicon atom, said resin not containing a group increasing in solubility in an alkali developing solution, and being insoluble in an alkali developing solution; and (D) a solvent:

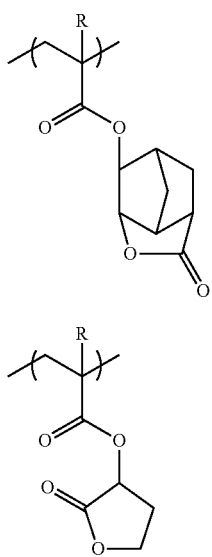

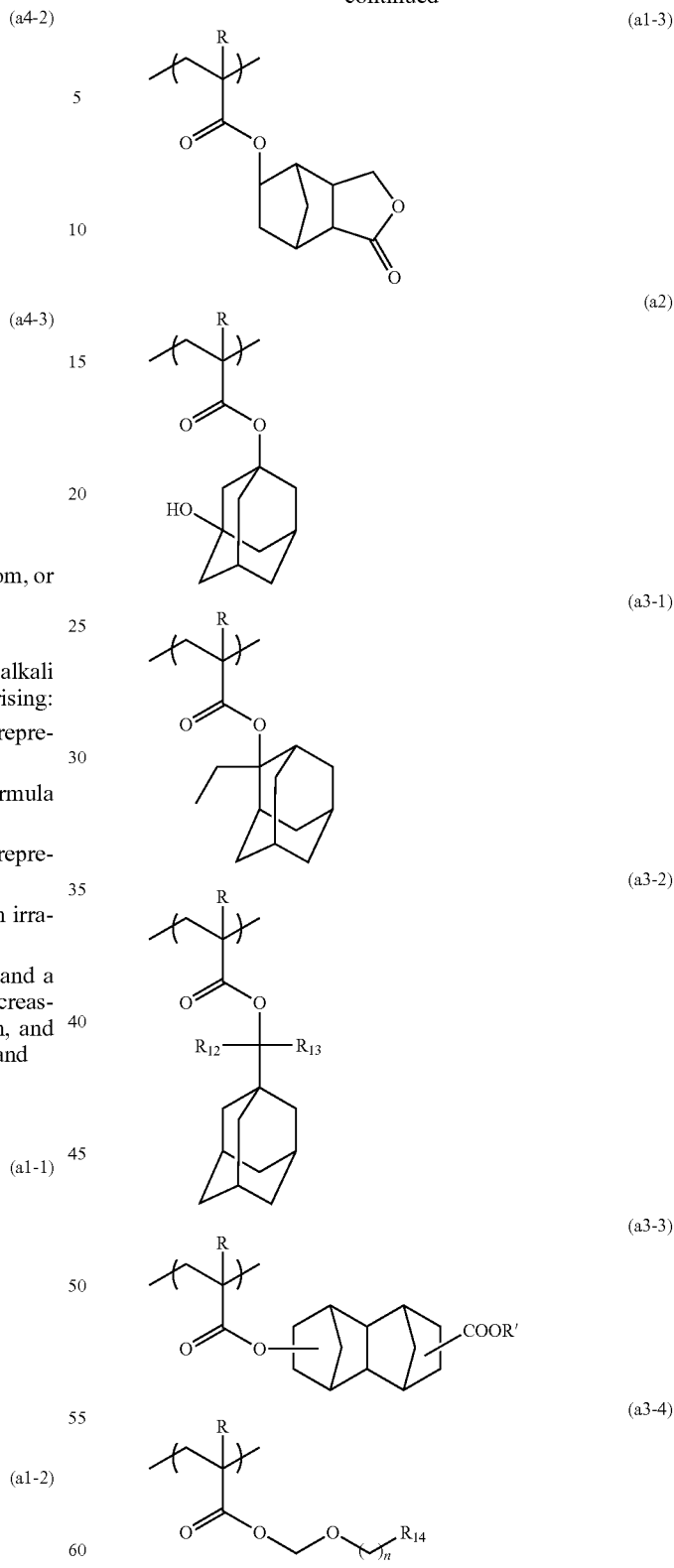

wherein
R represents a hydrogen atom, a halogen atom, or an alkyl group;
R' represents a group capable of leaving by the action of an acid;

each of $R_{12}$ and $R_{13}$ independently represents a hydrogen atom, a methyl group, an ethyl group, or a propyl group;

$R_{14}$ represents an alicyclic group; and n represents an integer of from 0 to 5; and further wherein the resin (C) comprises at least one repeating unit selected from repeating units having a silicon atom and being represented by the following formulae (c2-2), and is stable to an acid:

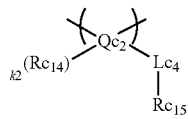

(c2-2)

wherein $Rc_{15}$ represents a monovalent organic group comprising at least one silicon atom;

$Rc_{14}$ represents a hydrogen atom, a halogen atom, a cyano group, or a monovalent organic group;

$Lc_4$ represents a single bond or a divalent linking group;

$Qc_2$ represents an alicyclic structure; and $k_2$ represents an integer of from 0 to 3.

40. The positive resist composition according to claim 39, wherein the resin (C) further comprises a silicon atom-containing repeating unit represented by the following formula (cIII):

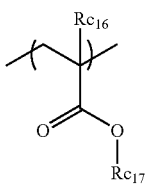

(cIII)

wherein $Rc_{16}$ represents a hydrogen atom, a halogen atom, an alkyl group, a cycloalkyl group, an alkoxyl group, or an alkoxycarbonyl group; and $Rc_{17}$ represents a monovalent organic group comprising at least one silicon atom.

41. The positive resist composition according to claim 39, wherein the resin (C) further comprises a silicon-atom containing repeating unit represented by the following formula (IV):

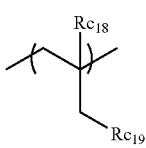

(IV)

wherein $Rc_{18}$ represents a hydrogen atom, a halogen atom, an alkyl group, a cycloalkyl group, an alkoxyl group, or an alkoxycarbonyl group; and $Rc_{19}$ represents a monovalent organic group comprising at least one silicon atom.

42. The positive resist composition according to claim 39, wherein the resin (C) further comprises a silicon atom-containing repeating unit represented by the following formula (V):

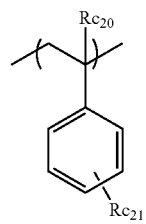

(V)

wherein $Rc_{20}$ represents a hydrogen atom, a halogen atom, an alkyl group, a cycloalkyl group, an alkoxyl group, or an alkoxycarbonyl group; and $Rc_{21}$ represents a monovalent organic group comprising at least one silicon atom.

43. The positive resist composition according to claim 39, wherein the monovalent organic group comprising at least one silicon atom represented by $Rc_{15}$ comprises a cyclic siloxane structure.

44. The positive resist composition according to claim 39, wherein the monovalent organic group comprising at least one silicon atom represented by $Rc_{15}$ is a group represented by the following formula (VI):

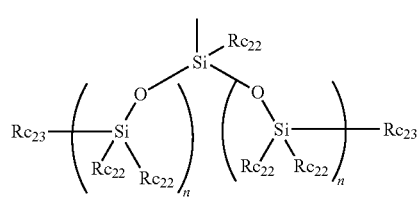

(VI)

wherein each of $Rc_{22}$'s independently represents a hydrogen atom, an alkyl group, or an alkoxyl group;

each of $Rc_{23}$'s represents a hydrogen atom, an alkyl group, or an alkoxyl group, provided that the two $Rc_{23}$'s may be linked to each other to form a cyclic structure; and each of n's independently represents an integer of from 0 to 5.

45. The positive resist composition according to claim 39, wherein the monovalent organic group comprising at least one silicon atom represented by $Rc_{15}$ comprises from one to three silicon atoms.

46. The positive resist composition according to claim 39, wherein the monovalent organic group comprising at least one silicon atom represented by $Rc_{15}$ is a group represented by the following formula (S1):

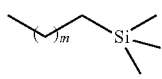
(S1)

wherein m represents an integer of from 0 to 20.

47. The positive resist composition according to claim 39, wherein
the resin (C) is a solid at 25° C.

48. A positive resist composition comprising:
(A) a resin capable of increasing the solubility in an alkali developing solution by the action of an acid, comprising:
(a1) a repeating unit represented by the following formula (a1-1);
(a2) a repeating unit represented by the following formula (a2); and
(a3) a repeating unit represented by the following formula (a3-1);
(B) a compound capable of generating an acid upon irradiation with actinic ray or radiation;
(C) a resin having a fluorine atom, said resin being stable to an acid, not containing a group increasing in solubility in an alkali developing solution, and being insoluble in an alkali developing solution; and
(D) a solvent:

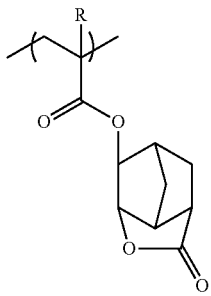
(a1-1)

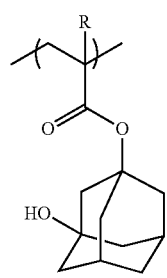
(a2)

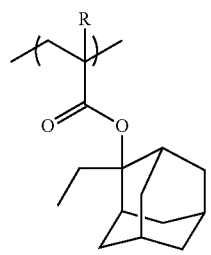
(a3-1)

wherein
R represents a hydrogen atom, a halogen atom, or an alkyl group, and further wherein the resin (C) comprises at least one repeating unit selected from repeating units having a fluorine atom and being represented by following formulae (c1-1) to (c1-3):

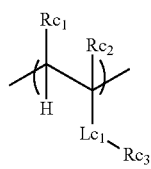
(c1-1)

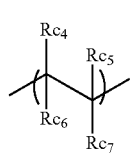
(c1-2)

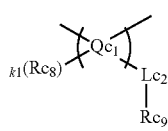
(c1-3)

wherein
$Rc_1$ represents a hydrogen atom or an alkyl group;
$Rc_2$ represents a fluoroalkyl group;
$Rc_3$ represents a hydrogen atom or a monovalent organic group;
each of $Rc_4$, $Rc_5$, $Rc_6$ and $Rc_7$ represents a hydrogen atom, a fluorine atom, an alkyl group, a fluoroalkyl group, an alkoxyl group, or a fluoroalkoxy group, provided that at least one of $Rc_4$ to $Rc_7$ represents a fluorine atom, and $Rc_4$ and $Rc_5$ or $Rc_6$ and $Rc_7$ may be bonded to each other to form a ring;
$Rc_8$ represents a hydrogen atom, a fluorine atom, or a monovalent organic group;
$Rc_9$ represents a fluorine atom or a monovalent organic group comprising a fluorine atom;
each of $Lc_1$ and $Lc_2$ independently represents a single bond or a divalent linking group;
$Qc_1$ represents an alicyclic structure; and
$k_1$ represents an integer of from 0 to 3.

49. The positive resist composition according to claim 48, wherein the resin (A) further comprises
(a4) a repeating unit selected from repeating units represented by formulae (a4-1) to (a4-3):

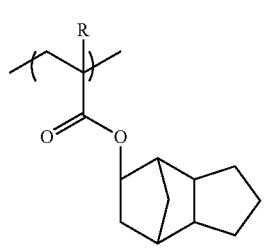
(a4-1)

-continued
(a4-2)
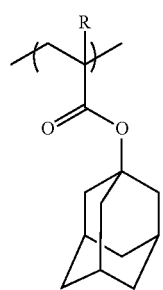
(a4-3)
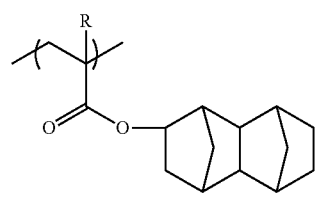
wherein R represents a hydrogen atom, a fluorine atom, or an alkyl group.
* * * * *